(12) United States Patent
Todorokihara

(10) Patent No.: US 10,355,708 B2
(45) Date of Patent: Jul. 16, 2019

(54) IDLE TONE DISPERSION DEVICE AND FREQUENCY RATIO MEASURING DEVICE

(71) Applicant: Seiko Epson Corporation, Tokyo (JP)

(72) Inventor: Masayoshi Todorokihara, Suwa (JP)

(73) Assignee: Seiko Epson Corporation (JP)

(*) Notice: Subject to any disclaimer, the term of this patent is extended or adjusted under 35 U.S.C. 154(b) by 0 days.

(21) Appl. No.: 15/987,099

(22) Filed: May 23, 2018

(65) Prior Publication Data
US 2018/0343014 A1 Nov. 29, 2018

(30) Foreign Application Priority Data

May 29, 2017 (JP) .................................. 2017-105463

(51) Int. Cl.
*H03M 3/00* (2006.01)
*G01R 23/00* (2006.01)

(52) U.S. Cl.
CPC .......... *H03M 3/372* (2013.01); *G01R 23/005* (2013.01); *H03M 3/30* (2013.01); *H03M 3/346* (2013.01); *H03M 3/472* (2013.01)

(58) Field of Classification Search
CPC ...... H03M 3/372; H03M 3/346; H03M 3/472; H03M 3/30; H03M 3/396; H03M 3/50; H03M 7/3004; H03M 1/12; G01R 23/005
USPC ................................................. 341/143, 155
See application file for complete search history.

(56) References Cited

U.S. PATENT DOCUMENTS

| 4,458,165 A | 7/1984 | Jackson | |
| 6,111,532 A * | 8/2000 | Hirano | H03M 3/372 341/143 |
| 6,499,334 B1 | 12/2002 | Kobayashi | |
| 7,262,723 B2 * | 8/2007 | Straussnig | H03M 1/0836 341/120 |
| 7,295,642 B2 * | 11/2007 | Xu | H04L 43/50 375/226 |
| 7,792,232 B2 * | 9/2010 | Song | H04L 7/0025 375/355 |

(Continued)

FOREIGN PATENT DOCUMENTS

| JP | 59-181819 A | 10/1984 |
| JP | 2001-091587 A | 4/2001 |

(Continued)

*Primary Examiner* — Jean B Jeanglaude
(74) *Attorney, Agent, or Firm* — Harness, Dickey & Pierce, P.L.C.

(57) ABSTRACT

An idle tone dispersion device outputs a frequency delta-sigma modulation signal obtained by using either one of a reference signal and a measured signal to perform frequency delta-sigma modulation of the other and dispersing an idle tone. The idle tone dispersion device includes n (n is any natural number equal to or larger than 2) frequency delta-sigma modulation sections and an adder configured to add up output signals of the n frequency delta-sigma modulation sections and output the frequency delta-sigma modulation signal. Each of the n frequency delta-sigma modulation sections uses either one of the reference signal and the measured signal to perform the frequency delta-sigma modulation of the other. At least one of the reference signal and the measured signal includes jitter including a frequency component higher than a frequency of an idle tone of an output signal of the frequency delta-sigma modulation section.

20 Claims, 44 Drawing Sheets

(56) References Cited

U.S. PATENT DOCUMENTS

| | | | |
|---|---|---|---|
| 8,594,253 B2 * | 11/2013 | Breems | H03D 7/00 |
| | | | 375/346 |
| 2011/0148676 A1 * | 6/2011 | Waheed | G04F 10/005 |
| | | | 341/131 |
| 2015/0333765 A1 | 11/2015 | Todorokihara | |

FOREIGN PATENT DOCUMENTS

| | | |
|---|---|---|
| JP | 2009-088600 A | 4/2009 |
| JP | 2015-220552 A | 12/2015 |

* cited by examiner

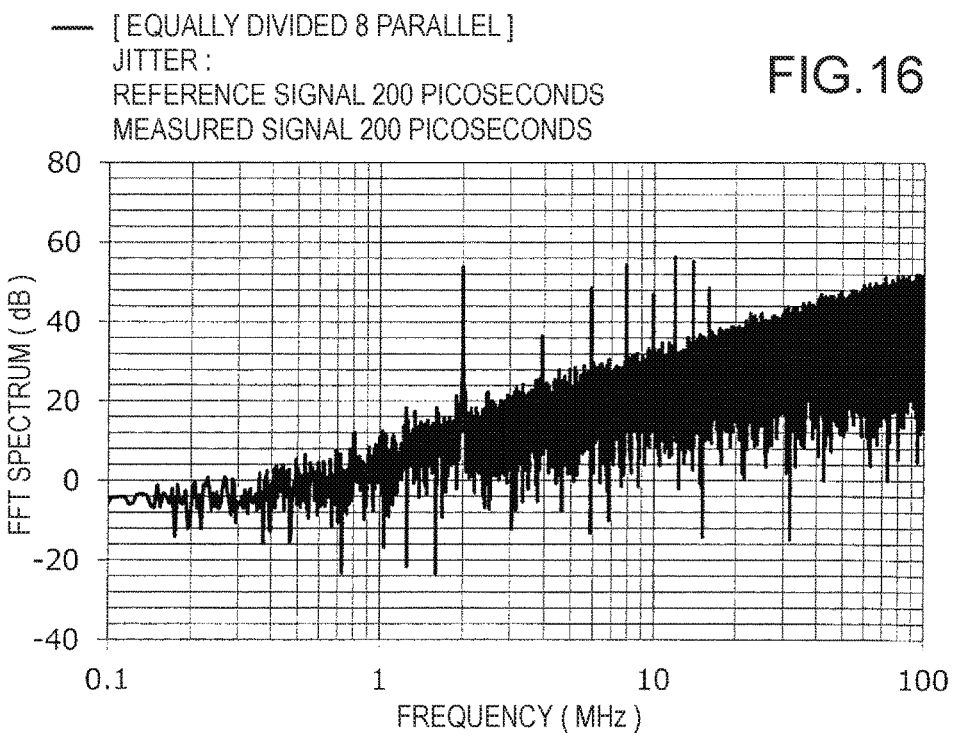
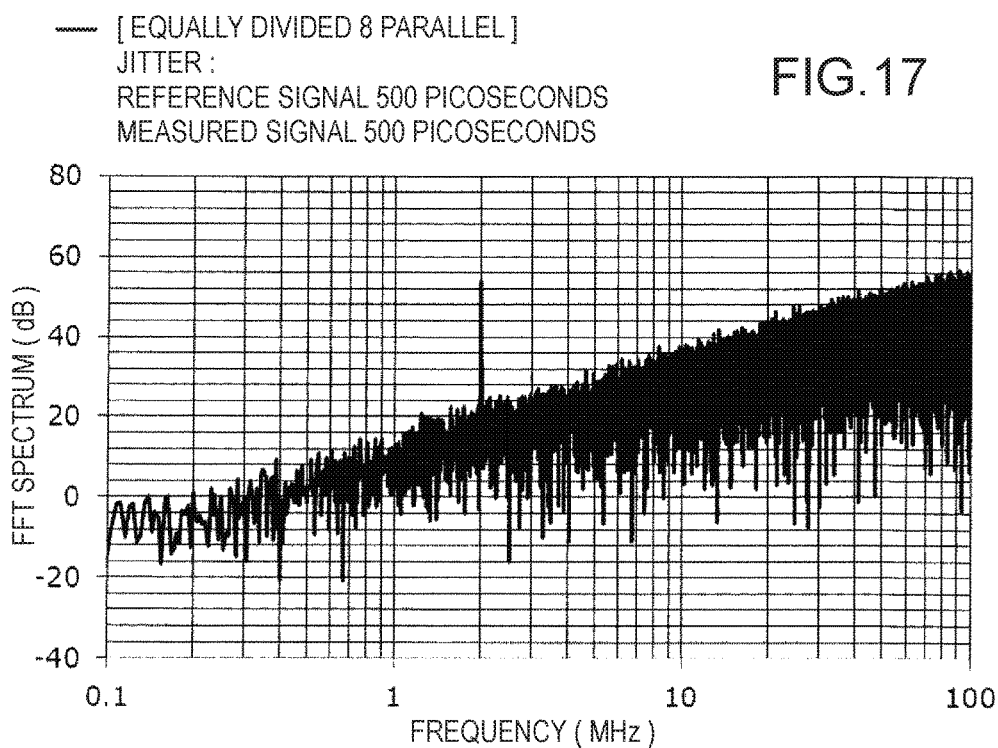

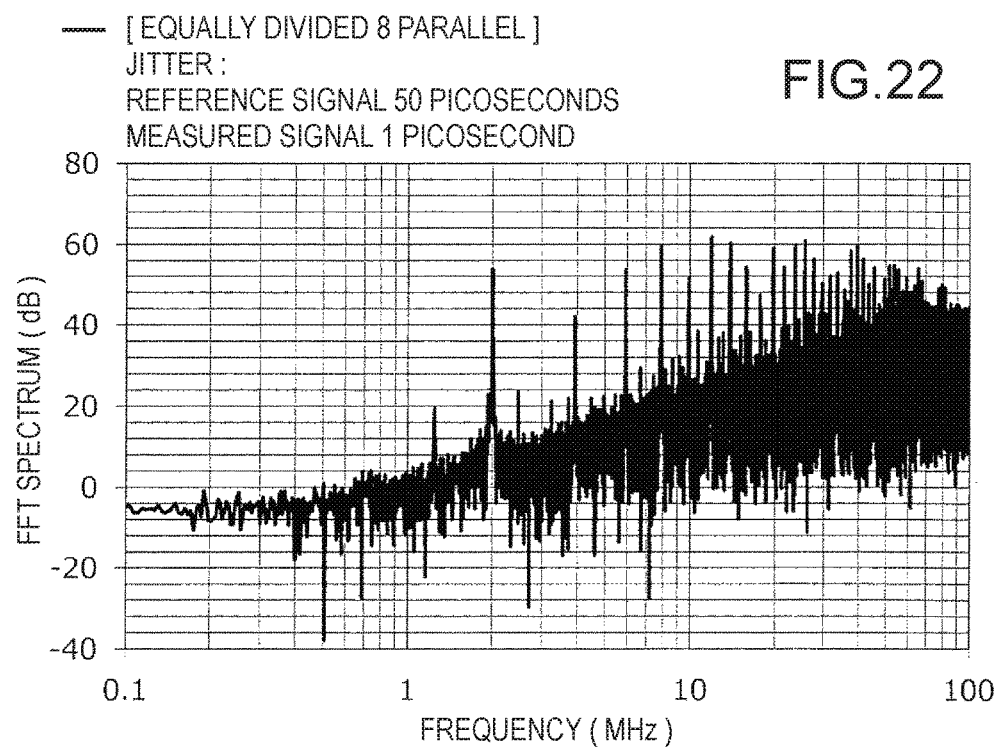
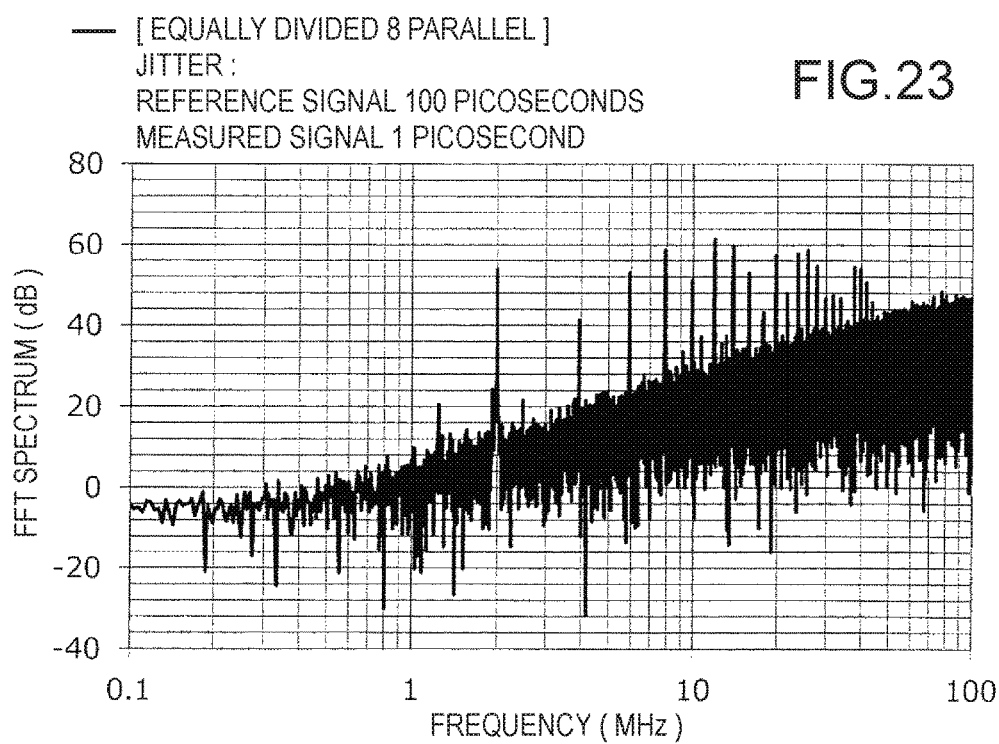

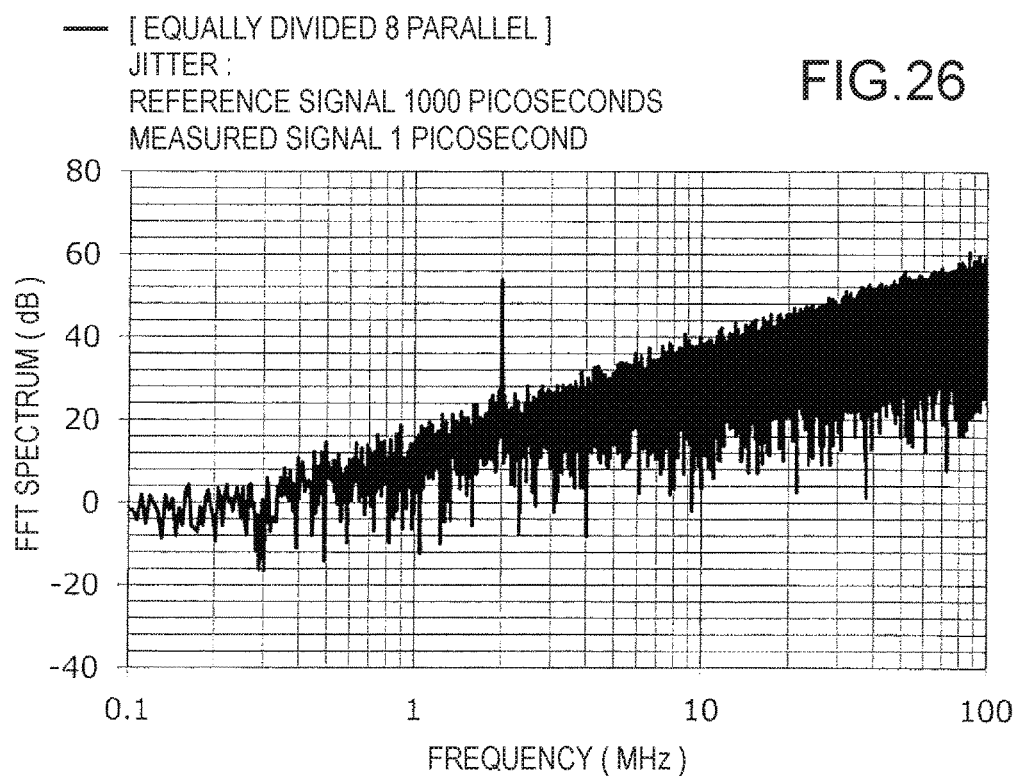
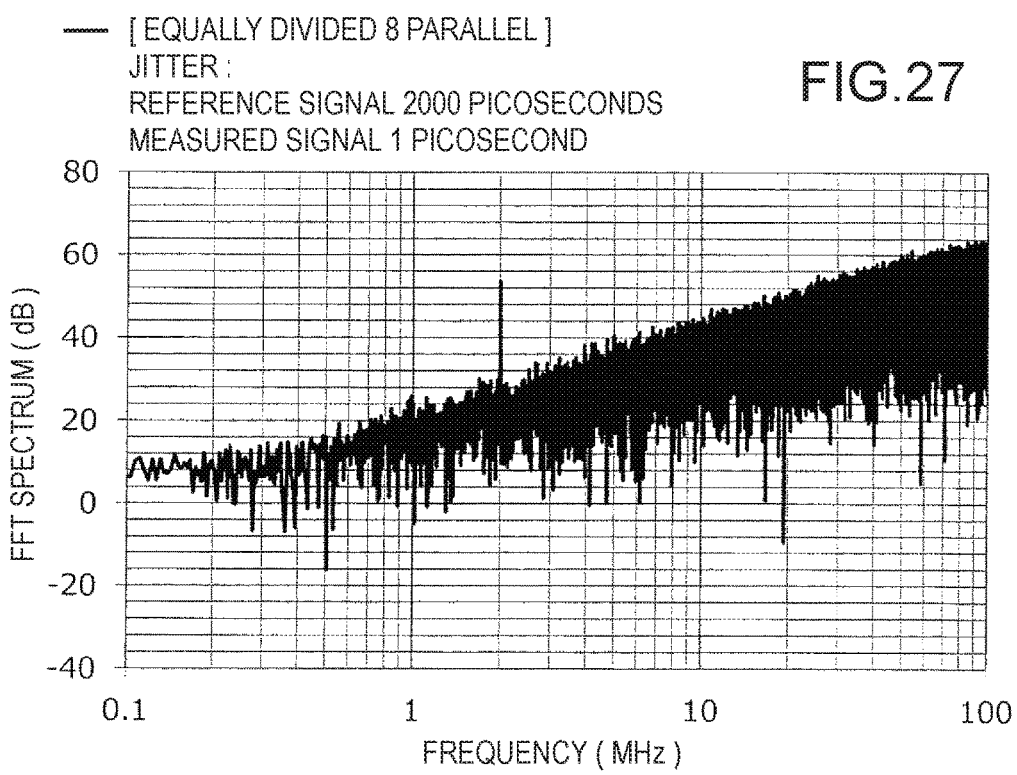

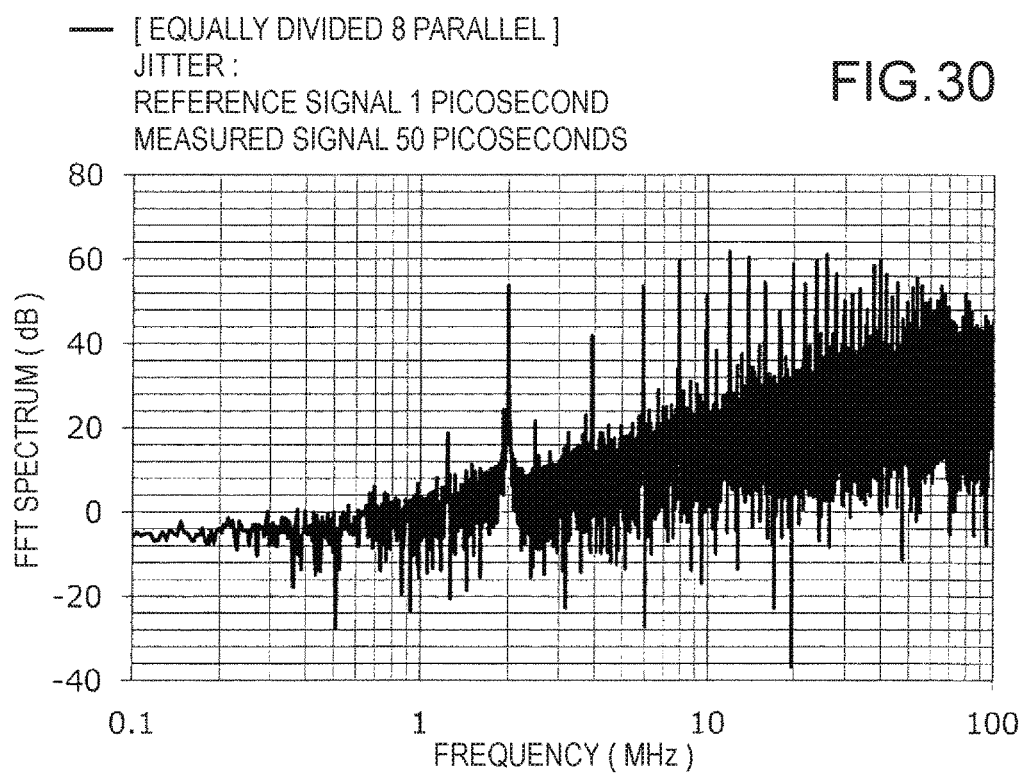
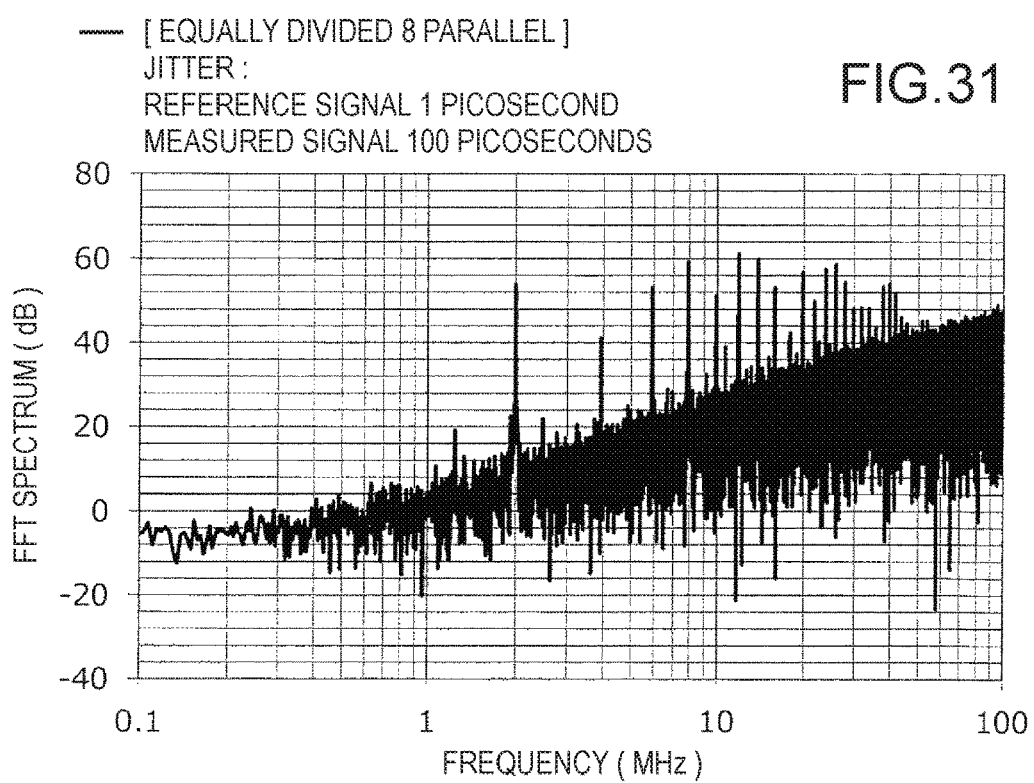

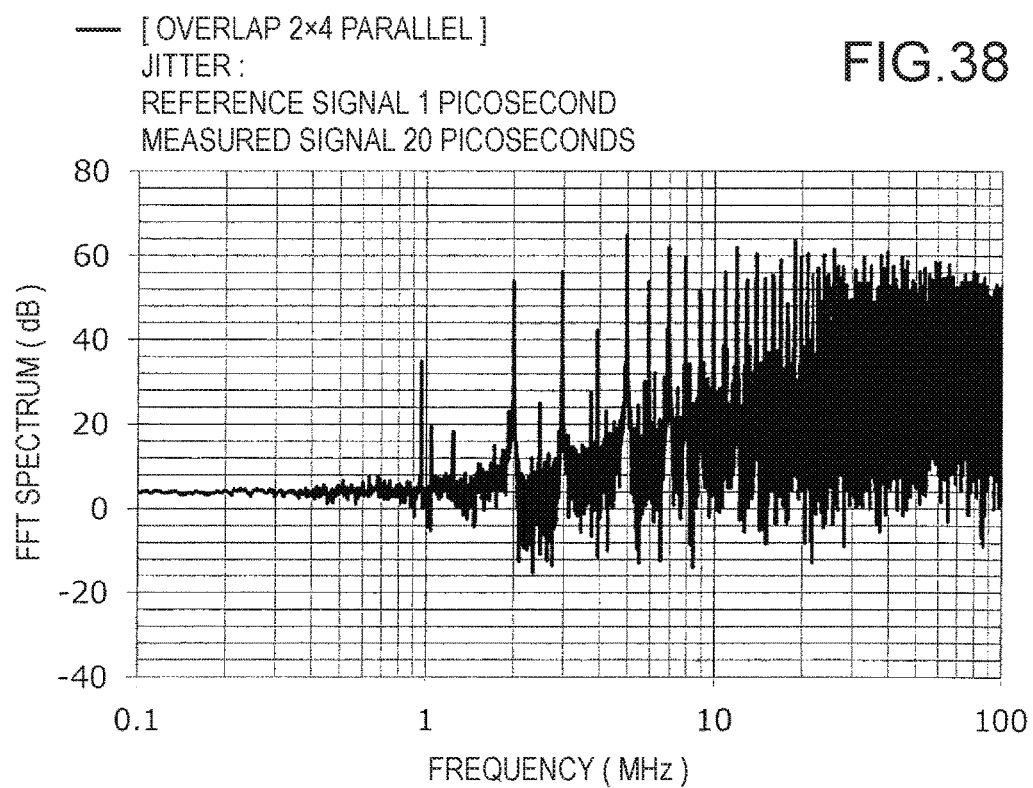
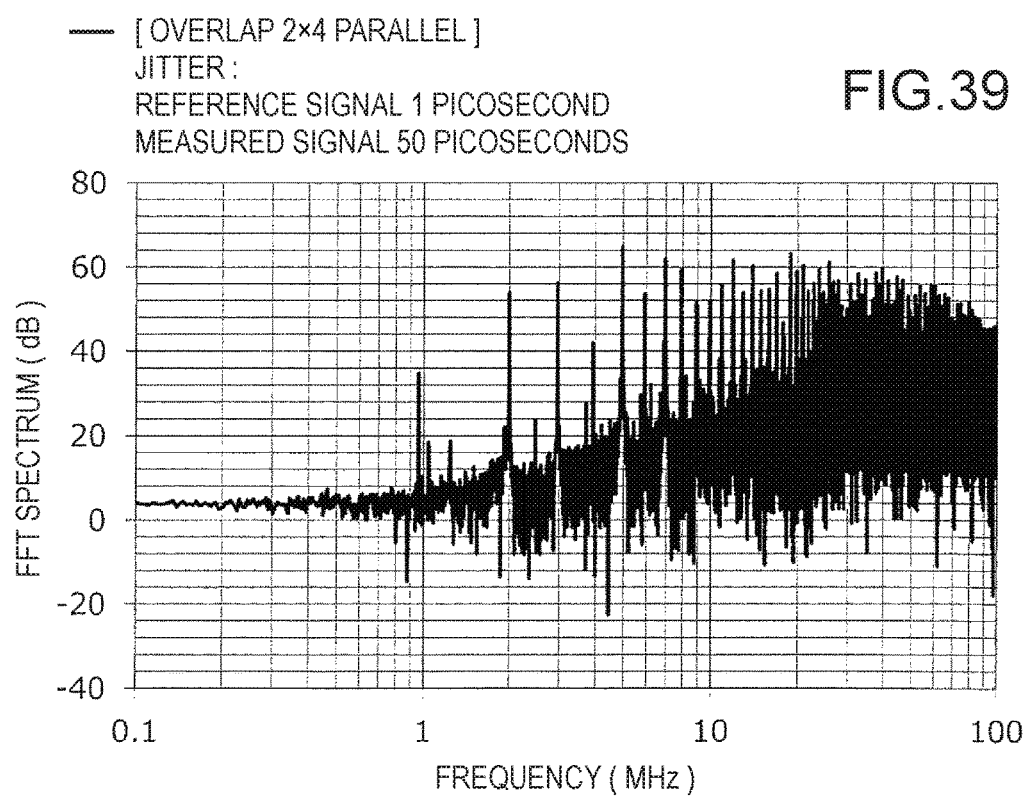

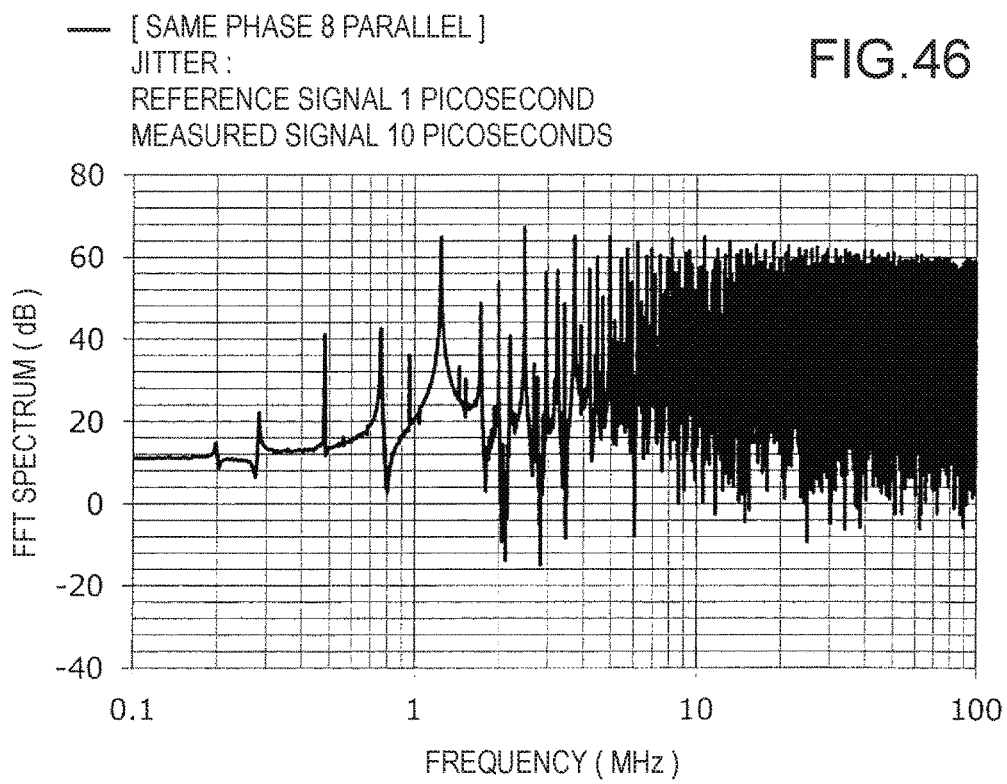
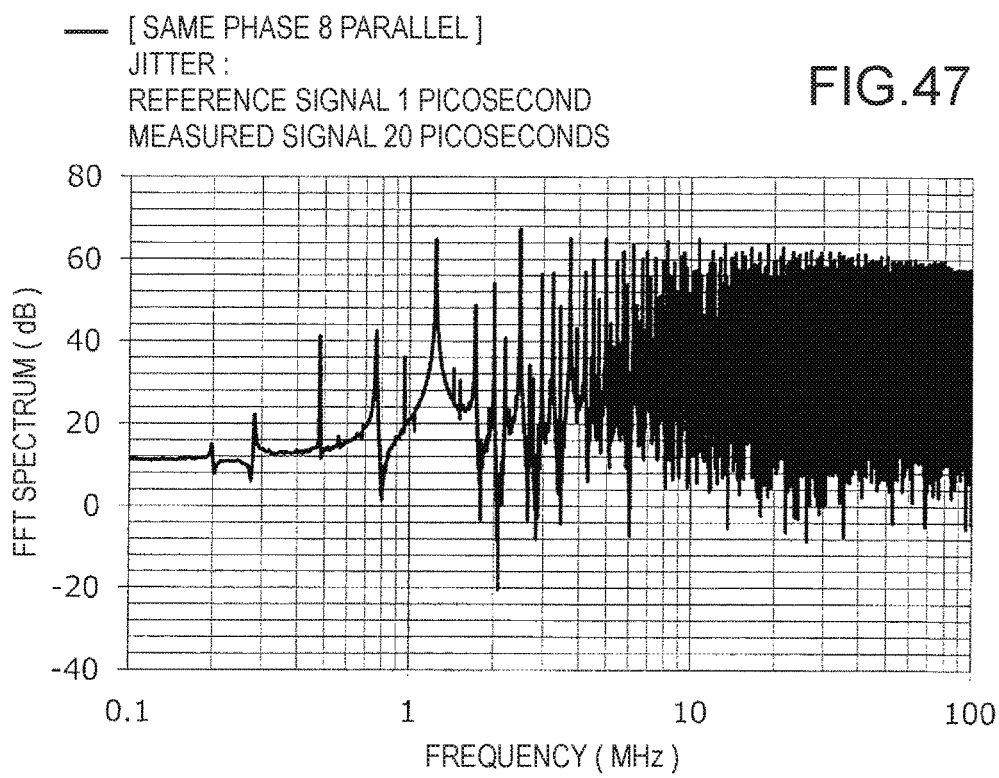

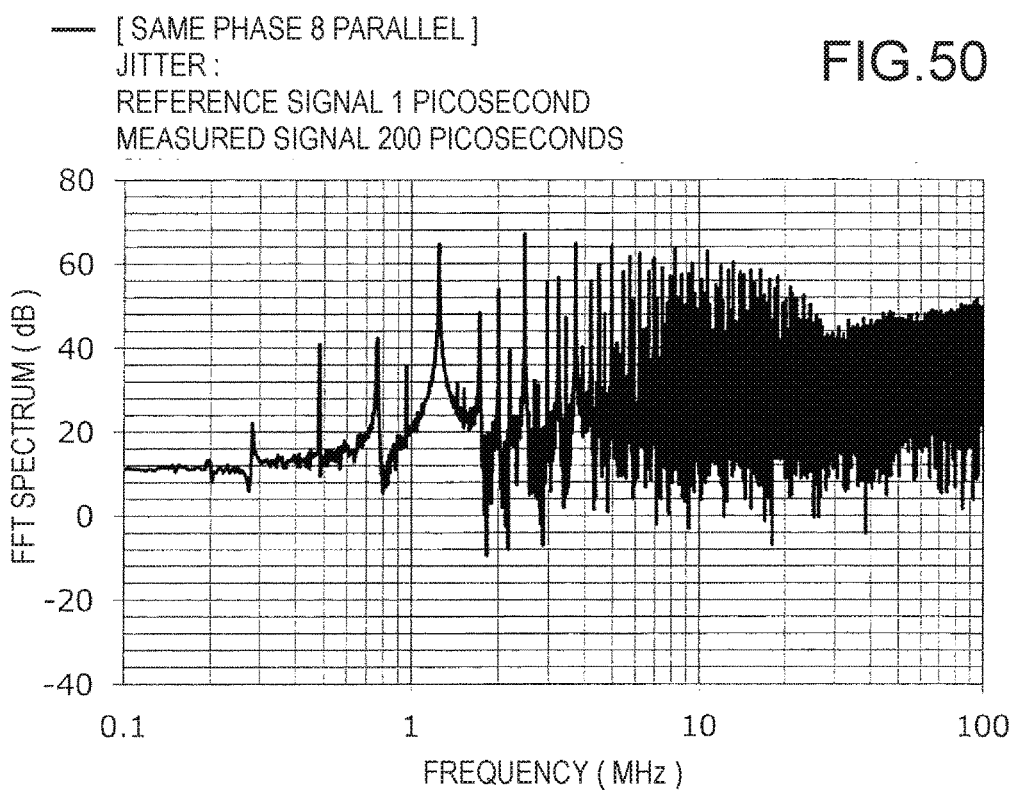
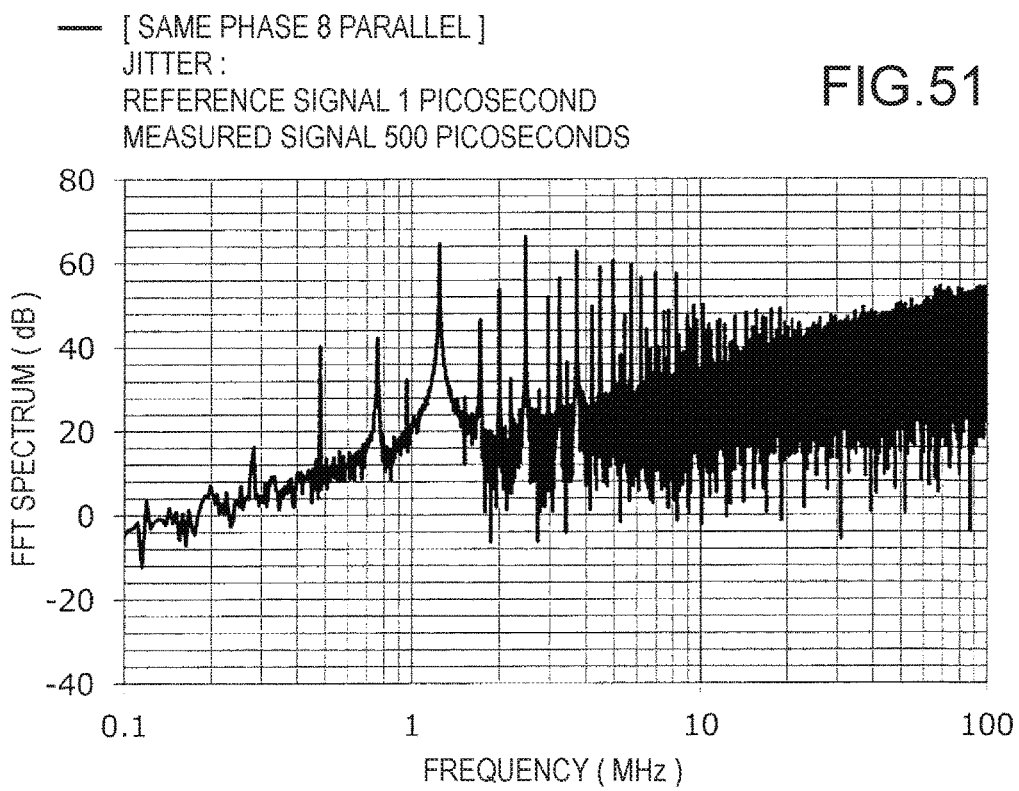

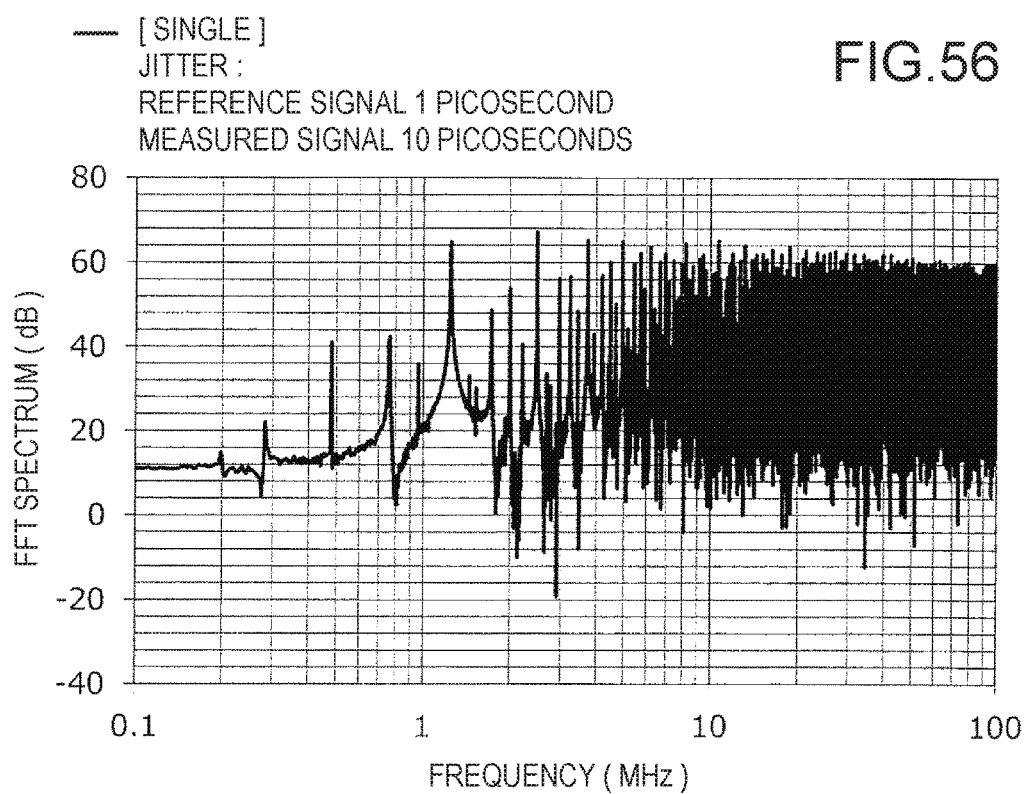
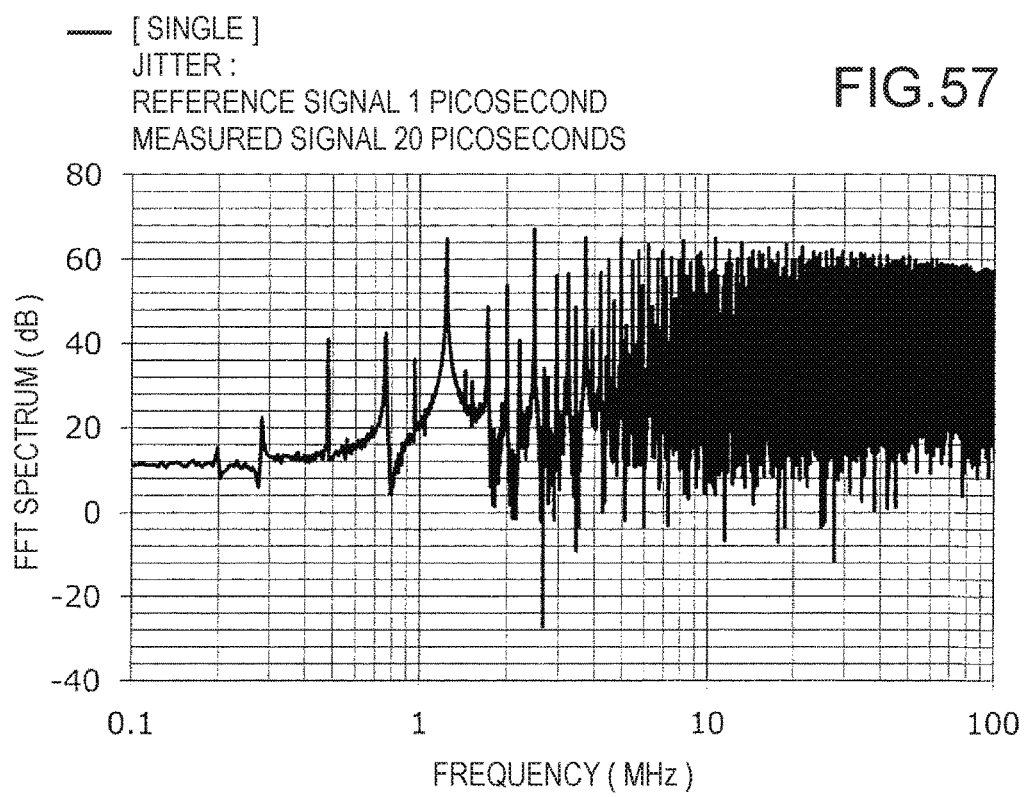

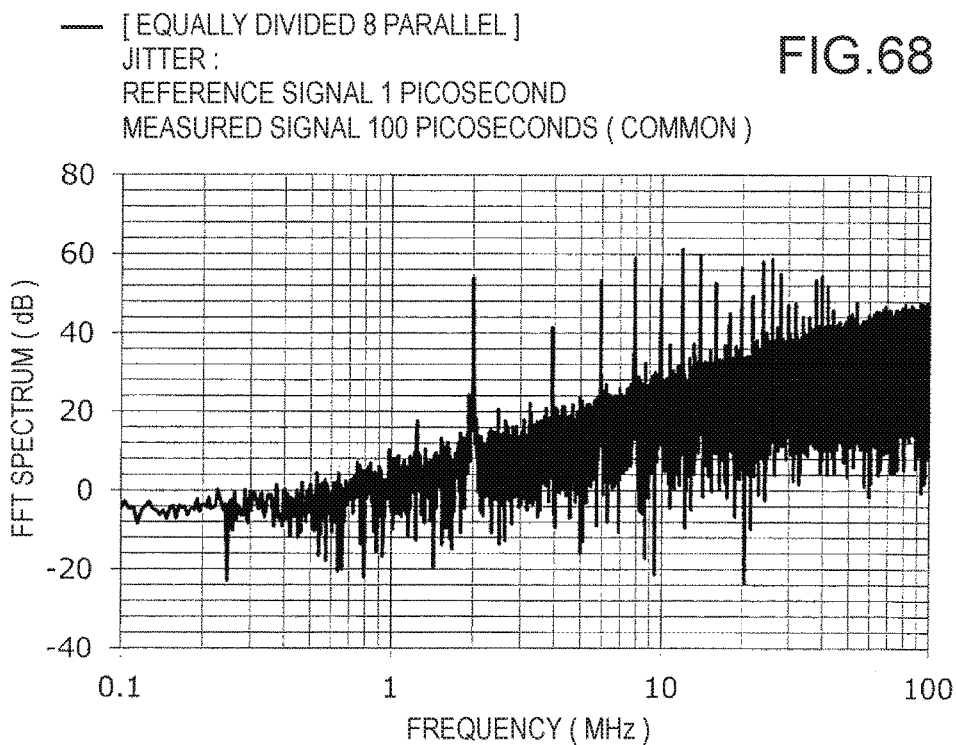
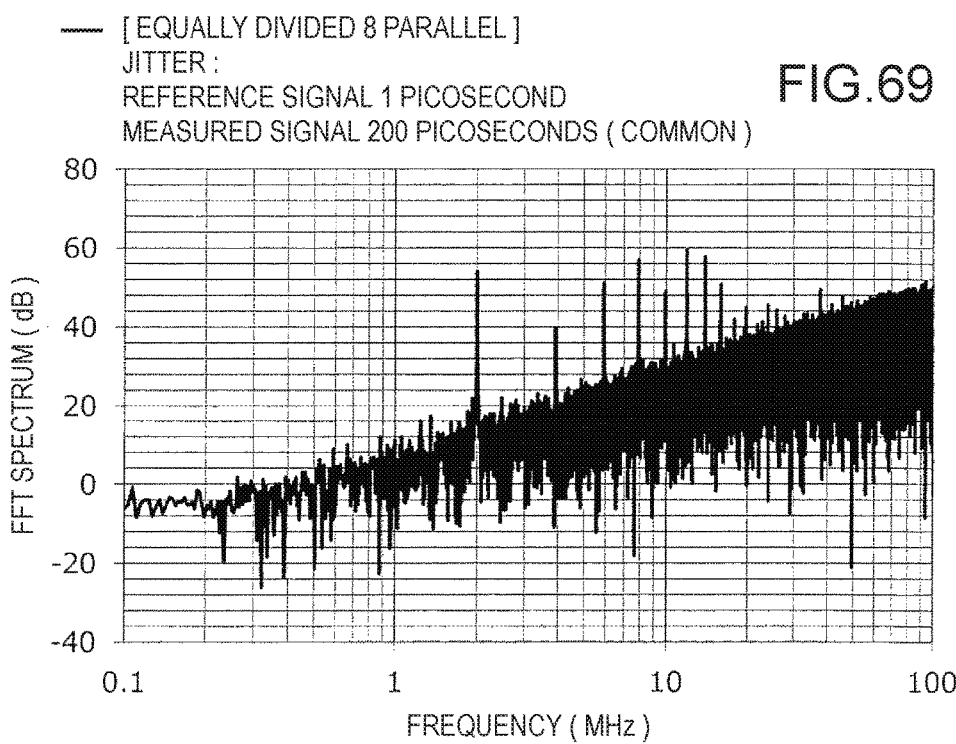

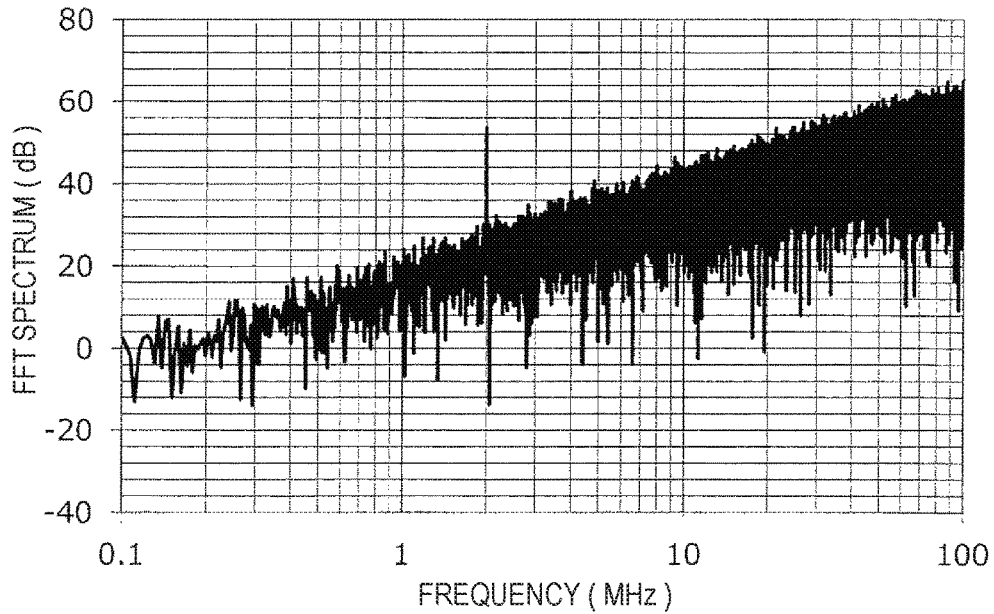
FIG.72 — [EQUALLY DIVIDED 8 PARALLEL] JITTER: REFERENCE SIGNAL 1 PICOSECOND MEASURED SIGNAL 2000 PICOSECONDS (COMMON)
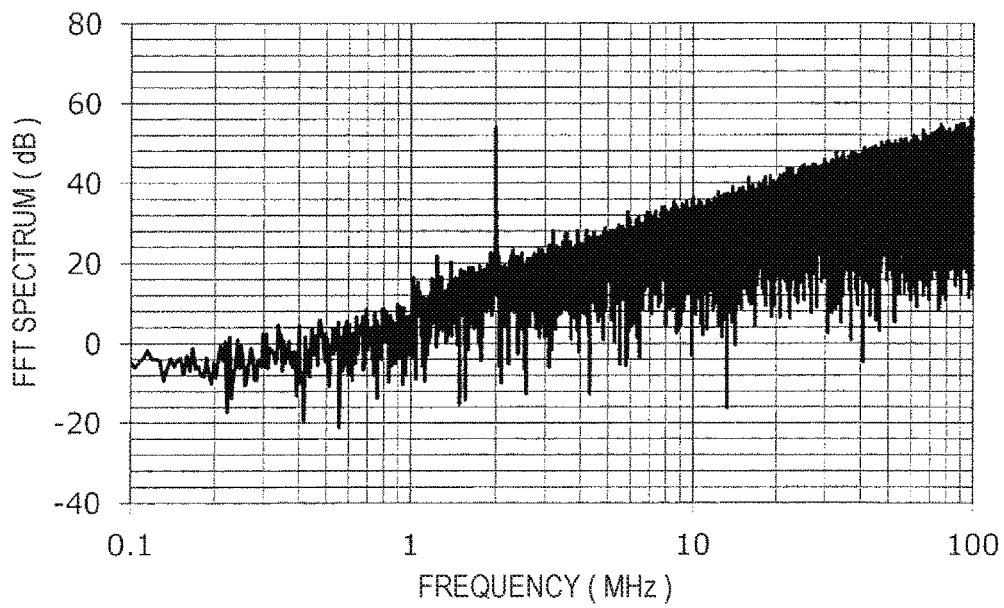
FIG.73 — [EQUALLY DIVIDED 8 PARALLEL] JITTER: REFERENCE SIGNAL 1 PICOSECOND MEASURED SIGNAL 500 PICOSECONDS (FROM 1 MHz)

— [EQUALLY DIVIDED 8 PARALLEL]
JITTER:
REFERENCE SIGNAL 1 PICOSECOND
MEASURED SIGNAL 500 PICOSECONDS (FROM 10 MHz)

— [EQUALLY DIVIDED 8 PARALLEL]
JITTER:
REFERENCE SIGNAL 1 PICOSECOND
MEASURED SIGNAL 500 PICOSECONDS (FROM 20 MHz)

IDLE TONE DISPERSION DEVICE AND FREQUENCY RATIO MEASURING DEVICE

BACKGROUND

1. Technical Field

The present invention relates to an idle tone dispersion device and a frequency ratio measuring device.

2. Related Art

There is known a frequency ratio measuring device (a frequency counter) that generates a signal corresponding to a ratio of the frequency of a reference signal (a reference clock) and the frequency of a measured signal.

For example, JP-A-2015-220552 (Patent Literature 1) discloses an idle tone dispersion device that outputs a frequency delta-sigma modulation signal obtained by using either one of a reference signal and a measured signal to perform frequency delta-sigma modulation of the other and dispersing an idle tone. The idle tone dispersion device described in Patent Literature 1 includes a plurality of frequency delta-sigma modulation sections (hereinafter referred to as "FDSMs (Frequency Delta-Sigma Modulators)" connected in parallel and an adding section that adds up output signals of the frequency delta-sigma modulation sections and outputs a frequency delta-sigma modulation signal. Measured signals having phases different from one another and reference signals having the same phase, reference signals having phases different from one another and measured signals having the same phase, or measured signals having phases different from one another and reference signals having phases different from one another are input to the FDSMs. With the idle tone dispersion device, it is possible to temporally disperse an idle tone and suppress the influence of the idle tone.

However, in the idle tone dispersion device described in Patent Literature 1, when the number of FDSMs disposed in parallel is increased, in some case, a margin of a delay amount decreases and it becomes difficult to temporally disperse an idle tone and effectively suppress the influence of the idle tone.

SUMMARY

An advantage of some aspects of the invention is to provide an idle tone dispersion device and a frequency ratio measuring device that can reduce quantization noise due to an idle tone that occurs in frequency delta-sigma modulation. The invention can be implemented as the following forms or application examples.

An idle tone dispersion device according to an aspect of the invention is an idle tone dispersion device that outputs a frequency delta-sigma modulation signal obtained by using either one of a reference signal and a measured signal to perform frequency delta-sigma modulation of the other and dispersing an idle tone. The idle tone dispersion device includes: n (n is any natural number equal to or larger than 2) frequency delta-sigma modulation sections; and an adder configured to add up output signals of the n frequency delta-sigma modulation sections and output the frequency delta-sigma modulation signal. Each of the n frequency delta-sigma modulation sections uses either one of the reference signal and the measured signal to perform the frequency delta-sigma modulation of the other. At least one of the reference signal and the measured signal includes jitter including a frequency component higher than a frequency of an idle tone of an output signal of the frequency delta-sigma modulation section.

With such an idle tone dispersion device according to the aspect of the invention, it is possible to temporally disperse an idle tone, which is periodic quantization noise that occurs in the frequency delta-sigma modulation and reduce the influence of the idle tone.

In particular, since at least one of the reference signal and the measured signal includes the jitter including the frequency component higher than the frequency of the idle tone, it is possible to greatly reduce the influence of the quantization noise due to the idle tone.

An idle tone dispersion device according to another aspect of the invention is an idle tone dispersion device that outputs a frequency delta-sigma modulation signal obtained by using either one of a reference signal and a measured signal to perform frequency delta-sigma modulation of the other and dispersing an idle tone. The idle tone dispersion device includes: n (n is any natural number equal to or larger than 2) frequency delta-sigma modulation sections; a phase adjusting section configured to adjust phases of the measured signal and the reference signal, generate n sets of output measured signals and output reference signals, and supply the output measured signal and the output reference signal of each of the sets to each of the n frequency delta-sigma modulation sections; and an adder configured to add up output signals of the n frequency delta-sigma modulation sections and output the frequency delta-sigma modulation signal. The phase adjusting section adjusts the phases of the measured signals and the reference signals to differentiate phases of idle tones of output signals of at least a part of the n frequency delta-sigma modulation sections from one another and generates the n sets of the output measured signals and the output reference signals. Each of the n frequency delta-sigma modulation sections uses either one of the output reference signal and the output measured signal supplied from the phase modulating section to perform the frequency delta-sigma modulation of the other. At least one of the output reference signal and the output measured signal includes jitter including a frequency component higher than a frequency of the idle tone.

With such an idle tone dispersion device according to the aspect of the invention, it is possible to temporally disperse an idle tone, which is periodic quantization noise that occurs in the frequency delta-sigma modulation and reduce the influence of the idle tone.

In particular, since at least one of the reference signal, the measured signal, the output reference signal, and the output measured signal includes jitter including a frequency component higher than the frequency of the idle tone, it is possible to greatly reduce the influence of quantization noise due to the idle tone.

In the idle tone dispersion device according to the aspect of the invention, it is preferable that, when a predetermined time is represented as D, one cycle of the measured signal or one cycle of the reference signal is represented as T, m is any natural number equal to or smaller than n, mD/nT is an integer, mD/nT and m are relatively prime, and a phase difference between an output measured signal and an output reference signal supplied to an i (i is any natural number equal to or smaller than n−1)-th frequency delta-sigma modulation section is represented as Pi, the phase adjusting section adjusts the phases of the measured signal and the reference signal to satisfy $D/n=P_{i+1}-P_i$ and generates the n sets of the output measured signals and the output reference signals.

With this configuration, the phases of idle tones of output signals of the n frequency delta-sigma modulation sections are different from one another. Therefore, it is possible to temporally disperse the idle tones and reduce the influence of the idle tones.

In the idle tone dispersion device according to the aspect of the invention, it is preferable that the phase adjusting section adjusts the phases of the measured signal and the reference signal to differentiate phases of idle tones of output signals of a part of the n frequency delta-sigma modulation sections from one another and generates the n sets of the output measured signals and the output reference signals.

With this configuration, it is possible to accurately temporally disperse an idle tone and reduce the influence of the idle tone.

In the idle tone dispersion device according to the aspect of the invention, it is preferable that, when a predetermined time is represented as D, one cycle of the measured signal or one cycle of the reference signal is represented as T, m is any natural number equal to or smaller than n, mD/nT is an integer, mD/nT and m are relatively prime, and a phase difference between an output measured signal and an output reference signal supplied to an i (i is any natural number equal to or smaller than n−1)-th frequency delta-sigma modulation section is represented as Pi, $D/n \neq P_{i+1} - P_i$ is satisfied.

Even if $D/n \neq P_{i+1} - P_i$, it is possible to set the phases of idle tones of output signals of the n frequency delta-sigma modulation sections to be different from one another.

With this configuration, it is possible to accurately temporally disperse the idle tones. It is possible to reduce the influence of the idle tones.

Flexibility of setting of a delay amount increases and adjustment is easily performed. Since the adjustment is easily performed, a special device is unnecessary and manufacturing cost can be reduced.

In the idle tone dispersion device according to the aspect of the invention, it is preferable that the jitter includes a frequency component higher than a frequency of a component having largest intensity among frequency components of the idle tone.

With this configuration, it is possible to greatly reduce the influence of quantization noise due to the idle tone.

In the idle tone dispersion device according to the aspect of the invention, it is preferable that the idle tone dispersion device further includes a jitter generating section configured to generate the jitter.

With this configuration, it is unnecessary to separately prepare a device that generates the jitter. It is possible to easily and accurately add the jitter to a signal to which the jitter is desired to be added.

In the idle tone dispersion device according to the aspect of the invention, it is preferable that magnitude of the jitter is determined on the basis of at least one of a frequency of the reference signal, a frequency of the measured signal, a measurement band of the measured signal, and a number of the frequency delta-sigma modulation sections.

With this configuration, it is possible to accurately set a frequency band of the jitter.

A frequency ratio measuring device according to another aspect of the invention includes the idle tone dispersion device according to the aspect of the invention. The frequency ratio measuring device measures a frequency ratio of the measured signal and the reference signal.

With such a frequency ratio measuring device according to the aspect of the invention, it is possible to reduce the influence of quantization noise due to an idle tone. Consequently, it is possible to improve measurement accuracy.

BRIEF DESCRIPTION OF THE DRAWINGS

The invention will be described with reference to the accompanying drawings, wherein like numbers reference like elements.

FIG. 16 is a graph showing an output spectrum of the idle tone dispersion device.

FIG. 17 is a graph showing an output spectrum of the idle tone dispersion device.

FIG. 22 is a graph showing an output spectrum of the idle tone dispersion device.

FIG. 23 is a graph showing an output spectrum of the idle tone dispersion device.

FIG. 26 is a graph showing an output spectrum of the idle tone dispersion device.

FIG. 27 is a graph showing an output spectrum of the idle tone dispersion device.

FIG. 30 is a graph showing an output spectrum of the idle tone dispersion device.

FIG. 31 is a graph showing an output spectrum of the idle tone dispersion device.

FIG. 38 is a graph showing an output spectrum of the idle tone dispersion device.

FIG. 39 is a graph showing an output spectrum of the idle tone dispersion device.

FIG. 46 is a graph showing an output spectrum of the idle tone dispersion device.

FIG. 47 is a graph showing an output spectrum of the idle tone dispersion device.

FIG. 50 is a graph showing an output spectrum of the idle tone dispersion device.

FIG. 51 is a graph showing an output spectrum of the idle tone dispersion device.

FIG. 56 is a graph showing an output spectrum of the idle tone dispersion device.

FIG. 57 is a graph showing an output spectrum of the idle tone dispersion device.

FIG. 68 is a graph showing an output spectrum of the idle tone dispersion device.

FIG. 69 is a graph showing an output spectrum of the idle tone dispersion device.

FIG. 72 is a graph showing an output spectrum of the idle tone dispersion device.

FIG. 73 is a graph showing an output spectrum of the idle tone dispersion device.

DESCRIPTION OF EXEMPLARY EMBODIMENTS

An idle tone dispersion device and a frequency ratio measuring device according to embodiments of the invention are explained in detail below with reference to the accompanying drawings.

First Embodiment

Figure 1:
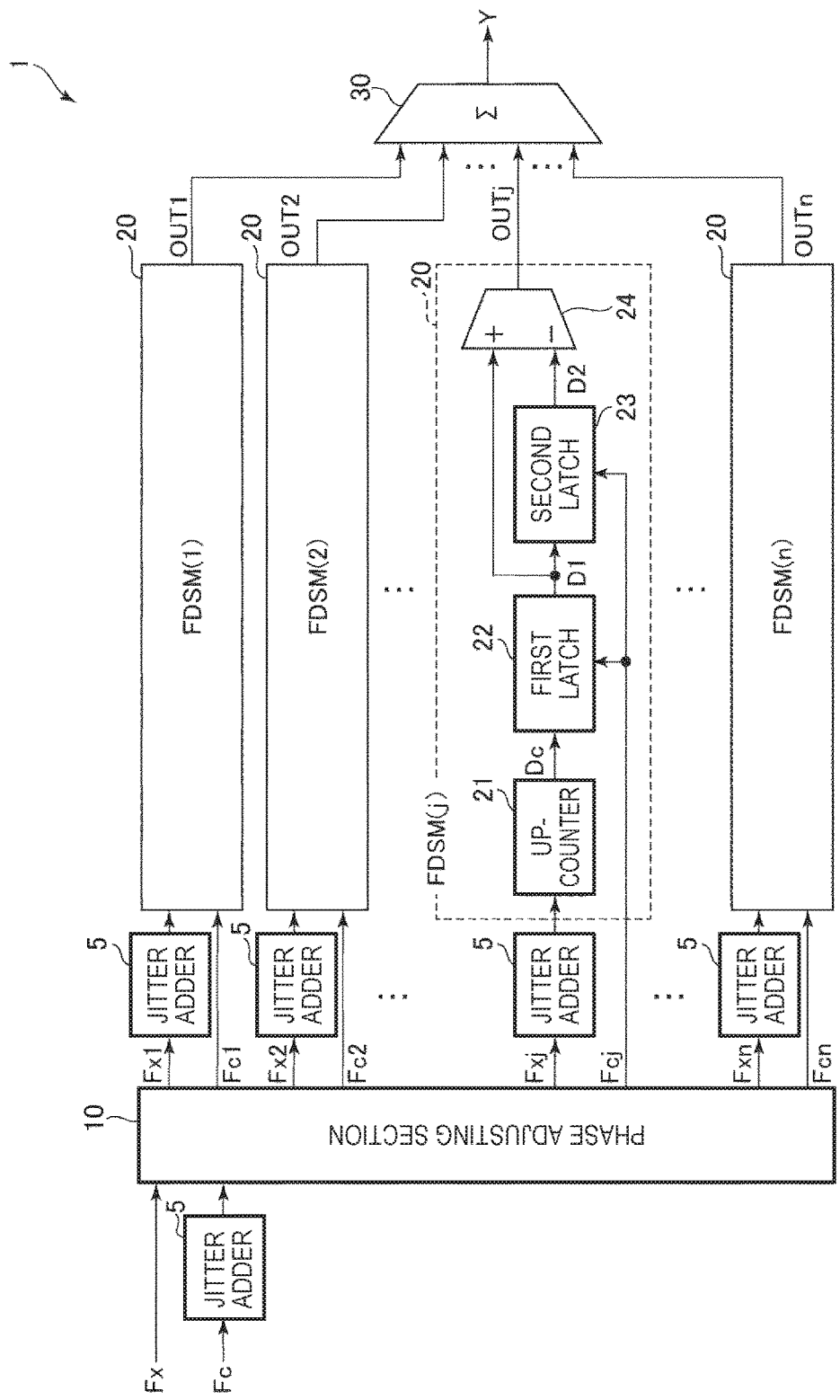
FIG. 1 is a block diagram showing an idle tone dispersion device according to a first embodiment of the invention.
Figure 2:
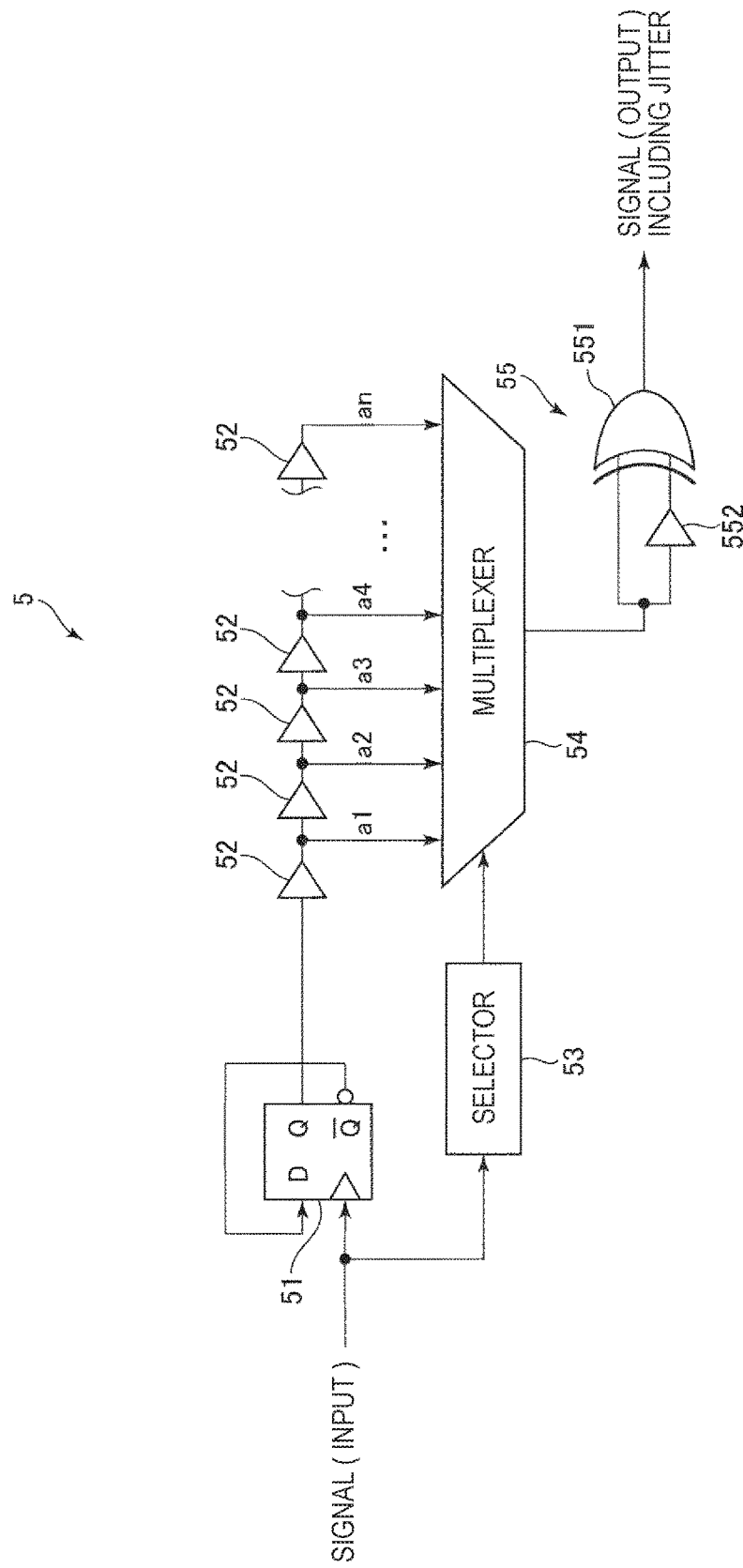
FIG. 2 is a block diagram showing a configuration example of a jitter adder of the idle tone dispersion device shown in FIG. 1.
Figure 3:
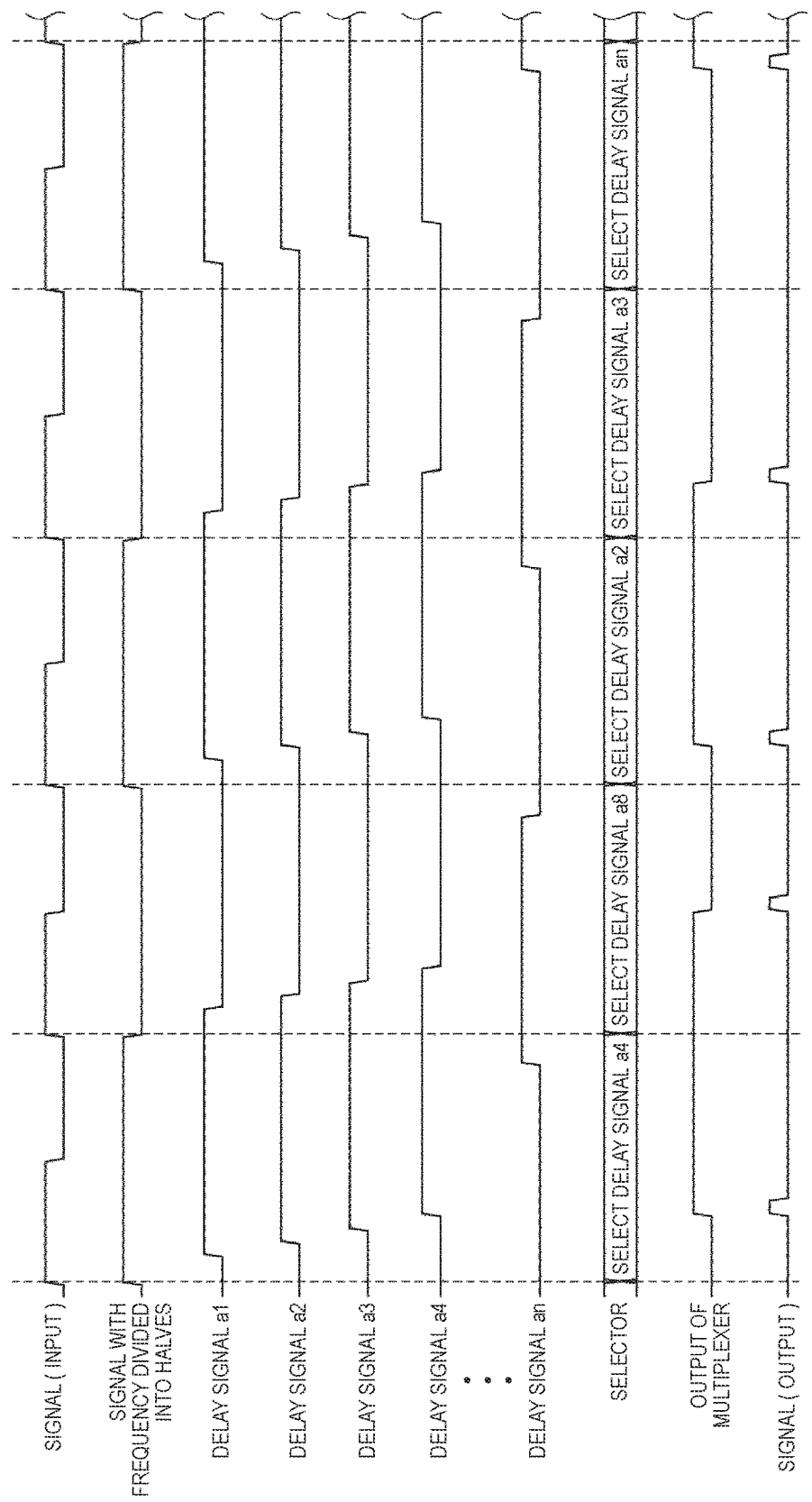
FIG. 3 is a timing chart for explaining the operation of the jitter adder shown in FIG. 2.
Figure 4:
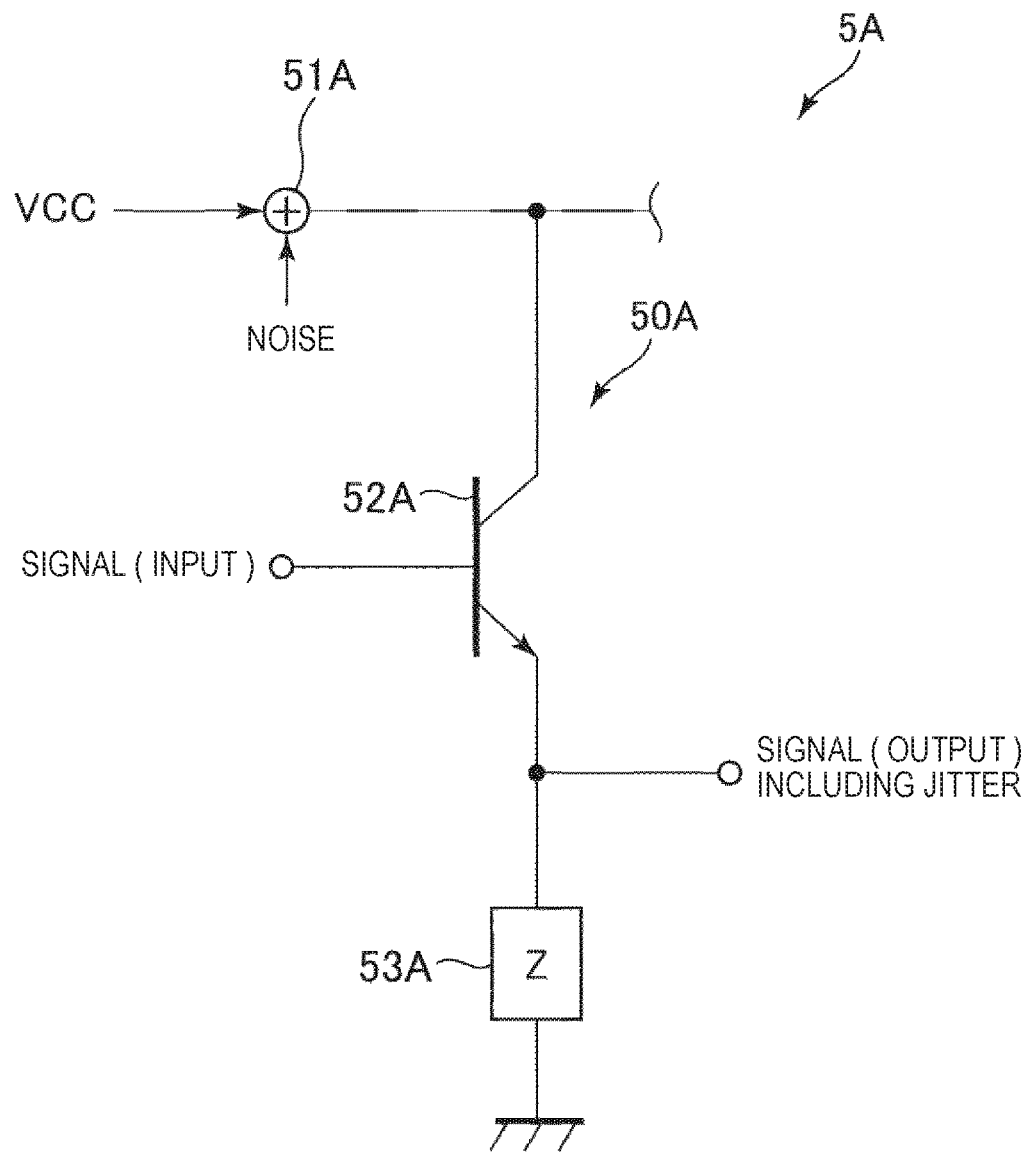
FIG. 4 is a block diagram showing a configuration example of the jitter adder of the idle tone dispersion device shown in FIG. 1.
Figure 10:
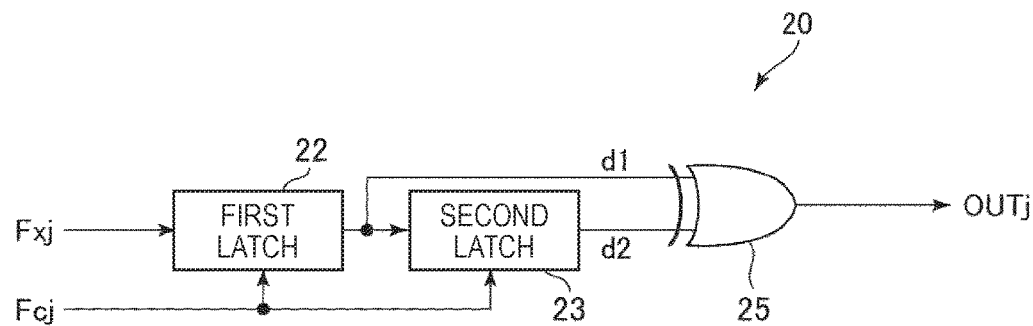
FIG. 10 is a block diagram showing a configuration example of a frequency delta-sigma modulation section.

FIG. 1 is a block diagram showing an idle tone dispersion device according to a first embodiment of the invention. FIG. 2 is a block diagram showing a configuration example of a jitter adder of the idle tone dispersion device shown in FIG. 1. FIG. 3 is a timing chart for explaining the operation of the jitter adder shown in FIG. 2. FIG. 4 is a block diagram showing a configuration example of the jitter adder of the idle tone dispersion device shown in FIG. 1. FIG. 10 is a block diagram showing a configuration example of a frequency delta-sigma modulation section.

Note that, in the drawings, a measured signal is described as "Fx", a reference signal is described as "Fc", output measured signals are described as "Fx1", "Fx2", "Fxj", and "Fxn", and output reference signals are described as "Fc1", "Fc2", "Fcj", and "Fcn". Suffixes such as "1", "2", "j" and "n" are added to the reference signs to distinguish the signals. In the explanation of this embodiment as well, a measured signal is described as "Fx", a reference signal is described as "Fc", output measured signals are described as "Fx1", "Fx2", "Fxj", and "Fxn", and output reference signals are described as "Fc1", "Fc2", "Fcj", and "Fcn". Suffixes such as "1", "2", "j" and "n" are added to the reference signs to distinguish the signals. However, in a part of the explanation, the descriptions are omitted.

In the following explanation, a reference signal output from a phase adjusting section 10 (a reference signal, the phase of which is adjusted by the phase adjusting section 10) is referred to as "output reference signal" or "reference signal". Similarly, a measured signal output from the phase adjusting section 10 (a measured signal, the phase of which is adjusted by the phase adjusting section 10) is referred to as "output measured signal" or "measured signal".

A level "low" of a signal is referred to as "0" and a level "high" of a signal is referred to "1" as well. The same applies to the other embodiments.

As shown in FIG. 1, an idle tone dispersion device 1 includes a phase adjusting section 10 that adjusts the phases of a measured signal Fx and a reference signal Fc and outputs n (n is a natural number equal to or larger than 2) output measured signals Fx1 to Fxn (measured signals) and output reference signals Fc1 to Fcn (reference signals), n (a plurality of) frequency delta-sigma modulation sections 20 (hereinafter referred to as "FDSMs (Frequency Delta-Sigma Modulators)"), an adder 30, and jitter adders 5 (jitter generating sections).

The number of the jitter adders 5 may be one or may be plural. However, in this embodiment, a plurality of the jitter adders 5 are provided. Note that the jitter adder 5 is explained in detail below.

The FDSMs 20 are connected in parallel. The FDSMs 20 are connected to an output side (a post stage) of the phase adjusting section 10. The adder 30 is connected to output sides of the FDSMs 20. The number of the FDSMs 20 is not particularly limited if the number is plural. An upper limit of the number of the FDSMs 20 can be set to, for example, approximately 5000. A reference signal and a measured signal are input to the phase adjusting section 10. The measured signal is a signal set as a target of measurement. The reference signal is a signal, the frequency of which is known, and is a signal serving as a reference of measurement. Suffixes "1", "2", "j", and "n" in the drawings respectively indicate "first", "second", "i-th", and "n-th". "j" is any natural number equal to or larger than 1 and equal to or smaller than n and indicates a general form.

The FDSMs 20 are circuits that use one of a reference signal (strictly speaking, output measured signals Fx1 to Fxn) and a measured signal (strictly speaking, output reference signals Fc1 to Fcn) to perform frequency delta-sigma modulation of the other. The FDSMs 20 measure a ratio (a frequency ratio) of the frequency of the reference signal and the frequency of the measured signal using the reference signal and the measured signal. In this embodiment, as a representative example, the frequency delta-sigma modulation of the measured signal is performed using the reference signal. When the frequency delta-sigma modulation of the reference signal is performed using the measured signal, the reference signal and the measured signal only have to be interchanged in the later explanation. Therefore, explanation of the frequency delta-sigma modulation is omitted.

As the FDSM 20, for example, an FDSM that outputs an output signal in a bit stream format (hereinafter referred to as "FDSM of a bit stream configuration (bit stream type FDSM)" as well) or an FDSM that outputs an output signal in a data stream format (hereinafter referred to as (FDSM of a data stream configuration (data stream type FDSM)" as well) can be used.

When the FDSM of the bit stream configuration is used, it is possible to simplify a signal processing circuit. When the FDSM of the data stream configuration is used, it is possible to easily cope with large frequency fluctuation.

The FDSM 20 of the data stream configuration and the FDSM 20 of the bit stream configuration are explained. First, the FDSM 20 of the data stream configuration is explained.

As shown in FIG. 1, the FDSM 20 of the data stream configuration includes an up-counter 21 that counts a rising edge of a measured signal and outputs count data Dc indicating a count value, a first latch 22 that latches the count data Dc in synchronization with a rising edge of a reference signal and outputs first data D1, a second latch 23 that latches the first data D1 in synchronization with the rising edge of the reference signal and outputs second data D2, and a subtractor 24 that subtracts the second data D2 from the first data D1 and generates output data OUT. Note that the first latch 22 and the second latch 23 are configured by, for example, a D flip-flop circuit.

The FDSM 20 in this example is called primary frequency delta-sigma modulator as well. The FDSM 20 latches the count value of the measured signal twice with the reference signal and sequentially retains the count value of the measured signal while being triggered by the rising edge of the reference signal. In this example, it is assumed that a latch operation is performed at the rising edge. However, the latch operation may be performed at a falling edge or at both of the rising and falling edges. The subtractor 24 calculates a difference between retained two count values to output, according to the elapse of time, without a dead period, an increase in a count value of the measured signal observed while the reference signal transitions by one cycle. When the frequency of the measured signal is represented as fx and the frequency of the reference signal is represented as fc, a ratio of the frequencies is fx/fc. The FDSM 20 outputs the ratio of the frequencies as a digital signal row.

The digital signal row is called data row or data stream. A digital signal row represented by one bit explained below is called bit row or bit stream.

The FDSM 20 of the bit stream configuration is explained. As shown in FIG. 10, the FDSM 20 of the bit stream configuration includes the first latch 22 that latches a measured signal in synchronization with a rising edge of a reference signal and outputs first data d1, the second latch 23 that latches the first data d1 in synchronization with the rising edge of the reference signal and outputs second data d2, and an exclusive OR circuit 25 that calculates an exclusive OR of the first data d1 and the second data d2 and generates output data OUT. Note that the first latch 22 and the second latch 23 are configured by, for example, a D flip-flop circuit.

This FDSM 20 is different from the FDSM 20 of the data stream configuration in that, while the FDSM 20 of the data stream configuration retains the count data Dc with the first latch 22 and outputs, as the output data OUT, an increase in the count data Dc obtained by counting the rising edge of the measured signal observed while the reference signal transitions by one cycle, this FDSM 20 retains a state of High or Low of the measured signal with the first latch 22 and outputs, as the output data OUT, "even" or "odd" of the number of reverse rotations during the one cycle transition of the reference signal (if the number of reverse rotations is an even number, outputs 0 and, if the number of reverse rotations is an odd number, outputs 1).

Incidentally, the one cycle of the measured signal is configured by two times of reverse transition of High and Low. Therefore, a degree of a change in the output data OUT caused by fluctuation in the measured signal with respect to the reference signal is twice as large compared with when the FDSM 20 of the data stream configuration retains the count value. Therefore, behavior of an idle tone in the FDSM 20 of the bit stream configuration coincides with behavior at the time when a measured signal having a double frequency is input to the FDSM 20 of the data stream configuration. Concerning the operation of the FDSM 20 of the bit stream configuration, considering the characteristics explained above, a frequency fx of the measured signal only has to be replaced with a frequency 2fx according to necessity. Note that, in this embodiment, as a representative example, the FDSM 20 of the data stream configuration is explained.

The phase adjusting section 10 adjusts the phases of the measured signal and the reference signal. The phase adjusting section 10 can be configured using, for example, a plurality of delay elements. The "adjustment of the phases of the measured signal and the reference signal" includes a configuration for shifting the phase of only the measured signal (a configuration for applying a delay to only the measured signal), a configuration for shifting the phase of only the reference signal (a configuration for applying a delay to only the reference signal), and a configuration for shifting the respective phases of the measured signal and the reference signal (a configuration for respectively applying delays to the measured signal and the reference signal). The phase adjusting section 10 having these three configurations is explained below.

The Phase Adjusting Section 10 Having the Configuration for Shifting the Phase of Only the Measured Signal The phase adjusting section 10 does not delay the measured signal, outputs the measured signal as the output measured signal Fx1, delays the measured signal (the output measured signal Fx1), and outputs the measured signal as the output measured signal Fx2. Thereafter, similarly, the phase adjusting section 10 sequentially delays the measured signal and finally outputs the measured signal as the output measured signal Fxn.

The phase adjusting section 10 does not delay the reference signal and outputs the reference signal as the output reference signals Fc1 to Fxn.

The Phase Adjusting Section 10 Having the Configuration for Shifting the Phase of Only the Reference Signal The phase adjusting section 10 does not delay the reference signal, outputs the reference signal as the output reference signal Fc1, delays the reference signal (the output reference signal Fc1), and outputs the reference signal as the output reference signal Fc2. Thereafter, similarly, the phase adjusting section 10 sequentially delays the reference signal and finally outputs the reference signal as the output reference signal Fcn. The phase adjusting section 10 does not delay the measured signal and outputs the measured signal as the output measured signals Fx1 to Fxn.

The Phase Adjusting Section 10 Having the Configuration for Shifting the Respective Phases of the Measured Signal and the Reference Signal The phase adjusting section 10 does not delay the measured signal, outputs the measured signal as the output measured signal Fx1, delays the measured signal (the output measured signal Fx1), and outputs the measured signal as the output measured signal Fx2. Thereafter, similarly, the phase adjusting section 10 sequentially delays the measured signal and finally outputs the measured signal as the output measured signal Fxn.

The phase adjusting section 10 does not delay the reference signal, outputs the reference signal as the output reference signal Fc1, delays the reference signal (the output reference signal Fc1), and outputs the reference signal as the output reference signal Fc2. Thereafter, similarly, the phase adjusting section 10 sequentially delays the reference signal and finally outputs the reference signal as the output reference signal Fcn. In this case, the phase adjusting section 10 sets a delay time for the measured signal and a delay time for the reference signal to be different.

By delaying at least one of the measured signal and the reference signal with the phase adjusting section 10, it is possible to temporally disperse an idle tone, which is periodic quantization noise that occurs in the frequency delta-sigma modulation in the FDSM 20, and reduce the influence of the idle tone.

Examples of the configuration of the phase adjusting section 10 include two configurations explained below.

Configuration 1

In a configuration 1, the phase adjusting section 10 is configured to differentiate all the phases of idle tones of output signals of the n FDSMs 20 from one another. Specifically, the phase adjusting section 10 is configured as explained below.

When a predetermined time is represented as D, one cycle of the measured signal or one cycle of the reference signal is represented as T, m is any natural number equal to or smaller than n, mD/nT is an integer, mD/nT and m are relatively prime, and a phase difference between an output measured signal and an output reference signal supplied to an i (i is any natural number equal to or smaller than n−1)-th FDSM 20 (frequency delta-sigma modulation section) is represented as Pi, the phase adjusting section 10 adjusts the phases of the measured signal and the reference signal to satisfy $D/n = P_{i+1} - P_i$ and generates n sets of the output measured signals Fx1 to Fxn and the output reference signals Fc1 to Fcn. Consequently, the phases of idle tones of output signals of the n FDSMs 20 can be set different from one another. Consequently, it is possible to accurately temporally disperse the idle tones. It is possible to reduce the influence of the idle tones. In this case, it is possible to temporally disperse the idle tones more than a configuration 2 explained below. It is possible to reduce the influence of the idle tones.

As an example, when a phase with a maximum delay amount of 15000 picoseconds is adjusted using ten FDSMs 20 and a reference signal (frequency: 200 MHz), D is 15000 picoseconds, T is 1/200 MHz=5000 picoseconds, and n is 10. As design values, if 10 is selected as m, mD/nT is 3 and mD/nT and m are relatively prime. Therefore, the conditions explained above are satisfied. In this case, $P_{i+1} - P_i$ only has to be adjusted to shift the phase by D/n, that is, 1500 picoseconds at a time.

Configuration 2

In a configuration 2, the phase adjusting section 10 is configured to differentiate a part of the phases of idle tones of output signals of the n FDSMs 20 from one another. Specifically, the phase adjusting section 10 is configured as explained below.

The phase adjusting section 10 adjusts the phases of a measured signal and a reference signal to differentiate the phases of idle tones of output signals of a part of the n FDSMs 20 (frequency delta-sigma modulation sections) from one another. The phase adjusting section 10 generates the n sets of the output measured signals Fx1 to Fxn and the output reference signals Fc1 to Fcn. Consequently, it is possible to accurately temporally disperse the idle tones. It is possible to reduce the influence of the idle tones.

When a predetermined time is represented as D, one cycle of the measured signal or one cycle of the reference signal is represented as T, m is any natural number equal to or smaller than n, mD/nT is an integer, mD/nT and m are relatively prime, and a phase difference between an output measured signal and an output reference signal supplied to an i (i is any natural number equal to or smaller than n−1)-th FDSM 20 (frequency delta-sigma modulation section) is represented as Pi, the n sets of the output measured signals Fx1 to Fxn and the output reference signals Fc1 to Fcn may satisfy $D/n \neq P_{i+1} - P_1$.

Even in this case, by giving jitter, the phases of the idle tones of the output signals of the n FDSMs 20 can be set different from one another. Consequently, it is possible to accurately temporally disperse the idle tones. It is possible to reduce the influence of the idle tones.

Flexibility of setting of a delay amount increases and adjustment is easily performed. Since the adjustment is easily performed, a special device is unnecessary and manufacturing cost can be reduced.

Apart of the n sets of the output measured signals Fx1 to Fxn and the output reference signals Fc1 to Fcn satisfy $D/n = P_{i+1} - P_i$ and the other parts (the remainder) may satisfy $D/n \neq P_{i+1} - P_1$.

The adder 30 adds up output data OUT1 to OUTn, generates a frequency delta-sigma modulation signal Y, and outputs the frequency delta-sigma modulation signal Y. The frequency delta-sigma modulation signal Y corresponds to a ratio (a frequency ratio) of the frequency of the reference signal and the frequency of the measured signal.

The idle tone dispersion device 1 includes the jitter adders 5, which are an example of jitter generating sections that generate jitter. Consequently, it is unnecessary to separately prepare a device that generates jitter. It is possible to easily and accurately add jitter to a signal to which jitter is desired to be added. Jitter refers to temporal fluctuation (timing fluctuation) of a signal. In the following explanation, the magnitude of jitter refers to, when focusing on one pulse (signal waveform) forming the signal, a time (a time interval) between a rising edge that rises earliest and a rising edge that rises latest.

Specifically, the idle tone dispersion device 1 includes n (a plurality of) jitter adders 5 that individually give (add) jitter to the n (plurality of) output measured signals Fx1 to Fxn and the jitter adder 5 that gives (adds) jitter to the reference signal Fc.

The jitter adders 5 that give jitter to the output measured signals Fx1 to Fxn are connected to input sides of the FDSMs.

The jitter adder 5 that gives jitter to the reference signal Fc is connected to an input side of the phase adjusting section 10.

In this case, by providing the n jitter adders 5 that individually give jitter to the n output measured signals Fx1 to Fxn, it is possible to reduce noise components included in a frequency delta-sigma modulation signal compared with when the jitter adder 5 that gives jitter to the measured signal Fx is provided.

By providing the jitter adder 5 that gives jitter to the reference signal Fc, it is possible to reduce a circuit size compared with when the n jitter adders 5 that individually give jitter to the n output reference signals Fc1 to Fcn are provided.

The jitter adder 5 (the jitter generating section) is explained.

As shown in FIG. 2, the jitter adder 5 includes a 1-bit ripple counter 51 (a binary counter), a plurality of delay elements 52, a selector 53, a multiplexer 54, and a differentiator 55.

The plurality of delay elements 52 connected in series are connected to an output side (a post stage) of the ripple counter 51.

The multiplexer 54 is connected to an output side of the selector 53 and output sides of the delay elements 52. The differentiator 55 is connected to an output side of the multiplexer 54.

In this embodiment, the ripple counter 51 is configured by a T flip-flop formed by connecting a Q bar output terminal and a D input terminal of a D flip-flop. In this embodiment, the differentiator 55 is configured by an exclusive OR circuit 551 and a delay element 552 connected to one input terminal of the exclusive OR circuit 551. A buffer is used as the delay element 552.

The operation of the jitter adder 5 is explained with reference to FIGS. 2 and 3. Note that, in the following explanation, a signal to which jitter is given (added) is referred to as "target signal".

First, the target signal is input to the ripple counter 51 of the jitter adder 5, divided into halves by the ripple counter 51, and output.

Subsequently, the signal output from the ripple counter 51 is input to the delay element 52 at an initial stage (first delay element 52) and delayed by the delay element 52 at the initial stage. Note that, in the following explanation, signals output from the delay elements 52 are referred to as "delay signals".

A delay signal a1 output from the delay element 52 at the initial stage is input to the multiplexer 54 and the delay element 52 at a second stage (second delay element 52) and delayed by the delay element 52 at the second stage.

A delay signal a2 output from the delay element 52 at the second stage is input to the multiplexer 54 and the delay element 52 at a third stage (third delay element 52) and delayed by the delay element 52 at the third stge.

Thereafter, similarly, delay signals a3, a4, , and an output from the delay elements 52 at a third stage to a final stage are input to the multiplexer 54. In this way, a plurality of delay signals a1, a2, a3, a4, and an having different phases (phase differences) are input to the multiplexer 54. Delay amounts of the signals in the delay elements 52 are set to prevent a delay amount (a phase difference) of the delay signal an output from the delay element 52 at the final stage with respect to the target signal input to the ripple counter 51 from exceeding one cycle of the target signal.

The target signal is input to the selector 53. The selector 53 operates in synchronization with a rising edge of the target signal and causes the multiplexer 54 to operate. Consequently, any one of the delay signals a1 to an input to the multiplexer 54 is selected and output from the multiplexer 54. In this case, the selector 53 includes, for example, a storing section (not shown in FIG. 2) in which the order of selection of the delay signals a1 to an is stored. The selector 53 selects the delay signals a1 to an according to the order stored in the storing section. Note that a selecting method of the selector 53 is not limited to this method.

The signal output from the multiplexer 54 is input to the differentiator 55. The differentiator 55 outputs one pulse at one cycle interval of the input signal. That is, the differentiator 55 outputs a pulse having a rising edge synchronized with a rising edge of the input signal and a pulse having a rising edge synchronized with a falling edge of the input signal. The pulses are signals synchronized with the target signal (have the same cycle as the cycle of the target signal) and including any jitter selected by the selector 53.

The jitter selected by the jitter adder 5 includes a frequency component higher than the frequency of an idle tone of an output signal of the FDSM 20. That is, the jitter includes a frequency component higher than an upper limit value in a measurement band. Consequently, it is possible to greatly reduce the influence of quantization noise due to the idle tone. The measurement band is a measurement range of a frequency that a user can optionally set and is a measurement range different from the frequency of the measured signal and the frequency of the reference signal. Note that the frequency component included in the jitter is set as appropriate according to conditions.

When a maximum frequency among frequency components included in the jitter is represented as A, the frequency of the idle tone of the output signal of the FDSM 20 is represented as B, and an upper limit frequency of the measurement band is represented as C, as explained above, A is not particularly limited if A is larger than B. A is set as appropriate according to conditions. However, A/C is desirably equal to or larger than 1, more desirably equal to or larger than 2, and still more desirably equal to or larger than 8.

The jitter desirably includes a frequency component higher than the frequency of a component having largest intensity among the frequency components included in the idle tone. Consequently, it is possible to greatly reduce the influence of quantization noise due to the idle tone.

Low-frequency components are desirably removed from the jitter. Consequently, it is possible to reduce noise components included in a frequency delta-sigma modulation signal in a removed frequency band among frequency bands of the jitter.

Frequency components of the jitter to be removed are not particularly limited and are set as appropriate according to conditions. However, when the upper limit frequency of the measurement band is set to 100 MHz, it is desirable to remove low-frequency components equal to or lower than 1 MHz, it is more desirable to remove low-frequency components equal to or lower than 2 MHz, it is still more desirable to remove low-frequency components equal to or lower than 5 MHz, it is still more desirable to remove low-frequency components equal to or lower than 10 MHz, it is still more desirable to remove low-frequency components equal to or lower than 20 MHz, it is still more desirable to remove low-frequency components equal to or lower than 50 MHz, and it is still more desirable to remove low-frequency components equal to or lower than 100 MHz.

The magnitude of the jitter is not particularly limited and is set as appropriate according to conditions. However, the magnitude of the jitter is desirably set on the basis of at least one of the frequency of the reference signal, the frequency of the measured signal, a measurement band of the measured signal, and the number (N) of the FDSMs 20. Consequently, it is possible to accurately set a frequency band of the jitter. Note that specific examples are explained in explanation of experiments explained below.

The jitter adder 5 is not limited to the configuration explained above if the jitter adder 5 is capable of giving (adding) jitter to a target signal. Other configuration examples of the jitter adder 5 are explained.

Configuration 1

As shown in FIG. 4, in a configuration 1, the jitter adder 5 includes an emitter follower circuit 50A and an adder 51A.

The emitter follower circuit 50A includes a transistor 52A (an npn transistor) and a resistor 53A connected to an emitter of the transistor 52A. The adder 51A is connected to a collector of the transistor 52A.

A power supply voltage and noise are input to the adder 51A. A signal to which jitter is added is input to a base of the transistor 52A.

In the jitter adder 5, by adding noise to a supplied power supply voltage, a switching characteristic of the transistor 52A changes. The jitter adder 5 outputs a signal having temporal fluctuation (timing fluctuation) with respect to the signal input to the base of the transistor 52A, that is, a signal having jitter.

Configuration 2

In a configuration 2, electric noise is given to a target circuit by a thermal motion of atoms configuring a circuit of the idle tone dispersion device 1 to cause the target circuit to output a signal having temporal fluctuation.

The idle tone dispersion device 1 can be configured by hardware that realizes functions corresponding to the sections explained above. The idle tone dispersion device 1 can also be configured in terms of software by a computer program, a module, or the like that realizes the functions corresponding to the sections. The idle tone dispersion device 1 can also be configured by combining hardware and software that realize the functions corresponding to the sections explained above.

As explained above, with the idle tone dispersion device 1, it is possible to temporally disperse an idle tone, which is periodic quantization noise, caused by the frequency delta-sigma modulation in the FDSMs 20 and reduce the influence of the idle tone. The reference signal and the output measured signals have jitter including a frequency component higher than the frequency of the idle tone. Therefore, it is possible to greatly reduce the influence of the quantization noise due to the idle tone.

Note that, in this embodiment, the reference signal (the output reference signals) and the output measured signals respectively have jitter including a frequency component higher than the frequency of the idle tone of the output signal of the FDSM 20. However, not only this, but at least one of the output reference signals and the output measured signals only have to have the jitter including the frequency component higher than the frequency of the idle tone of the output signal of the FDSM 20.

As explained above, the idle tone dispersion device 1 is a device that outputs the frequency delta-sigma modulation signal Y obtained by using either one of the reference signal Fc and the measured signal Fx to perform frequency delta-sigma modulation of the other and dispersion an idle tone.

The idle tone dispersion device 1 includes the n (n is any natural number equal to or larger than 2) FDSMs 20 (frequency delta-sigma modulation sections), the phase adjusting section 10 that adjusts the phases of the measured signal Fx and the reference signal Fc, generates the n sets of the output measured signals Fx1 to Fxn and the output reference signals Fc1 to Fcn, and supplies the sets of the output measured signals Fx1 to Fxn and the output reference signals Fc1 to Fcn respectively to the n FDSMs 20 (frequency delta-sigma modulation sections), and the adder 30 (the adding section) that adds up output signals of the n FDSMs 20 (frequency delta-sigma modulation sections) and outputs the frequency delta-sigma modulation signal Y.

The phase adjusting section 10 adjusts the phases of the measured signal Fx and the reference signal Fc to differentiate the phases of idle tones of output signals of at least a part of the n FDSMs 20 (frequency delta-sigma modulation sections) from one another and generates the n sets of the output measured signals Fx1 to Fxn and the output reference signals Fc1 to Fcn.

The n FDSMs 20 (frequency delta-sigma modulation sections) respectively use either one of the output reference signals Fc1 to Fcn and the output measured signals Fx1 to Fxn supplied from the phase adjusting section 10 to perform frequency delta-sigma modulation of the other.

At least one of the output reference signals Fc1 to Fcn and the output measured signals Fx1 to Fxn includes jitter including a frequency component higher than the frequency of the idle tone.

With the idle tone dispersion device 1, it is possible to temporally disperse an idle tone, which is periodic quantization noise that occurs in the FDSM 20, and reduce the influence of the idle tone. In particular, at least one of the reference signal Fc, the measured signal Fx, the output reference signals Fc1 to Fcn, and the output measured signals Fx1 to Fxn includes jitter including a frequency component higher than the frequency of the idle tone. Therefore, it is possible to greatly reduce the influence of the quantization noise due to the idle tone.

Second Embodiment

Figure 5:
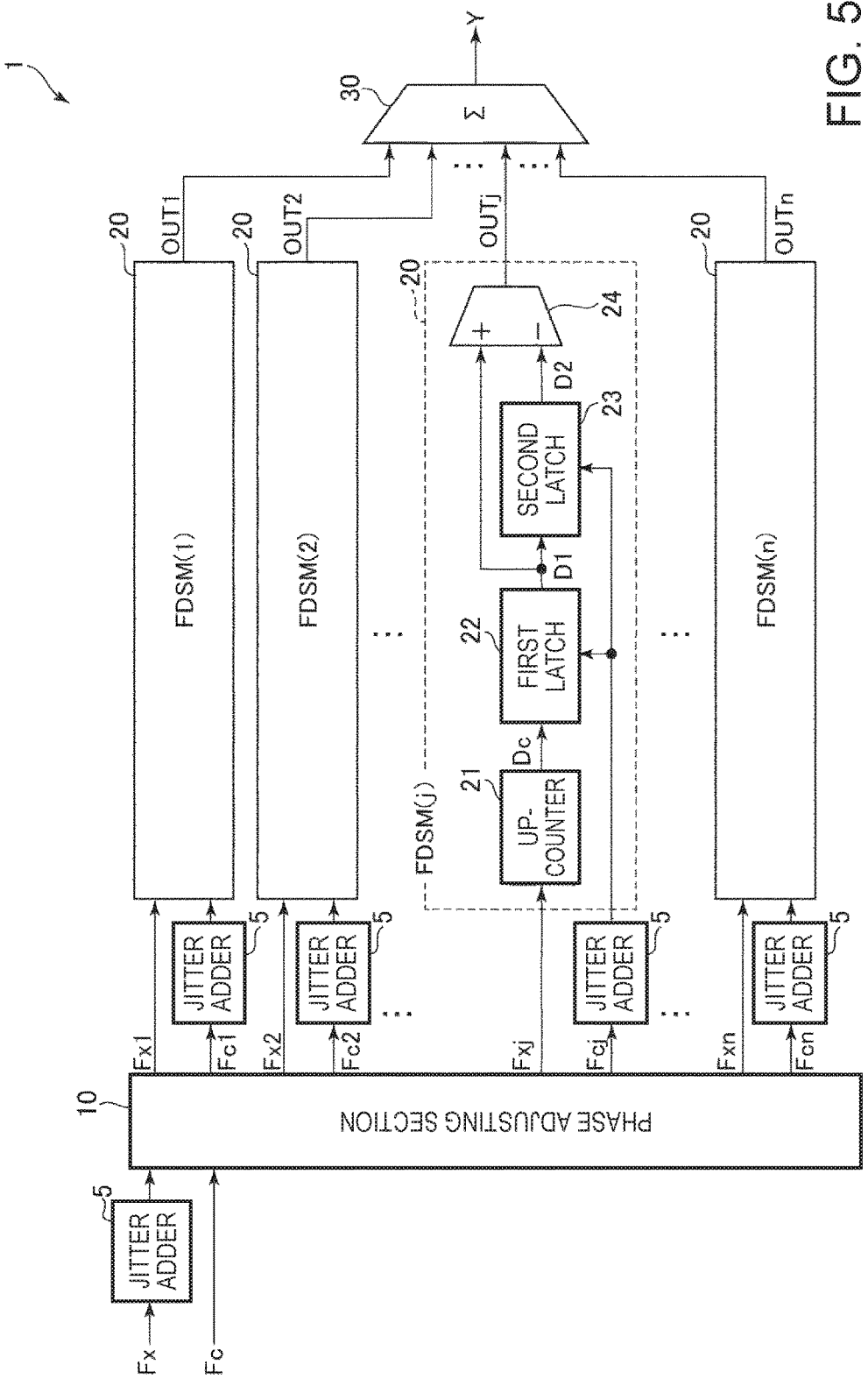
FIG. 5 is a block diagram showing an idle tone dispersion device according to a second embodiment of the invention.

FIG. 5 is a block diagram showing an idle tone dispersion device according to a second embodiment of the invention.

The second embodiment is explained below. Differences from the first embodiment are mainly explained. Explanation of similarities to the first embodiment is omitted.

As shown in FIG. 5, the idle tone dispersion device 1 according to the second embodiment includes the jitter adder 5 that gives (adds) jitter to the measured signal Fx and the n (plurality of) jitter adders 5 that individually give (add) jitter to the n (plurality of) output reference signals Fc1 to Fcn.

The jitter adder 5 that gives jitter to the measured signal Fx is connected to the input side of the phase adjusting section 10.

The jitter adders 5 that give jitter to the output reference signals Fc1 to Fcn are connected to the input sides of the FDSMs.

In this case, by providing the jitter adder 5 that gives jitter to the measured signal Fx, it is possible to reduce a circuit size compared with when the n jitter adders 5 that individually give jitter to the n output measured signals Fx1 to Fxn are provided.

By providing the n jitter adders 5 that individually give jitter to the n output reference signals Fc1 to Fcn, it is possible to reduce noise components included in the frequency delta-sigma modulation signal compared with when the jitter adder 5 that gives jitter to the reference signal Fc is provided.

According to the second embodiment explained above, it is possible to exhibit the same effect as the effect in the first embodiment.

Third Embodiment

Figure 6:
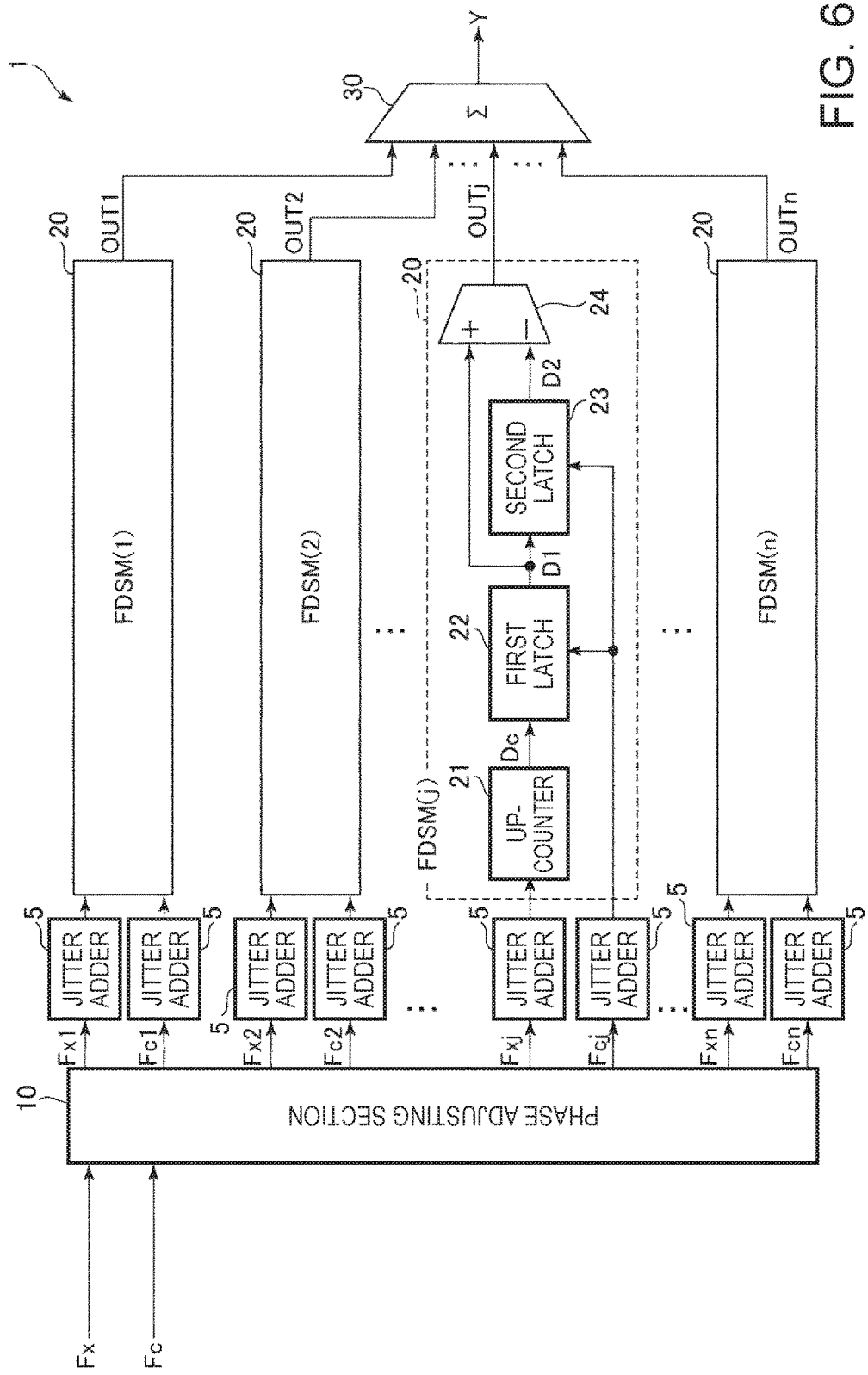
FIG. 6 is a block diagram showing an idle tone dispersion device according to a third embodiment of the invention.

FIG. 6 is a block diagram showing an idle tone dispersion device according to a third embodiment of the invention.

The third embodiment is explained below. Differences from the embodiments explained above are mainly explained. Explanation of similarities to the embodiments is omitted.

As shown in FIG. 6, the idle tone dispersion device 1 according to the third embodiment includes the n (plurality of) jitter adders 5 that individually give (add) jitter to the n (plurality of) output measured signals Fx1 to Fxn and the n (plurality of) jitter adders 5 that individually give (add) jitter to the n (plurality of) output reference signals Fc1 to Fcn.

The jitter adders 5 that give jitter to the output measured signals Fx1 to Fxn are connected to the input side of the phase adjusting section 10.

The jitter adders 5 that give jitter to the output reference signals Fc1 to Fcn are connected to the input sides of the FDSMs.

In this case, by providing the n jitter adders 5 that individually give jitter to the n output measured signals Fx1 to Fxn, it is possible to reduce noise components included in a frequency delta-sigma modulation signal compared with when the jitter adder 5 that gives jitter to the measured signal Fx is provided.

Similarly, by providing the n jitter adders 5 that individually give jitter to the n output reference signals Fc1 to Fcn, it is possible to reduce the noise components included in the frequency delta-sigma modulation signal compared with when the jitter adder 5 that gives jitter to the reference signal Fc is provided.

According to the third embodiment explained above, it is possible to exhibit the same effect as the effect in the embodiments explained above.

Fourth Embodiment

Figure 7:
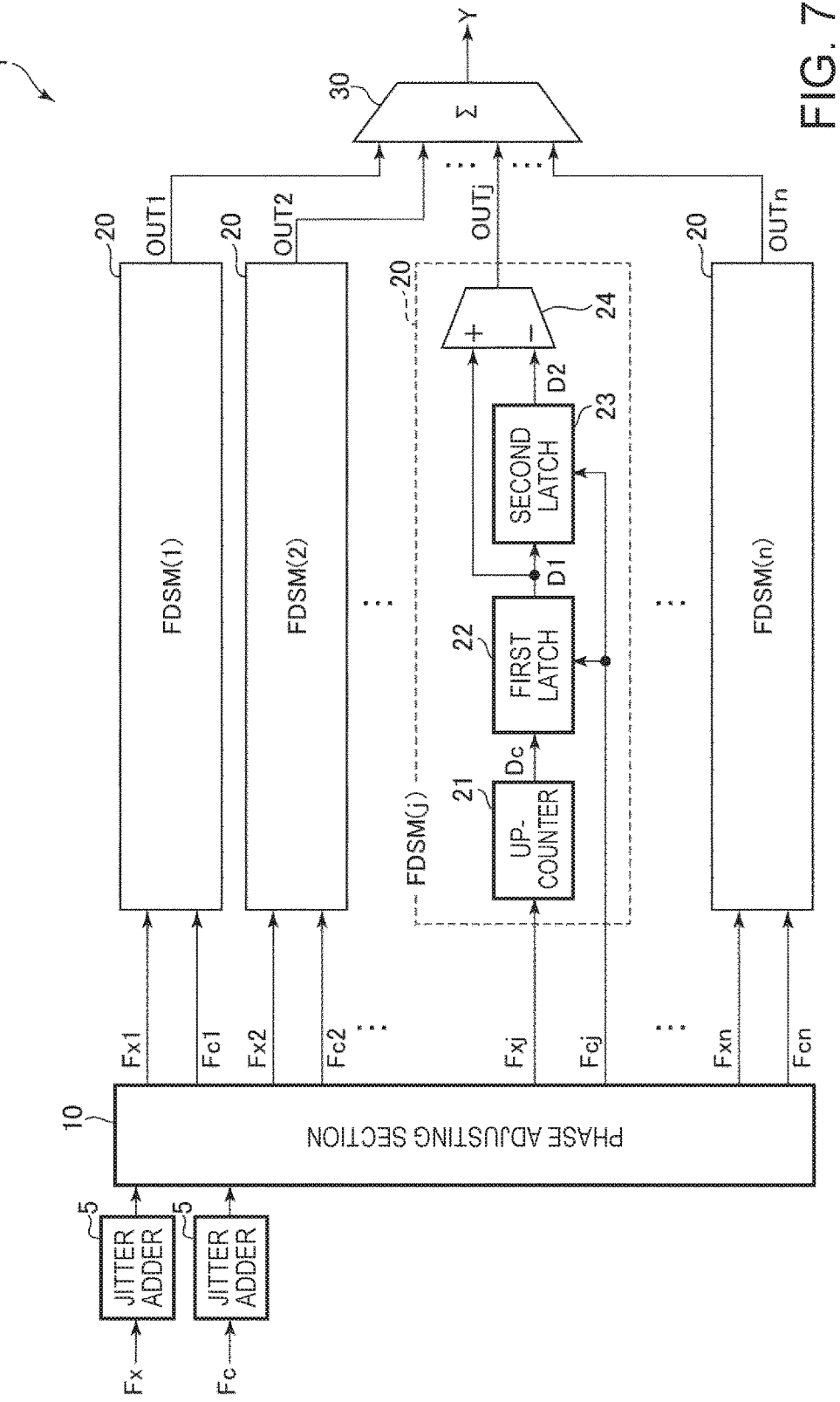
FIG. 7 is a block diagram showing an idle tone dispersion device according to a fourth embodiment of the invention.

FIG. 7 is a block diagram showing an idle tone dispersion device according to a fourth embodiment of the invention.

The fourth embodiment is explained below. Differences from the embodiments explained above are mainly explained. Explanation of similarities to the embodiments is omitted.

As shown in FIG. 7, the idle tone dispersion device 1 according to the fourth embodiment includes the jitter adder 5 that gives (adds) jitter to the measured signal Fx and the jitter adder 5 that gives (adds) jitter to the reference signal Fc. The jitter adders 5 are connected to the input sides of the FDSMs.

In this case, by providing the jitter adder 5 that gives jitter to the measured signal Fx, it is possible to reduce a circuit size compared with when the n jitter adders 5 that individually give jitter to the n output measured signals Fx1 to Fxn are provided.

Similarly, by providing the jitter adder 5 that gives jitter to the reference signal Fc, it is possible to reduce the circuit size compared with when the n jitter adders 5 that individually give jitter to the n output reference signals Fc1 to Fcn are provided.

According to the fourth embodiment explained above, it is possible to exhibit the same effect as the effect in the embodiments explained above.

Fifth Embodiment

Figure 8:
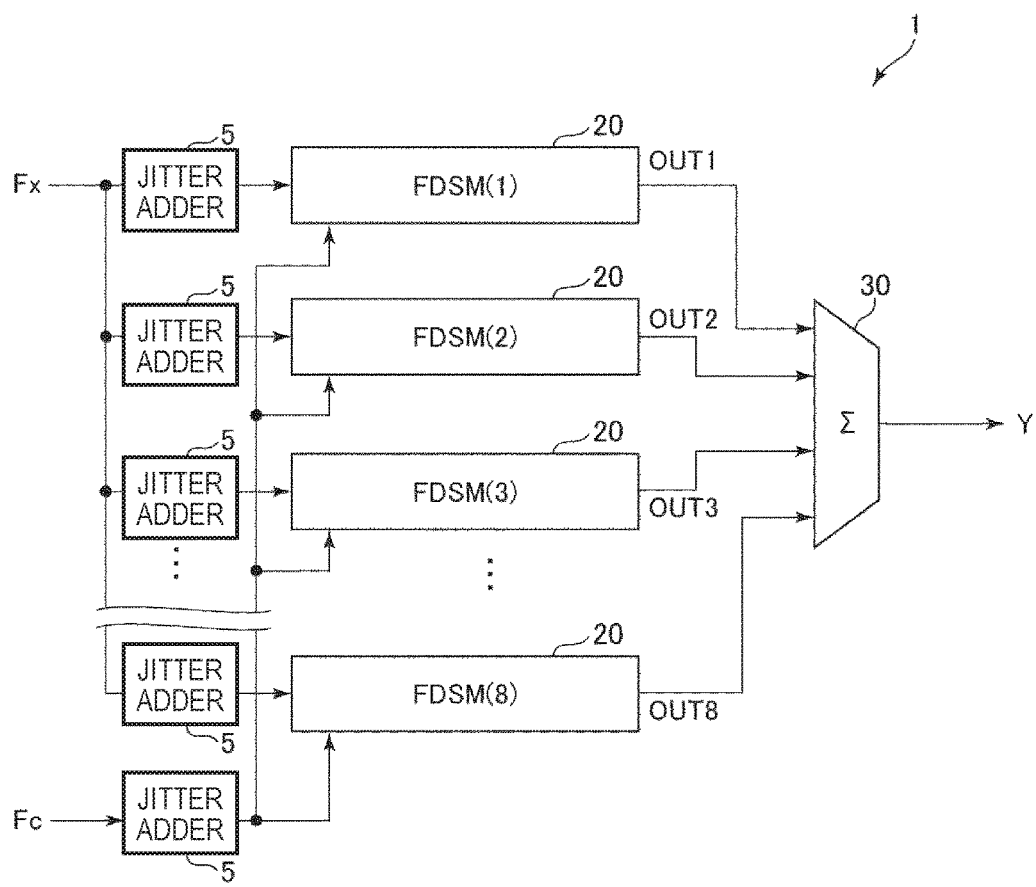
FIG. 8 is a block diagram showing an idle tone dispersion device according to a fifth embodiment of the invention.

FIG. 8 is a block diagram showing an idle tone dispersion device according to a fifth embodiment of the invention.

The fifth embodiment is explained below. Differences from the embodiments explained above are mainly explained. Explanation of similarities to the embodiments is omitted.

As shown in FIG. 8, the idle tone dispersion device 1 according to the fifth embodiment is the same as the idle tone dispersion device 1 according to the first embodiment except that the phase adjusting section 10 is omitted. Consequently, measured signals having the same phase and reference signals having the same phase are input to the FDSMs 20.

The idle tone dispersion device 1 includes, concerning a path of a measured signal, a plurality of (in this embodiment, eight) jitter adders 5 that individual give (add) jitter to measured signals input to the FDSMs 20. The idle tone dispersion device 1 includes, concerning a path of a reference signal, one (common) jitter adder 5 that gives (adds) jitter to the reference signal Fc. The jitter adders 5 are connected to the input sides of the FDSMs.

According to the fifth embodiment explained above, it is possible to exhibit the same effect as the effect in the embodiments explained above.

The fifth embodiment can be applied to the second to fourth embodiments as well.

As explained above, the idle tone dispersion device 1 is a device that outputs the frequency delta-sigma modulation signal Y obtained by using either one of the reference signal Fc and the measured signal Fx to perform frequency delta-sigma modulation of the other and dispersion an idle tone.

The idle tone dispersion device 1 includes the n (n is any natural number equal to or larger than 2) FDSMs 20 (frequency delta-sigma modulation sections) and the adder 30 (the adding section) that adds up output signals of the n FDSMs 20 (frequency delta-sigma modulation sections) and outputs the frequency delta-sigma modulation signal Y.

Each of the n FDSMs 20 (frequency delta-sigma modulation sections) uses either one of the reference signal Fc and the measured signal Fx to perform frequency delta-sigma modulation of the other.

At least one of the reference signal Fc and the measured signal Fx includes jitter including a frequency component higher than the frequency of an idle tone of an output signal of the FDSM 20 (the frequency delta-sigma modulation section).

With the idle tone dispersion device 1, it is possible to temporally disperse an idle tone, which is periodic quantization noise that occurs in the FDSM 20 and reduce the influence of the idle tone. In particular, since at least one of the reference signal Fc and the measured signal Fx includes jitter including a frequency component higher than the frequency of the idle tone, it is possible to greatly reduce the influence of the quantization noise due to the idle tone.

Experiments performed to confirm the effect and the like of the idle tone dispersing device 1 are explained.

Figure 9:
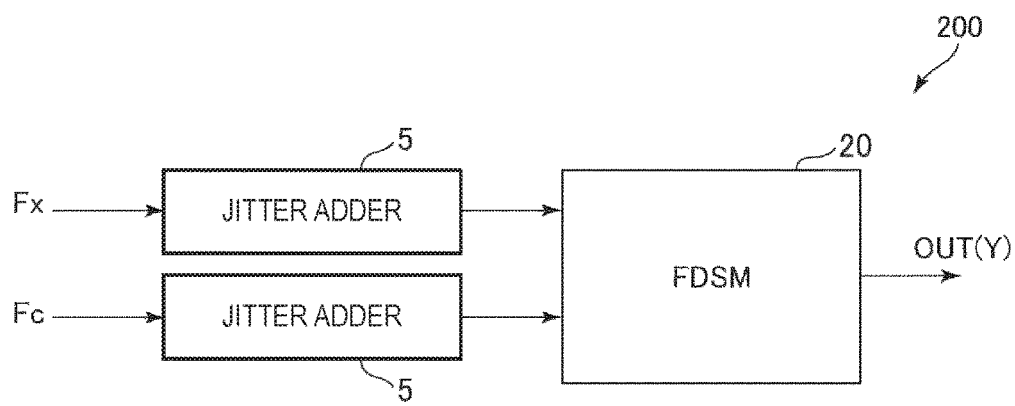
FIG. 9 is a block diagram showing an idle tone dispersion device according to a comparative example.
Figure 11:
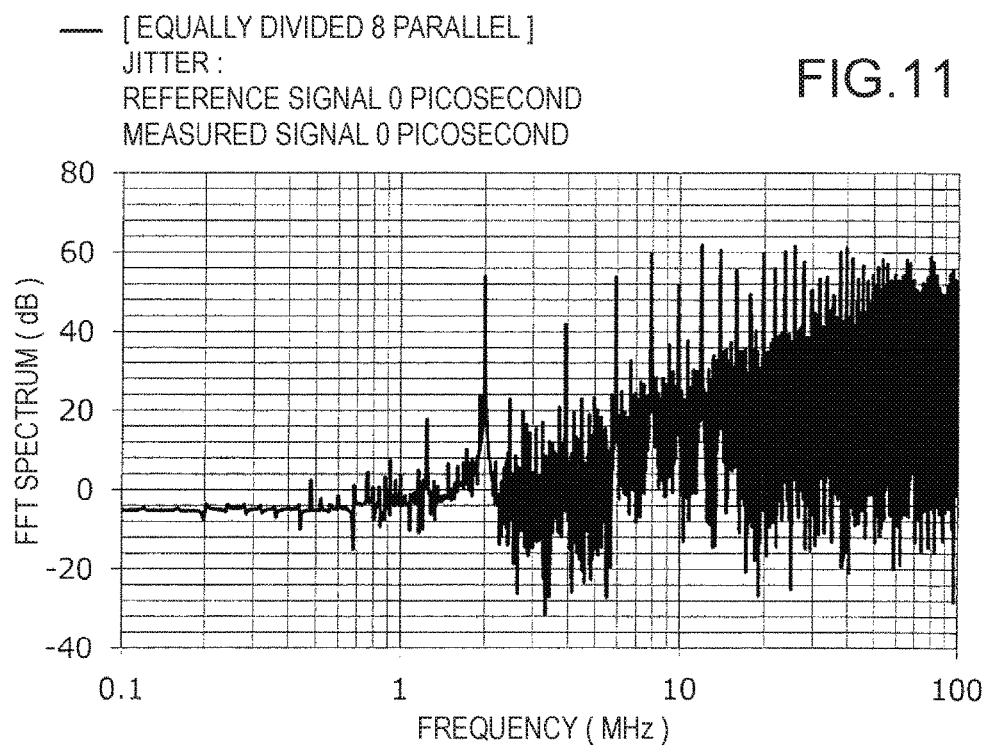
FIG. 11 is a graph showing an output spectrum of the idle tone dispersion device.
Figure 79:
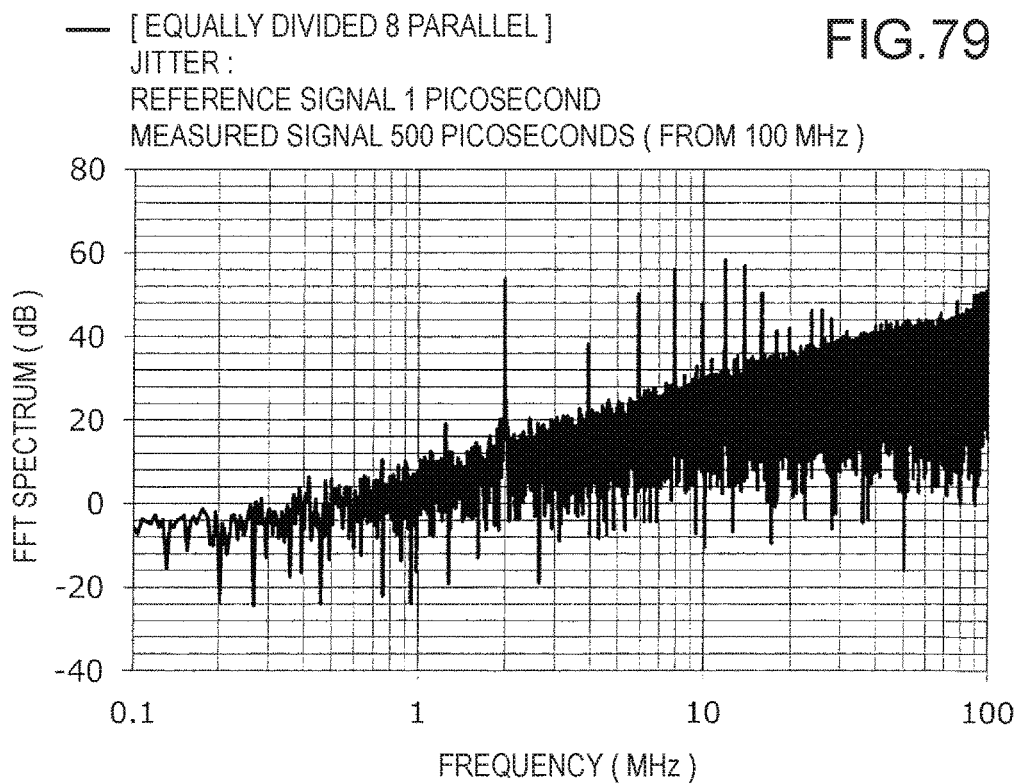
FIG. 79 is a graph showing an output spectrum of the idle tone dispersion device.

FIG. 9 is a block diagram showing an idle tone dispersion device according to a comparative example. FIGS. 11 to 79 are graphs showing output spectra of the idle tone dispersion device. Note that, in the following explanation, an output reference signal and an output measured signal output from the phase adjusting section 10 are respectively referred to as reference signal and measured signal.

First, as a matter common to the experiments, a rectangular wave (pulse) having a frequency of 260 MHz was used as the reference signal.

A rectangular wave, the frequency of which was varied, was used as the measured signal. In this case, a carrier frequency was set to 261.24 MHz. The carrier frequency was changed in a range of ±500 kHz 2M times (a modulation frequency: 2 MHz) in one second. The carrier frequency converted into a rectangular wave was set as the measured signal. That is, in the experiments, a frequency component of 2 MHz was set as a detection target (measurement target) frequency.

Devices

As the idle tone dispersion device, a device "a", a device "b", a device "c", a device "d", and a device "e" were prepared.

Device "a"

The idle tone dispersion device 1 according to the first embodiment shown in FIG. 1 was used. The number of FDSMs 20 disposed in parallel was set to eight. Measured signals, all of which had different phases, were input to the eight FDSMs 20. Each of the measured signals input to the eight FDSMs 20 was delayed by $\frac{1}{260}M \times \frac{1}{8}$ [second]. When the device "a" is used, "equally divided 8 parallel" is described in explanation of the graphs.

Device "b"

The idle tone dispersion device 1 according to the first embodiment shown in FIG. 1 was used. The number of FDSMs 20 disposed in parallel was set to eight. Measured signals having the same phase were input to two FDSMs 20. The two FDSMs 20 were set as one set. Measured signals, all of which had different phases, were input to four sets of the FDSMs 20. Each of the measured signals input to the four sets of the FDSMs 20 was delayed by $\frac{1}{260}M \times \frac{1}{4}$ [second]. When the device "b" is used, "overlap 2×4 parallel" is described in explanation of the graphs.

Device "c"

The idle tone dispersion device 1 according to the fifth embodiment not including the phase adjusting section 10 shown in FIG. 8 was used. The number of FDSMs 20 disposed in parallel was set to eight. That is, measured signals, all of which had the same phase, were input to the eight FDSMs 20. When the device "c" is used, "same phase 8 parallel" is described in explanation of the graphs.

Device "d"

An idle tone dispersion device 200 (the comparative example) shown in FIG. 9 was used. The idle tone dispersion device 200 includes one FDSM 20. The idle tone dispersion device 200 includes the jitter adder 5 that gives jitter to the measured signal Fx and the jitter adder 5 that gives jitter to the reference signal Fc. When the device "d" is used, "single" is described in explanation of the graphs.

Device "e"

The idle tone dispersion device 1 according to the fourth embodiment shown in FIG. 7 was used. The number of FDSMs 20 disposed in parallel was set to eight. Measured signals, all of which had different phases, were input to the eight FDSMs 20. Each of the measured signals input to the eight FDSMs 20 was delayed by $\frac{1}{260}M \times \frac{1}{8}$ [second]. When the device "e" is used, "equally divided 8 parallel" and "common" are described in explanation of the graphs.

Experiment 1

The device "a" was used, common jitter was given to the reference signal, and jitter was given to the measured signal independently for each of the FDSMs 20.

The magnitude of the jitter given to the reference signal was set to "10 picoseconds" and the magnitude of the jitter given to the measured signal was set to "10 picoseconds" (an example).

The jitter given to the reference signal and the jitter given to the measured signal respectively include frequency components that have a maximum of 130 MHz and are equal to or less than 130 MHz.

In this case, an upper limit value of a measurement band is set to 130 MHz or less. Consequently, the frequency of a target idle tone among idle tones of the frequency delta-sigma modulation signal output from the device "a" is less than 130 MHz. That is, the jitter given to the reference signal and the jitter given to the measured signal respectively include frequency components higher than the frequency of the idle tone.

Figure 12:
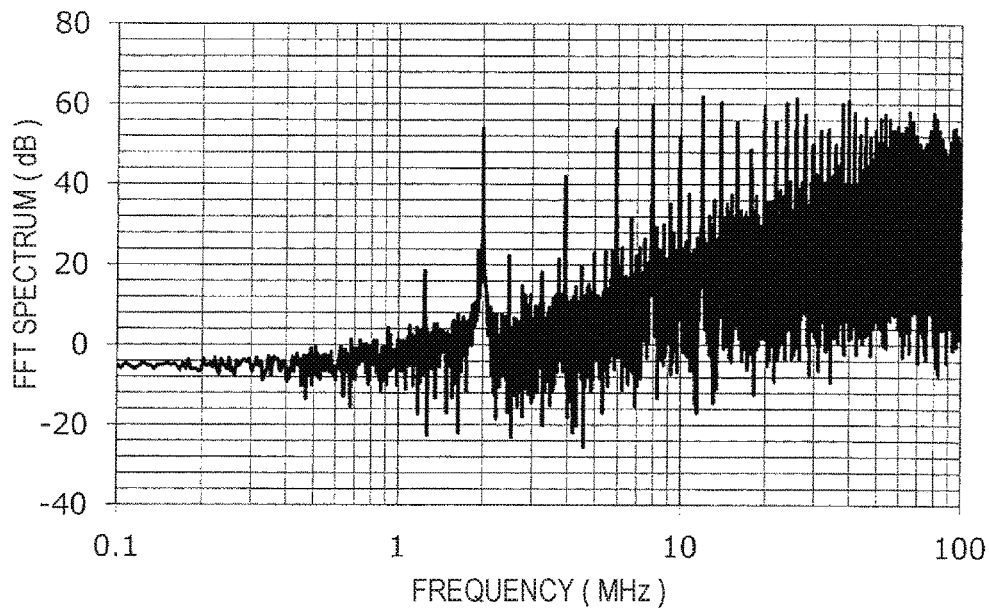
FIG. 12 is a graph showing an output spectrum of the idle tone dispersion device.
Figure 13:
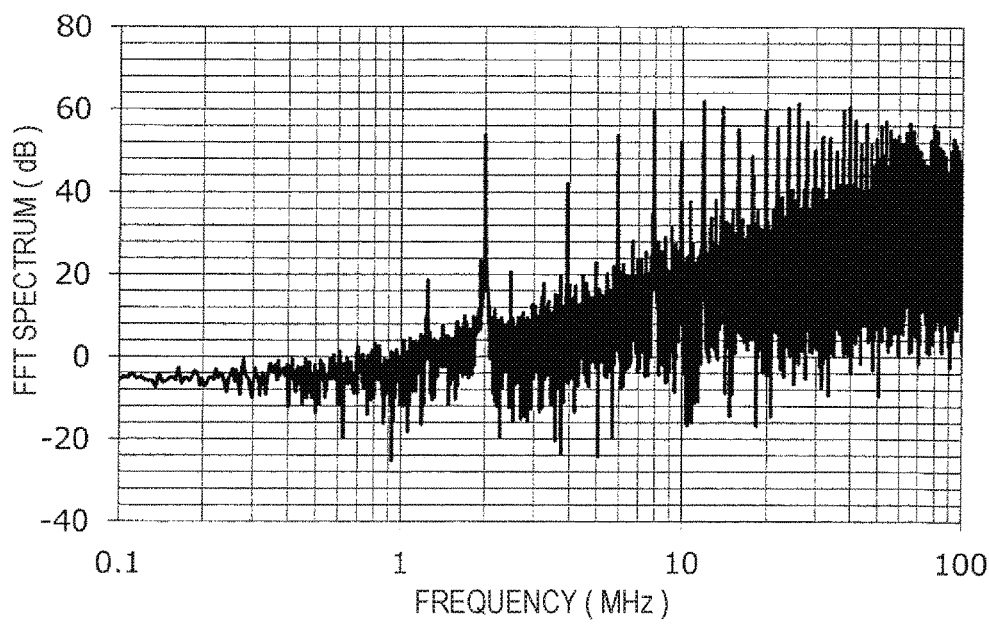
FIG. 13 is a graph showing an output spectrum of the idle tone dispersion device.
Figure 14:
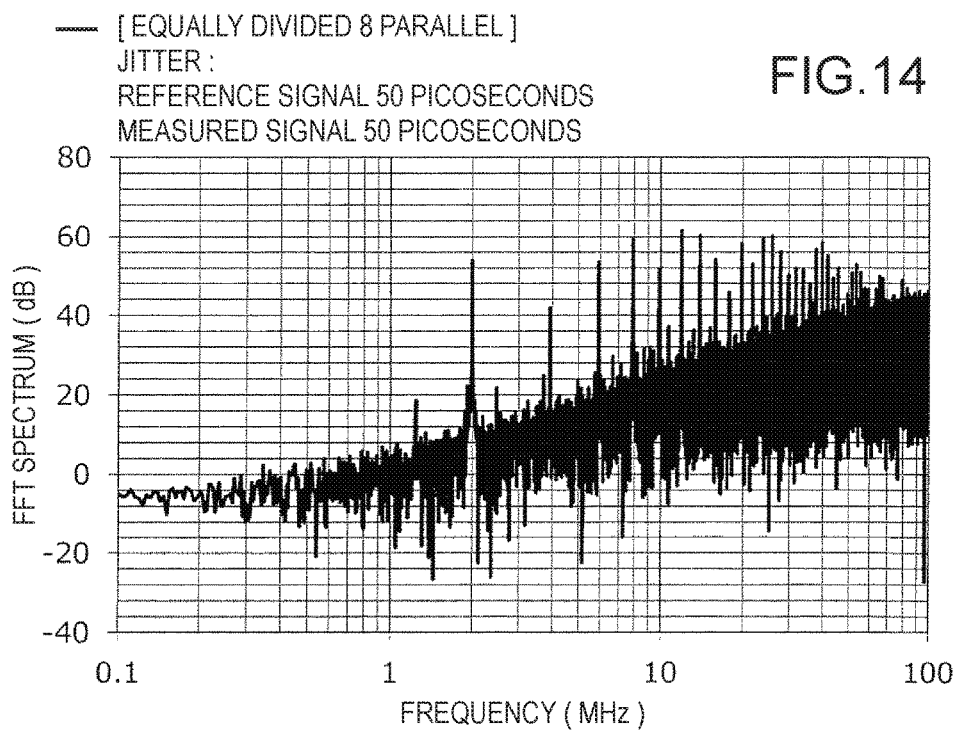
FIG. 14 is a graph showing an output spectrum of the idle tone dispersion device.

Concerning the frequency delta-sigma modulation signal output from the idle tone dispersion device, the intensity of frequency components included in the frequency delta-sigma modulation signal was calculated. A graph of an output spectrum of the idle tone dispersion device was created. A result of this example of the experiment is shown in FIG. 12.

As another example, the magnitude of the jitter given to the reference signal and the magnitude of the jitter given to the measured signal were set to "20 picoseconds (the reference signal) and 20 picoseconds (the measured signal)", "50 picoseconds and 50 picoseconds", "100 picoseconds and 100 picoseconds", "200 picoseconds and 200 picoseconds", "500 picoseconds and 500 picoseconds", "1000 picoseconds and 1000 picoseconds", and "2000 picoseconds and 2000 picoseconds". Graphs of an output spectrum of the idle tone dispersion device were created. A result of this example of the experiment is shown in FIGS. 13 to 19.

As a comparative example, in the device "a", a simulation was performed concerning a case in which jitter was not included in the reference signal and the measured signal (the magnitude of jitter was 0 picosecond). A graph of an output spectrum of the idle tone dispersion device was created. A result of this example of the experiment is shown in FIG. 11.

Figure 20:
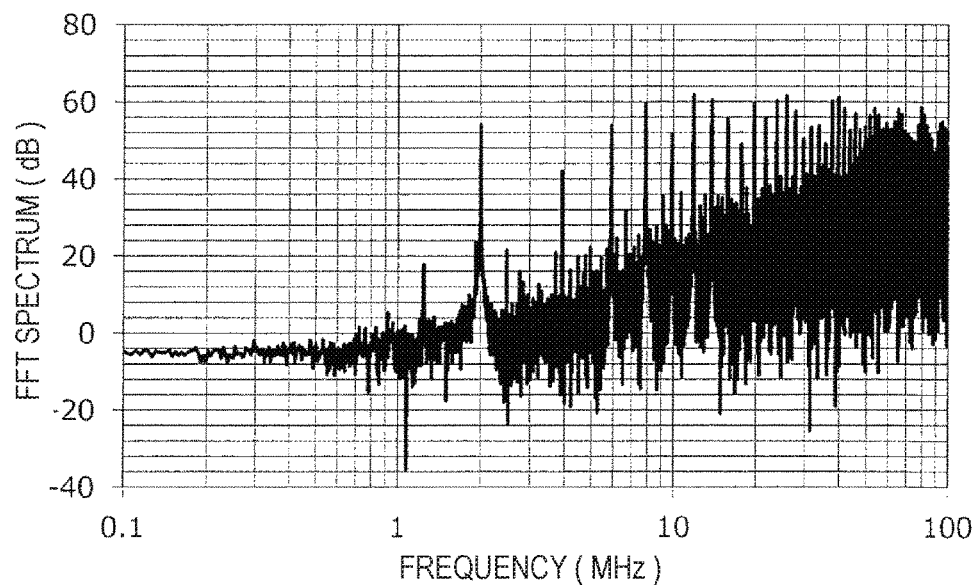
FIG. 20 is a graph showing an output spectrum of the idle tone dispersion device.
Figure 21:
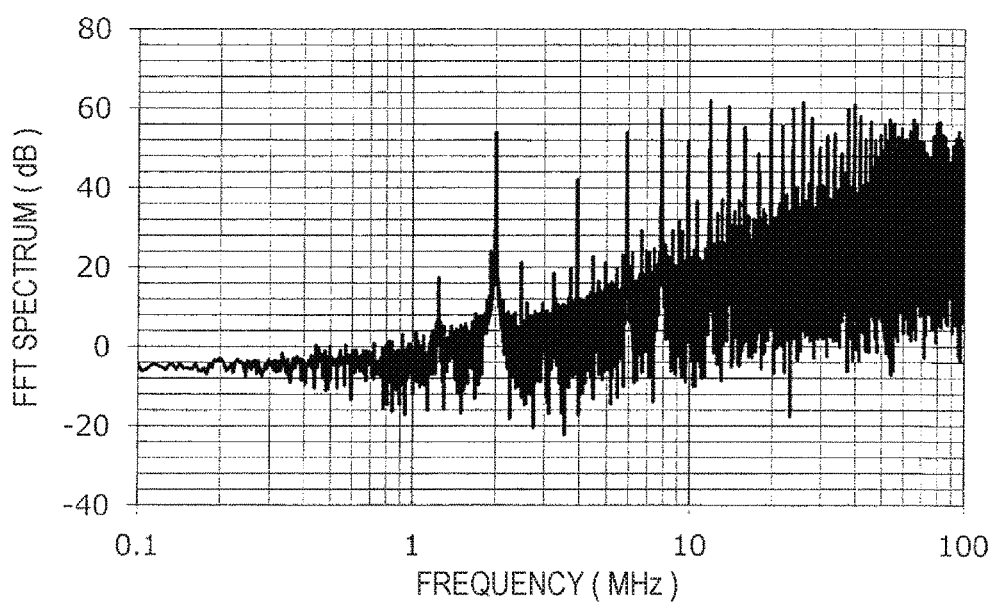
FIG. 21 is a graph showing an output spectrum of the idle tone dispersion device.
Figure 24:
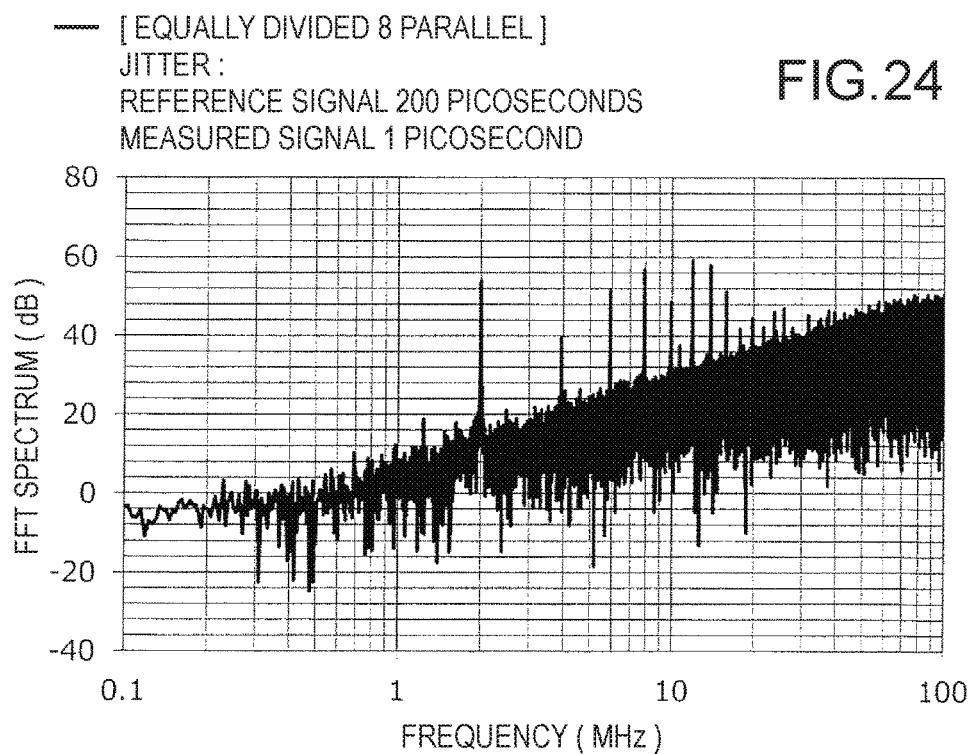
FIG. 24 is a graph showing an output spectrum of the idle tone dispersion device.
Figure 25:
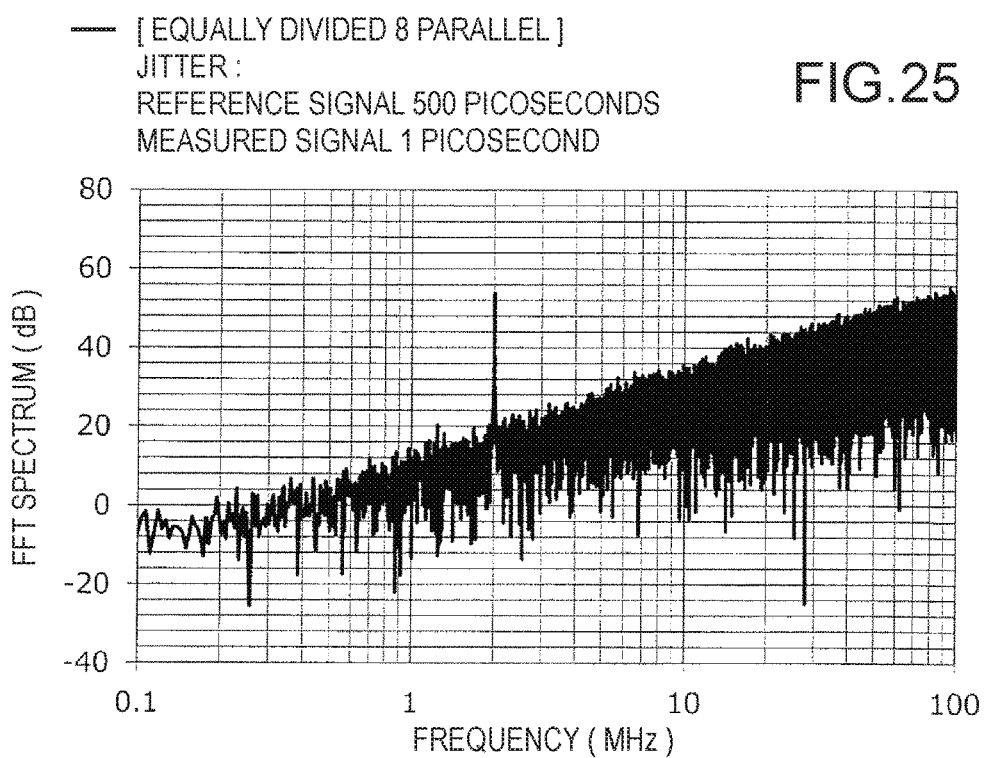
FIG. 25 is a graph showing an output spectrum of the idle tone dispersion device.
Figure 28:
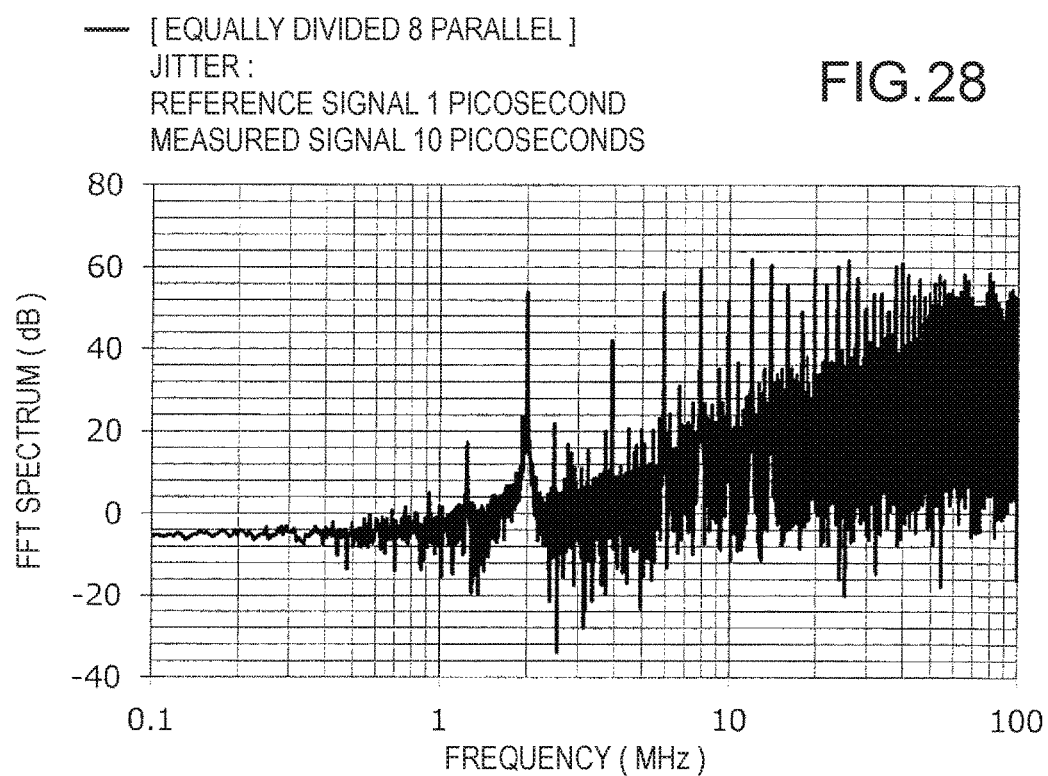
FIG. 28 is a graph showing an output spectrum of the idle tone dispersion device.
Figure 29:
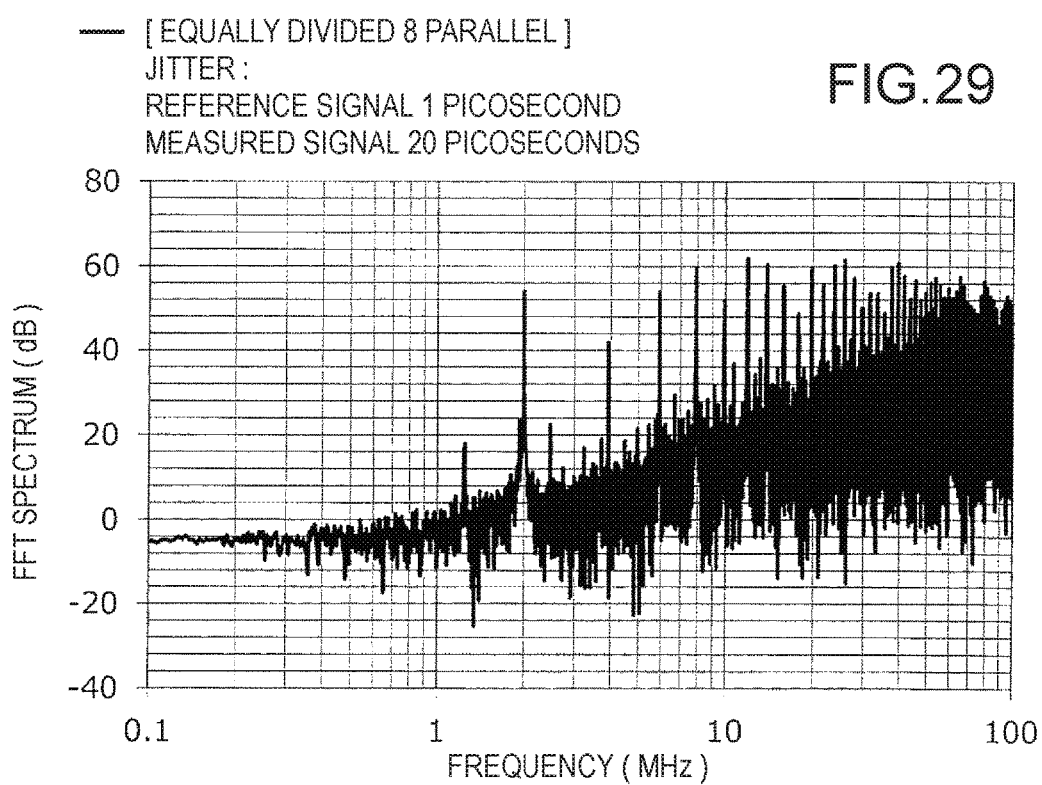
FIG. 29 is a graph showing an output spectrum of the idle tone dispersion device.
Figure 32:
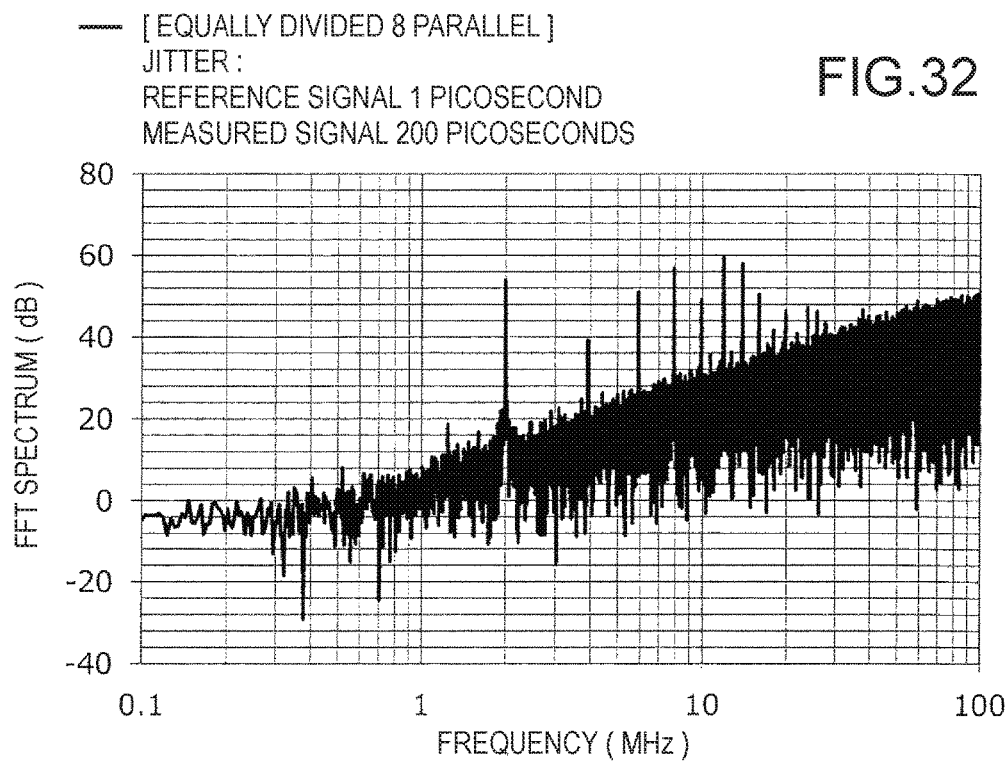
FIG. 32 is a graph showing an output spectrum of the idle tone dispersion device.
Figure 78:
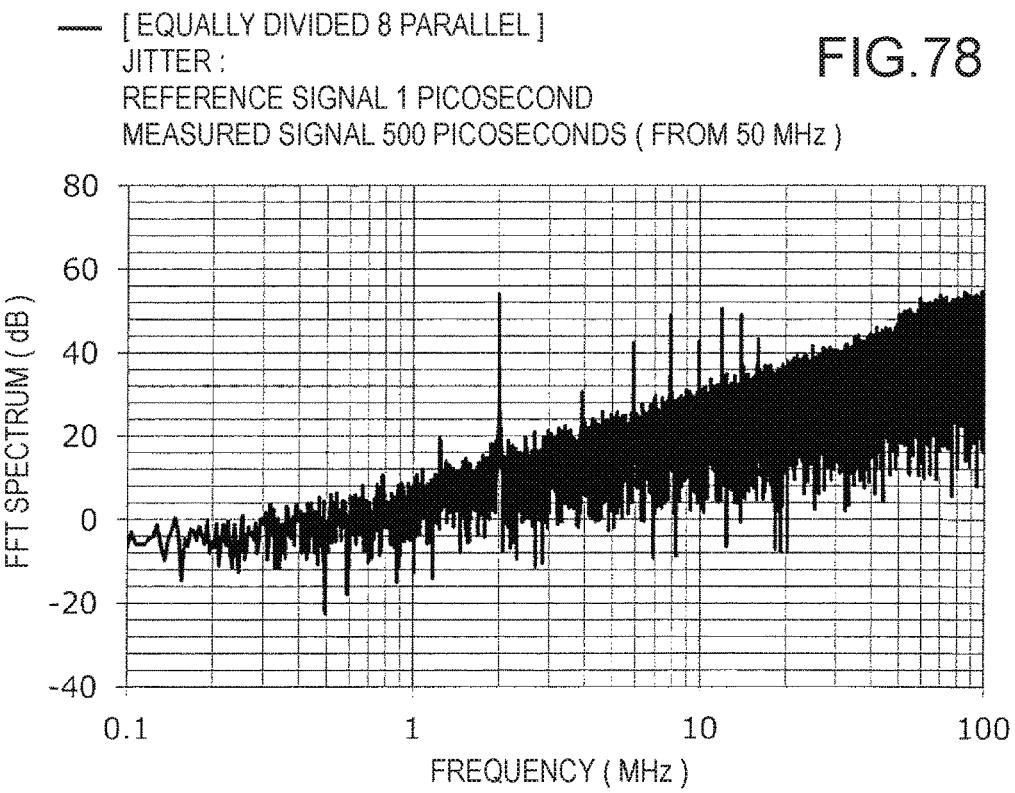
FIG. 78 is a graph showing an output spectrum of the idle tone dispersion device.

The horizontal axis of the graphs indicates a frequency component (a frequency) calculated by performing fast Fourier transform (FFT). The vertical axis of the graphs indicates intensity (an FFT spectrum) (the same applies to FIGS. 20 to 78).

In the graphs, a frequency component of 2 MHz is a detection target frequency. A peak of 2 MHz is more desirably higher with respect to other portions, that is, peaks other than 2 MHz and a base portion (base noise). A difference between the peak of 2 MHz and the other portions, for example, a difference between the peak of 2 MHz and a maximum peak among the peaks other than 2 MHz in the measurement band corresponds to an SN ratio. On the other hand, the peaks other than 2 MHz respectively can be idle tones (noise). However, only the peaks other than 2 MHz in the measurement band are idle tones. Peaks outside the measurement band are not set as targets.

From a result of this experiment, it is seen that, when the reference signal and the measured signal include jitter, the influence of the idle tone is reduced compared with when the reference signal and the measured signal do not include jitter. It is also seen that an effect of reducing the influence of the idle tone (an idle tone reduction effect) is different according to the magnitude of the jitter.

Figure 15:
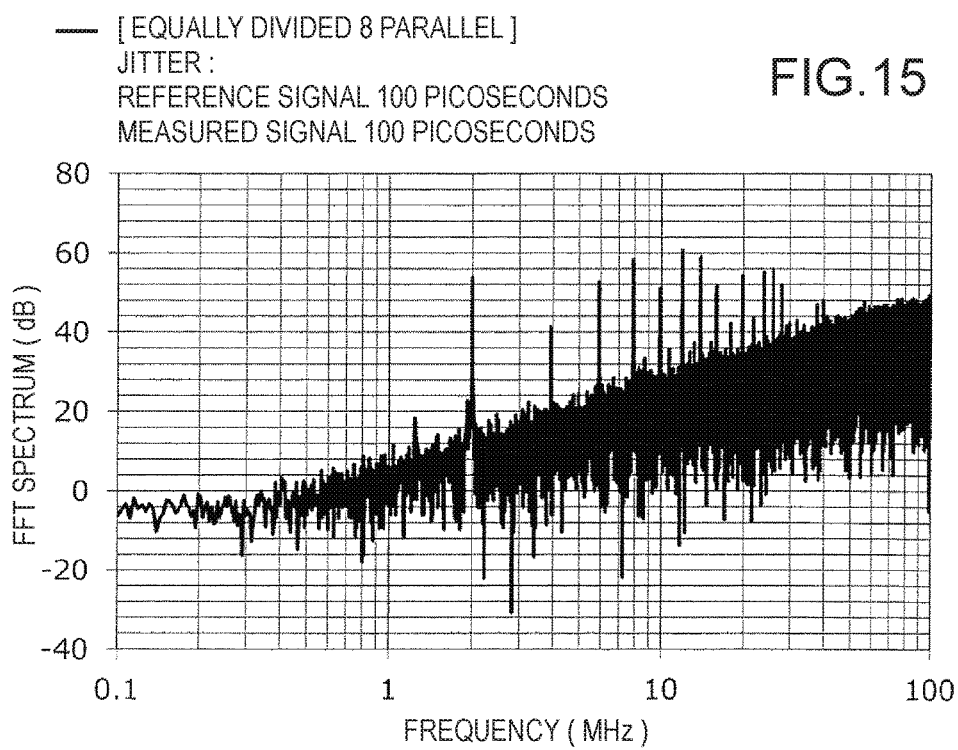
FIG. 15 is a graph showing an output spectrum of the idle tone dispersion device.
Figure 18:
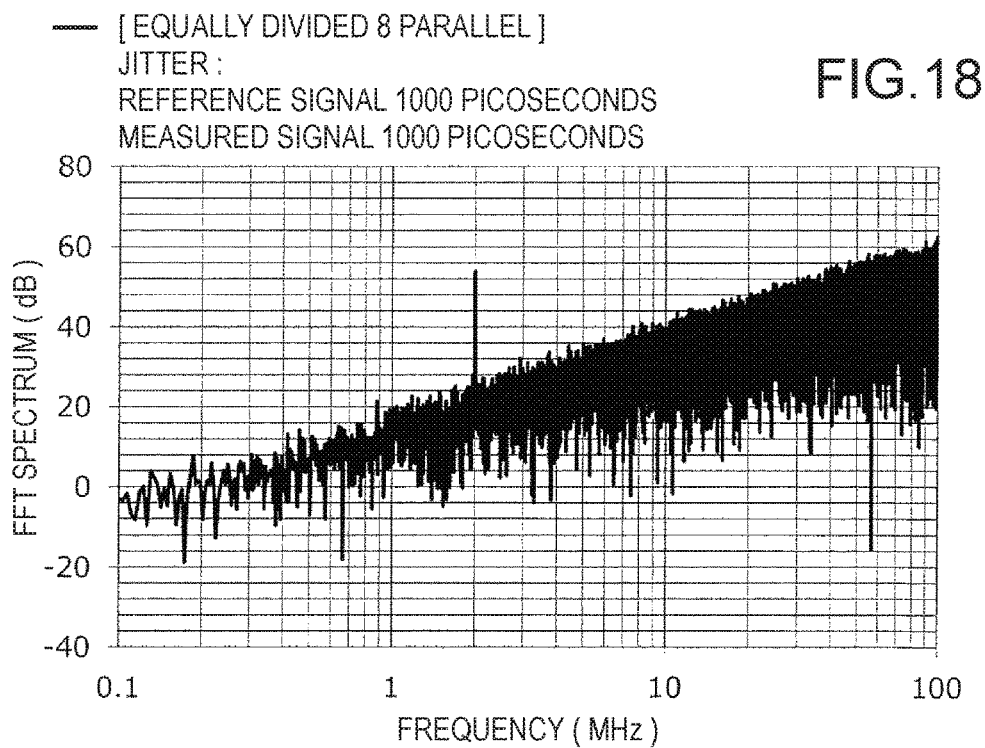
FIG. 18 is a graph showing an output spectrum of the idle tone dispersion device.
Figure 19:
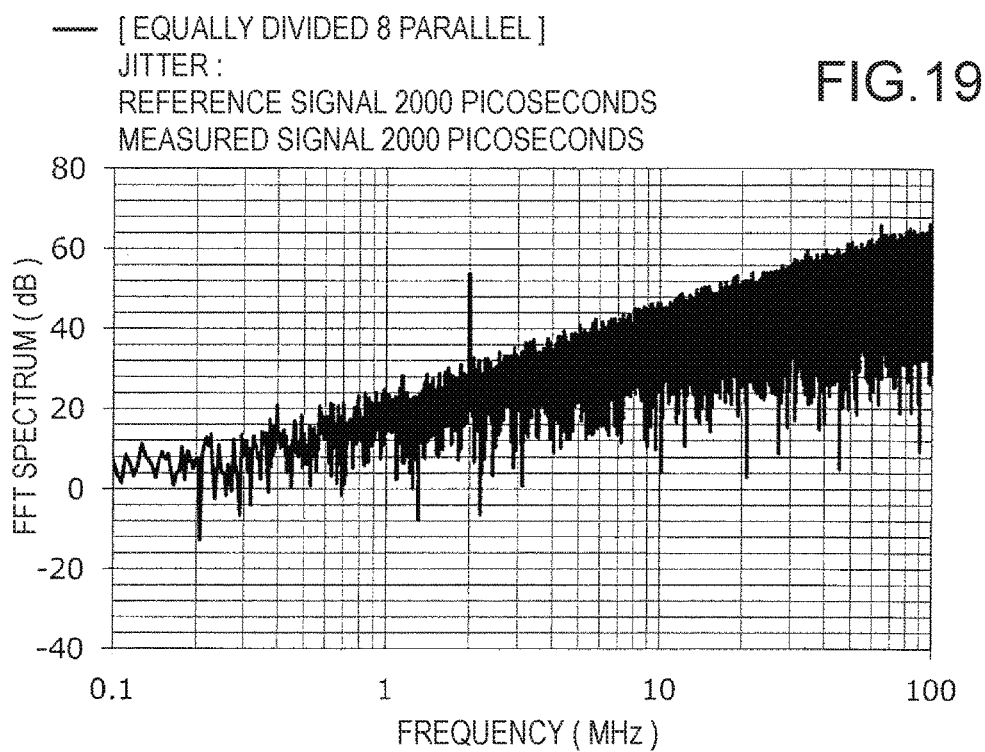
FIG. 19 is a graph showing an output spectrum of the idle tone dispersion device.

For example, a graph shown in FIG. 15 created when the reference signal and the measured signal include jitter of 100 picoseconds and a graph shown in FIG. 11 created when the reference signal and the measured signal do not include jitter are compared. Then, it is seen that, when the reference signal and the measured signal include the jitter of 100 picoseconds, a peak indicating an idle tone is low and, in particular, the influence of the idle tone is reduced at a frequency of 3 MHz or less.

Among the examples, an effect is the lowest when the reference signal and the measured signal include the jitter of 10 picoseconds. A graph shown in FIG. 12 created when the reference signal and the measured signal include jitter of 10 picoseconds and the graph shown in FIG. 11 created when the reference signal and the measured signal do not include jitter are compared. Then, it is also seen that the influence of the idle tone is reduced, in particular, when the frequency is 1 MHz or less.

In this example, it is seen that, for example, when an upper limit value of the measurement band is set to approximately 3 MHz, as shown in FIGS. 15 and 16, the magnitude of the jitter is desirably approximately 100 picoseconds or more and 200 picoseconds or less. This is because, when the magnitude of the jitter is 100 picoseconds and 200 picoseconds, at a frequency of 3 MHz or less, the peak indicating the idle tone is low and the intensity of the base portion is also reduced. It is seen that, when the upper limit value of the measurement band is set to 10 MHz, as shown in FIG. 17, the magnitude of the jitter is desirably approximately 500 picoseconds. This is because, when the magnitude of the jitter is 500 picoseconds, at a frequency of 10 MHz or less, the peak indicating the idle tone is low and the intensity of the base portion is also reduced.

Experiment 2

In the example of the experiment 1, the magnitude of the jitter given to the measured signal was fixed to "1 picosecond" and the magnitude of the jitter given to the reference signal was set to "10 picoseconds", "20 picoseconds", "50 picoseconds", "100 picoseconds", "200 picoseconds", "500 picoseconds", "1000 picoseconds", and "2000 picoseconds" (an example). Graphs of an output spectrum of the idle tone dispersion device were created. A result of this example of the experiment is shown in FIGS. 20 to 27.

From this result, it is seen that the idle tone is also reduced by adjusting the magnitude of the jitter of only the reference signal.

Note that the measured signal did not include jitter (the magnitude of jitter was 0 picosecond), the magnitude of jitter given to the reference signal was set to "10 picoseconds", "20 picoseconds", "50 picoseconds", "100 picoseconds", "200 picoseconds", "500 picoseconds", "1000 picoseconds", and "2000 picoseconds" (an example), a simulation was performed, and a graph of an output spectrum of the idle tone dispersion device was created. Then, substantially the same result as the result obtained when the magnitude of the jitter of the measured signal was 1 picosecond was obtained. Consequently, it is seen that the idle tone is also reduced when only the reference signal includes jitter.

Experiment 3

In the example of the experiment 1, the magnitude of the jitter given to the reference signal was fixed to "1 picosecond" and the magnitude of the jitter given to the measured signal was set to "10 picoseconds", "20 picoseconds", "50 picoseconds", "100 picoseconds", "200 picoseconds", "500 picoseconds", "1000 picoseconds", and "2000 picoseconds" (an example). Graphs of an output spectrum of the idle tone dispersion device were created. A result of this example of the experiment is shown in FIGS. 28 to 35.

From this result, it is seen that the idle tone is also reduced by adjusting the magnitude of the jitter of only the measured signal.

Note that the reference signal did not include jitter (the magnitude of jitter was 0 picosecond), the magnitude of jitter given to the measured signal was set to "10 picoseconds", "20 picoseconds", "50 picoseconds", "100 picoseconds", "200 picoseconds", "500 picoseconds", "1000 picoseconds", and "2000 picoseconds" (an example), a simulation was performed, and a graph of an output spectrum of the idle tone dispersion device was created. Then, substantially the same result as the result obtained when the magnitude of the jitter of the reference signal was 1 picosecond was obtained. Consequently, it is seen that the idle tone is also reduced when only the measured signal includes jitter.

The graphs shown in FIGS. 28 to 35 of the experiment 3 and the graphs shown in FIGS. 12 to 19 of the experiment 1 corresponding to each other are compared. Then, it is seen that the intensity of the base portion is higher in the example of the experiment 1. Similarly, it is seen that the intensity of the base portion is higher in the example of the experiment 1 than the example of the experiment 2.

This corresponds to the fact that, when the magnitude of jitter is the same, compared with when jitter is given to only either one of the reference signal and the measured signal, energy of noise input to a system is large when jitter is given to both of the reference signal and the measured signal.

Experiment 4

The device "b" was used, common jitter was given to the reference signal, and jitter was given to the measured signal independently for each of the FDSMs 20.

The magnitude of the jitter given to the reference signal was set to "1 picosecond" and the magnitude of the jitter given to the measured signal was set to "10 picoseconds" (an example).

As in the example of the experiment 1, the jitter given to the reference signal and the jitter given to the measured signal respectively include frequency components that have a maximum of 130 MHz and are equal to or less than 130 MHz. That is, the jitter given to the reference signal and the jitter given to the measured signal include frequency components higher than the frequency of the idle tone.

Figure 37:
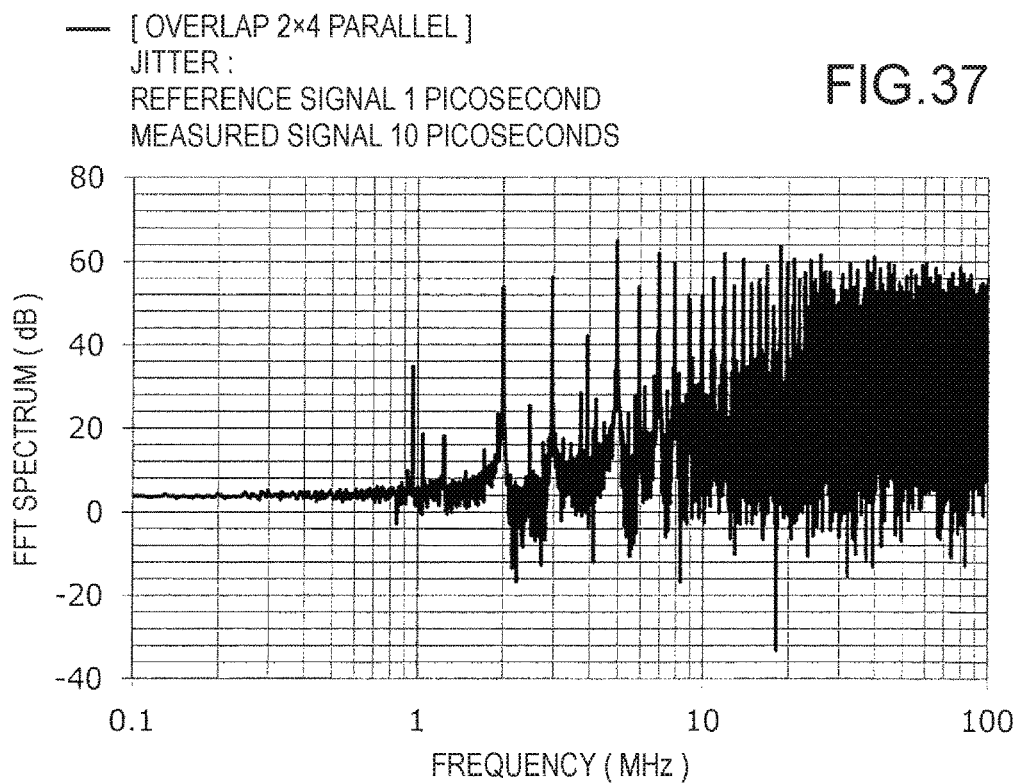
FIG. 37 is a graph showing an output spectrum of the idle tone dispersion device.
Figure 40:
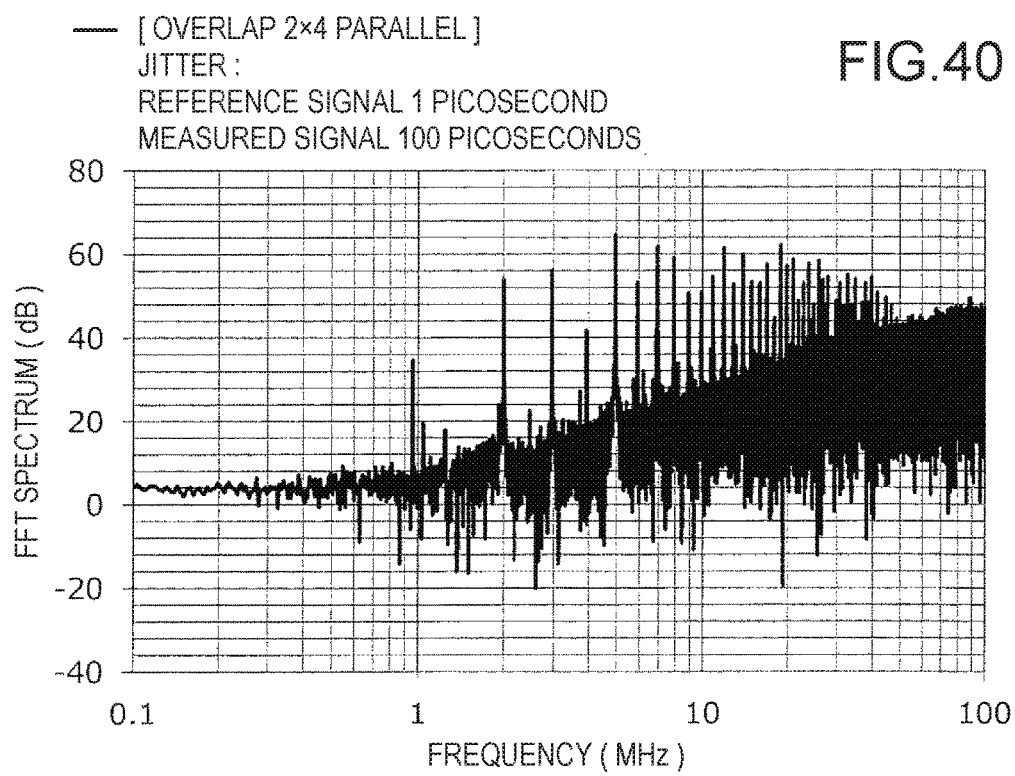
FIG. 40 is a graph showing an output spectrum of the idle tone dispersion device.
Figure 41:
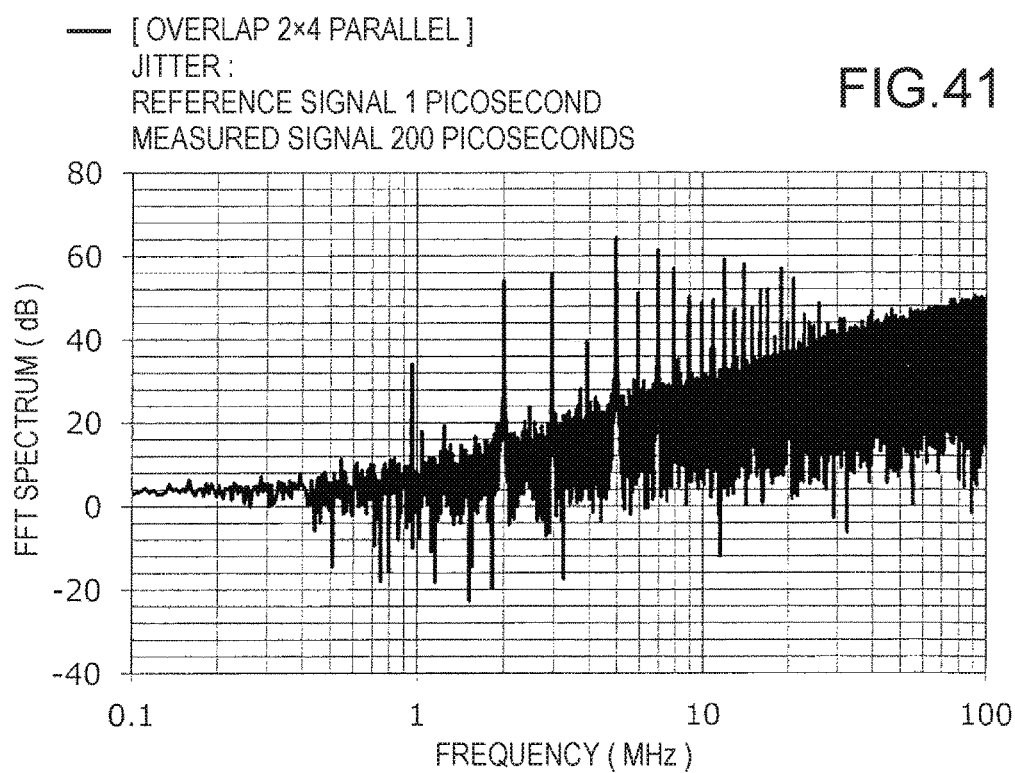
FIG. 41 is a graph showing an output spectrum of the idle tone dispersion device.
Figure 42:
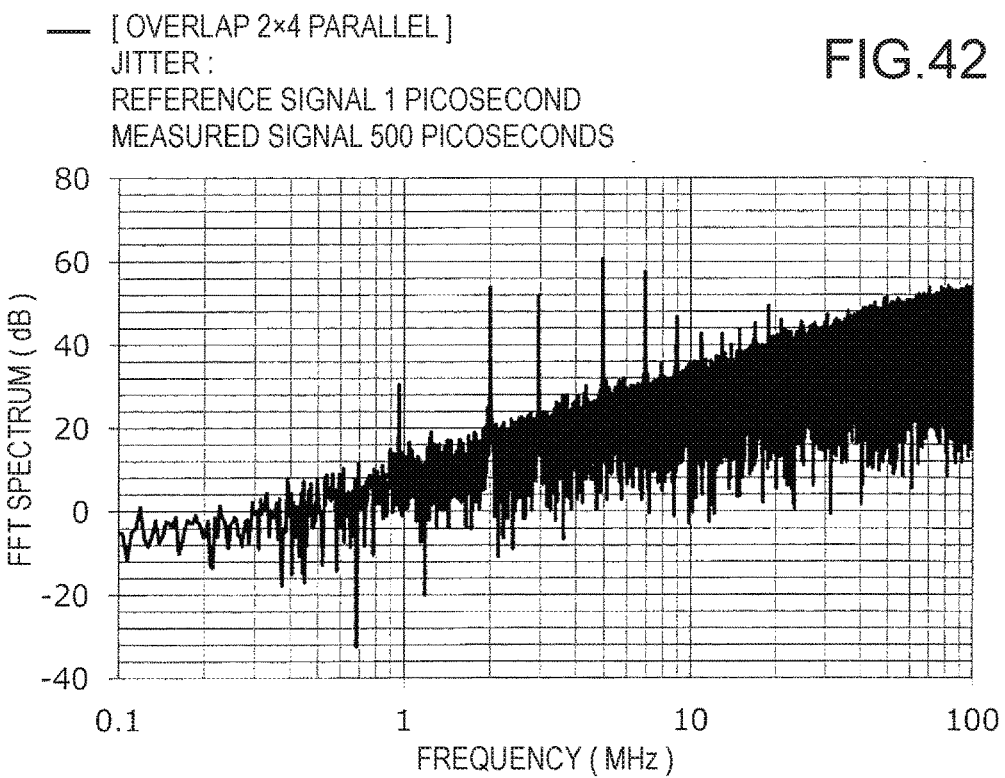
FIG. 42 is a graph showing an output spectrum of the idle tone dispersion device.

Concerning a frequency delta-sigma modulation signal output from the idle tone dispersion device, the intensity of frequency components included in the frequency delta-sigma modulation signal was calculated and a graph of an output spectrum of the idle tone dispersion device was created. A result of this example of the experiment is shown in FIG. 37.

As another example, the magnitude of the jitter given to the reference signal was fixed to "1 picosecond" and the magnitude of the jitter given to the measured signal was set to "20 picoseconds (the reference signal), "50 picoseconds", "100 picoseconds", "200 picoseconds", "500 picoseconds", "1000 picoseconds", and "2000 picoseconds". Graphs of an output spectrum of the idle tone dispersion device were created. A result of this example of the experiment is shown in FIGS. 38 to 44.

Figure 36:
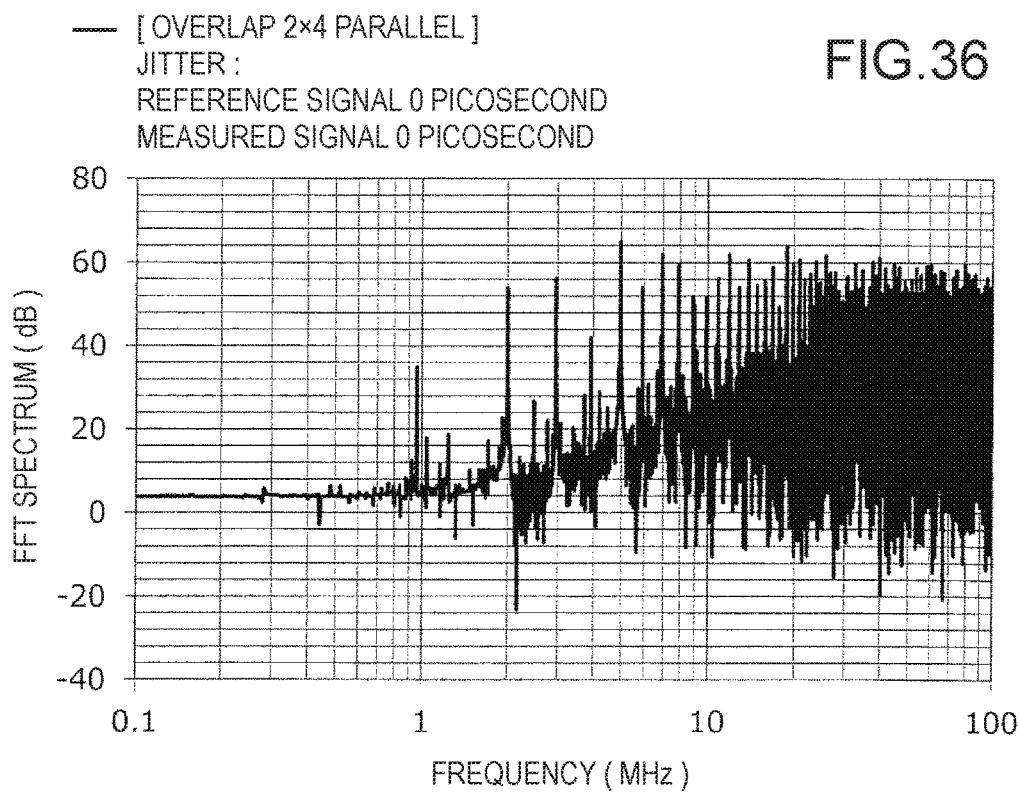
FIG. 36 is a graph showing an output spectrum of the idle tone dispersion device.

As a comparative example, in the device "b", a simulation was performed concerning a case in which jitter was not included in the reference signal and the measured signal (the magnitude of jitter was 0 picosecond). A graph of an output spectrum of the idle tone dispersion device was created. A result of this example of the experiment is shown in FIG. 36.

From a result of this experiment, it is seen that, even when there is a set of the FDSMs 20 to which measured signals having the same phase are input, the influence of the idle tone is reduced when the reference signal and the measured signal include jitter compared with when the reference signal and the measured signal do not include jitter.

Note that the reference signal did not include jitter (the magnitude of jitter was 0 picosecond), the magnitude of jitter given to the measured signal was set to "10 picoseconds", "20 picoseconds", "50 picoseconds", "100 picoseconds", "200 picoseconds", "500 picoseconds", "1000 picoseconds", and "2000 picoseconds" (an example), a simulation was performed, and a graph of an output spectrum of the idle tone dispersion device was created. Then, substantially the same result as the result obtained when the magnitude of the jitter of the reference signal was 1 picosecond was obtained. Consequently, it is seen that the idle tone is also reduced when only the measured signal includes jitter.

Figure 43:
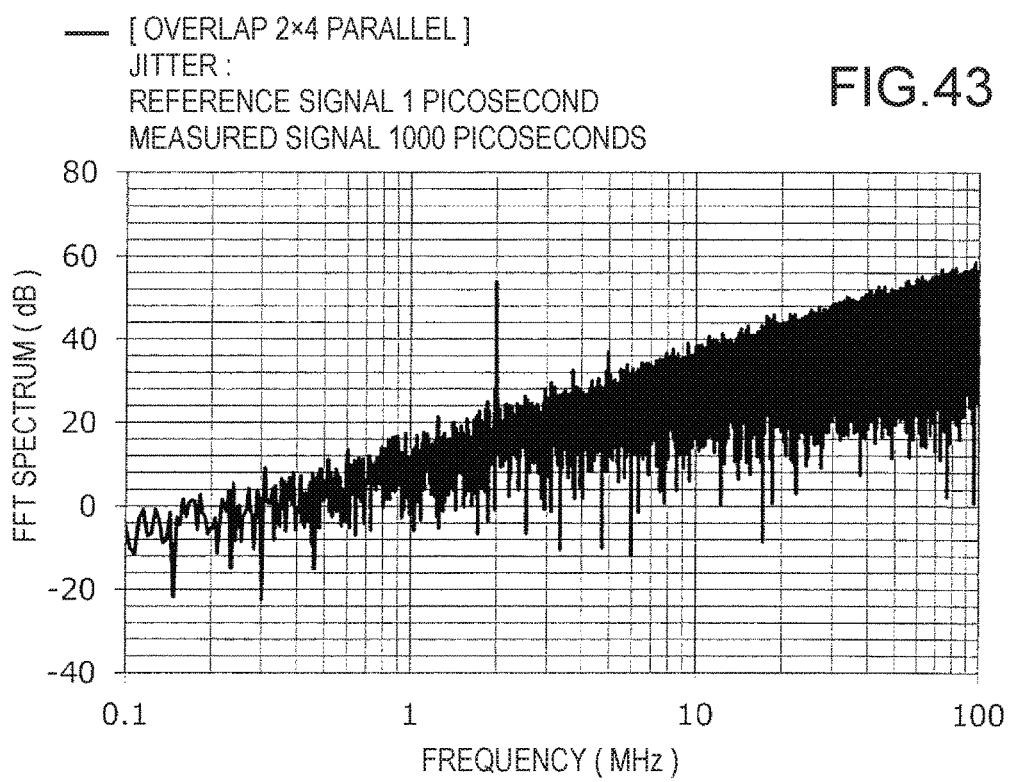
FIG. 43 is a graph showing an output spectrum of the idle tone dispersion device.
Figure 44:
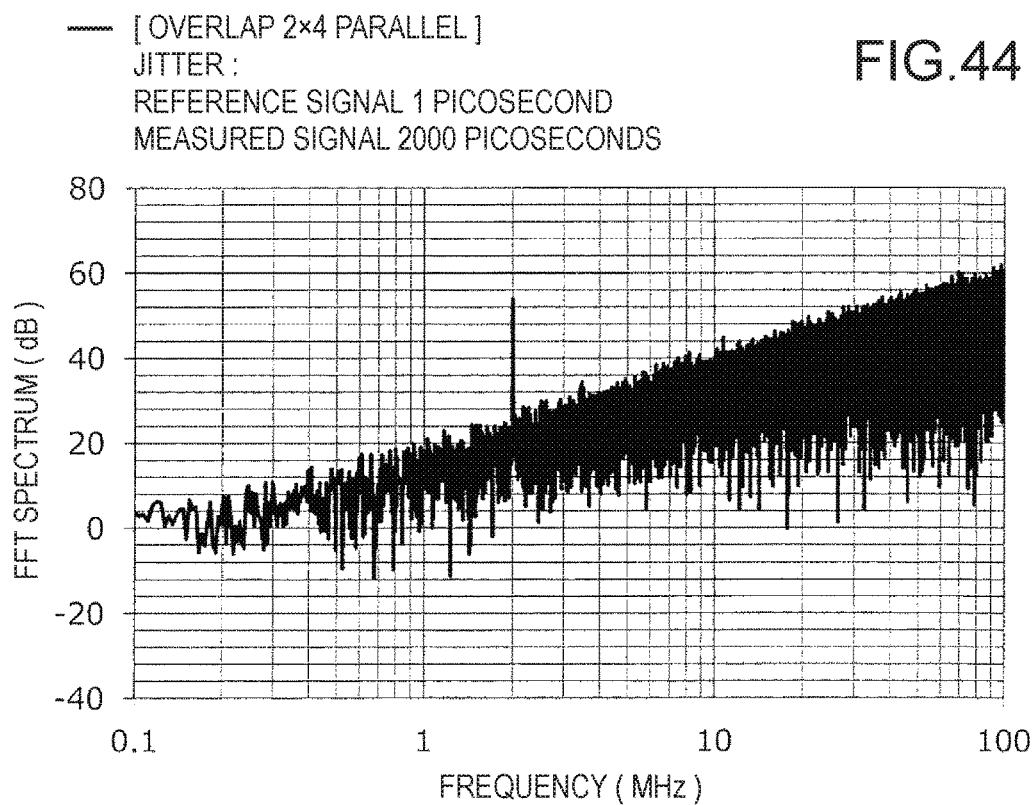
FIG. 44 is a graph showing an output spectrum of the idle tone dispersion device.

When the upper limit value of the measurement band is set to 10 MHz, in the example of the experiment 1, as explained above, an optimum value of the magnitude of jitter is approximately 500 picoseconds. However, in the example of the experiment 4, as shown in FIG. 43, the optimum value of the magnitude of jitter is approximately 1000 picoseconds. The optimum value is approximately twice as large as the optimum value in the example of the experiment 1.

Experiment 5

The device "c" was used, common jitter was given to the reference signal, and jitter was given to the measured signal independently for each of the FDSMs 20.

The magnitude of the jitter given to the reference signal was set to "1 picosecond" and the magnitude of the jitter given to the measured signal was set to "10 picoseconds" (an example).

As in the example of the experiment 1, the jitter given to the reference signal and the jitter given to the measured signal respectively include frequency components that have a maximum of 130 MHz and are equal to or less than 130 MHz. That is, the jitter given to the reference signal and the jitter given to the measured signal include frequency components higher than the frequency of the idle tone.

Concerning a frequency delta-sigma modulation signal output from the idle tone dispersion device, the intensity of frequency components included in the frequency delta-sigma modulation signal was calculated and a graph of an output spectrum of the idle tone dispersion device was created. A result of this example of the experiment is shown in FIG. 46.

As another example, the magnitude of the jitter given to the reference signal was fixed to "1 picosecond" and the magnitude of the jitter given to the measured signal was set to "20 picoseconds, "50 picoseconds", "100 picoseconds", "200 picoseconds", "500 picoseconds", "1000 picoseconds", "2000 picoseconds", and "3600 picoseconds". Graphs of an output spectrum of the idle tone dispersion device were created. A result of this example of the experiment is shown in FIGS. 47 to 54.

Figure 45:
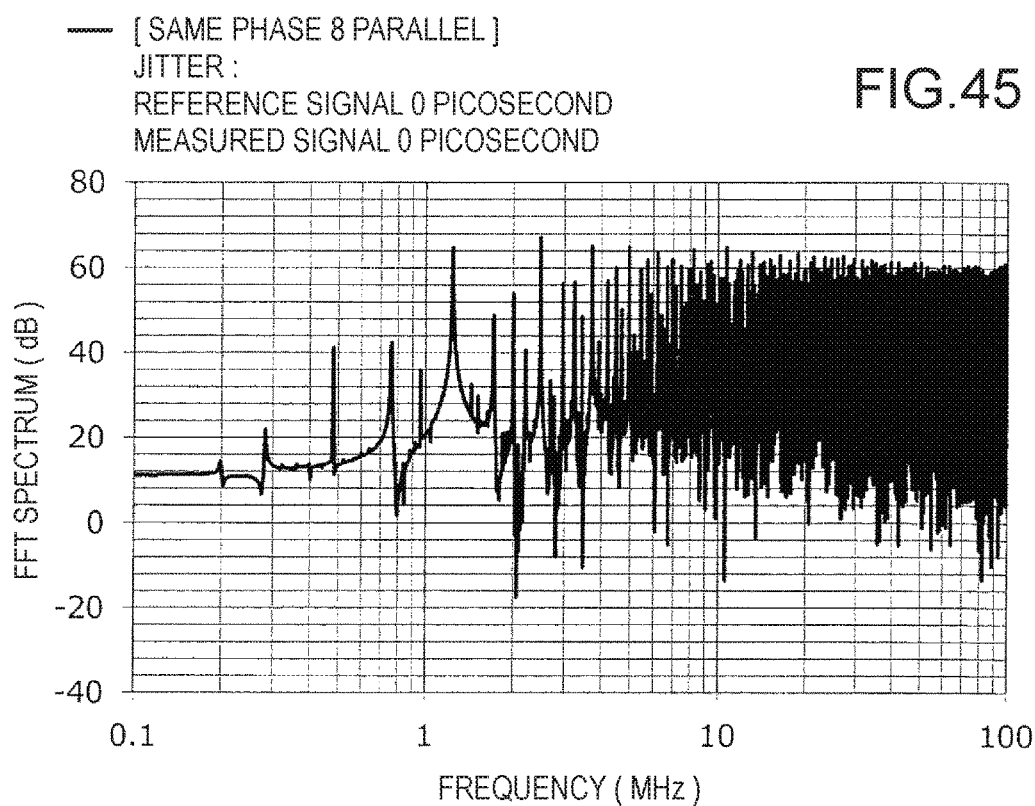
FIG. 45 is a graph showing an output spectrum of the idle tone dispersion device.
Figure 48:
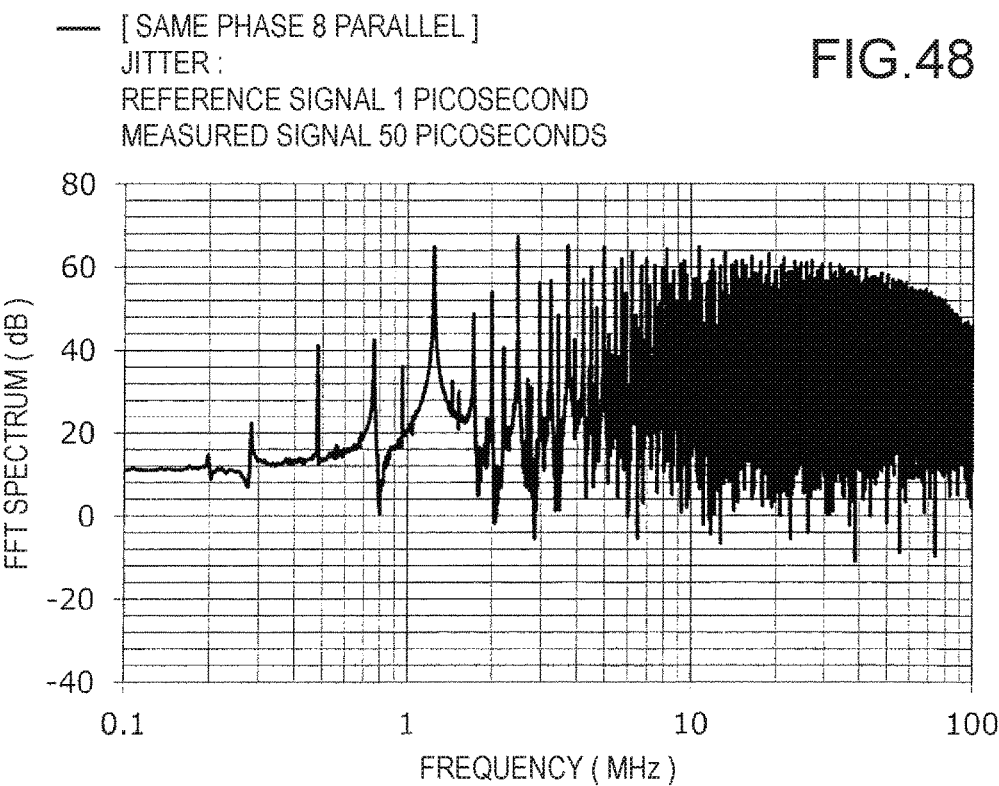
FIG. 48 is a graph showing an output spectrum of the idle tone dispersion device.
Figure 49:
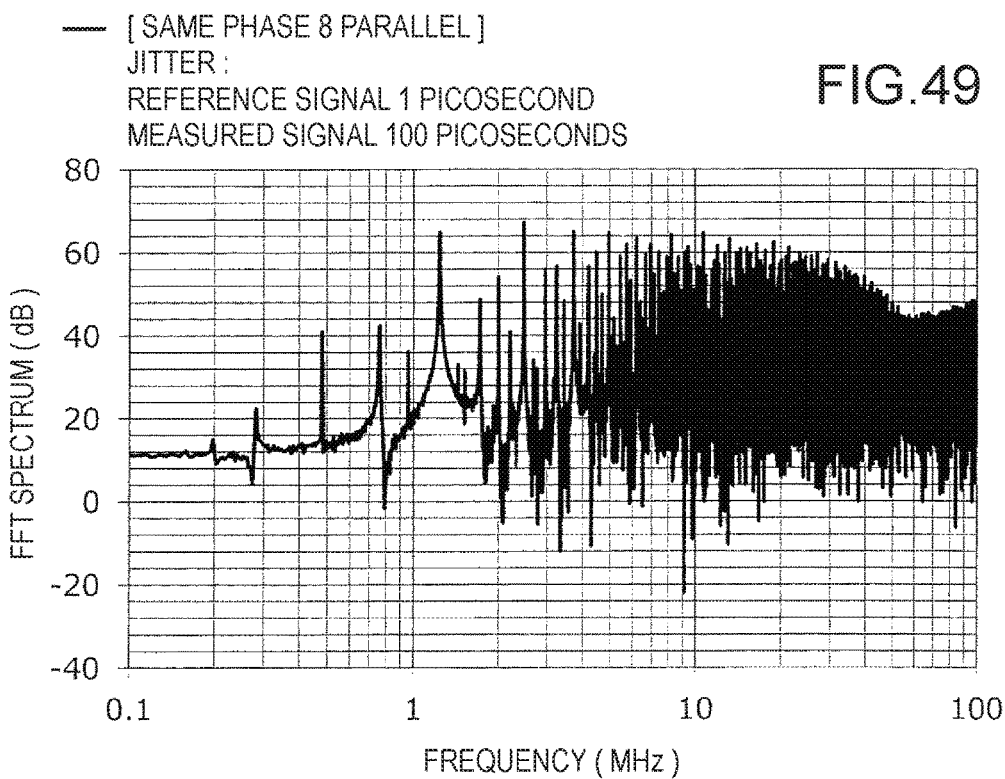
FIG. 49 is a graph showing an output spectrum of the idle tone dispersion device.
Figure 52:
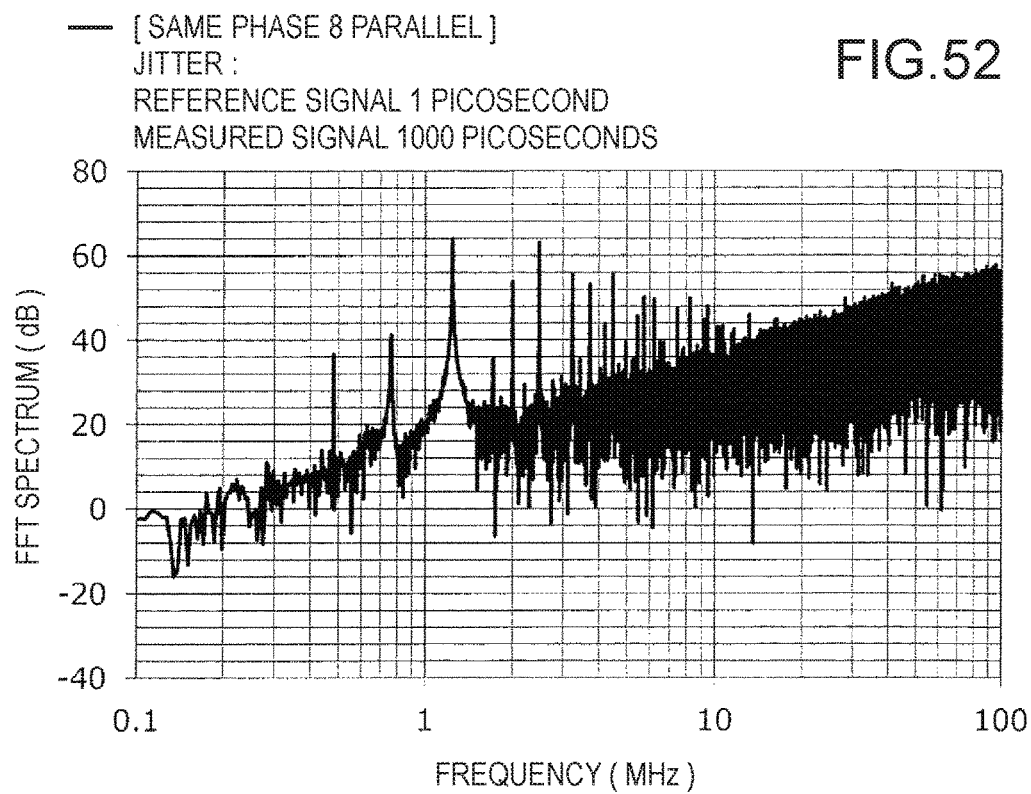
FIG. 52 is a graph showing an output spectrum of the idle tone dispersion device.

As a comparative example, in the device "c", a simulation was performed concerning a case in which jitter was not included in the reference signal and the measured signal (the magnitude of jitter was 0 picosecond). A graph of an output spectrum of the idle tone dispersion device was created. A result of this example of the experiment is shown in FIG. 45.

From a result of this experiment, it is seen that, even when measured signals having the same phase are input to all the FDSMs 20, the influence of the idle tone is reduced when the reference signal and the measured signal include jitter compared with when the reference signal and the measured signal do not include jitter.

Note that the reference signal did not include jitter (the magnitude of jitter was 0 picosecond), the magnitude of jitter given to the measured signal was set to "10 picoseconds", "20 picoseconds", "50 picoseconds", "100 picoseconds", "200 picoseconds", "500 picoseconds", "1000 picoseconds", "2000 picoseconds", and "3600 picoseconds" (an example), a simulation was performed, and a graph of an output spectrum of the idle tone dispersion device was created. Then, substantially the same result as the result obtained when the magnitude of the jitter of the reference signal was 1 picosecond was obtained. Consequently, it is seen that the idle tone is also reduced when only the measured signal includes jitter.

Figure 53:
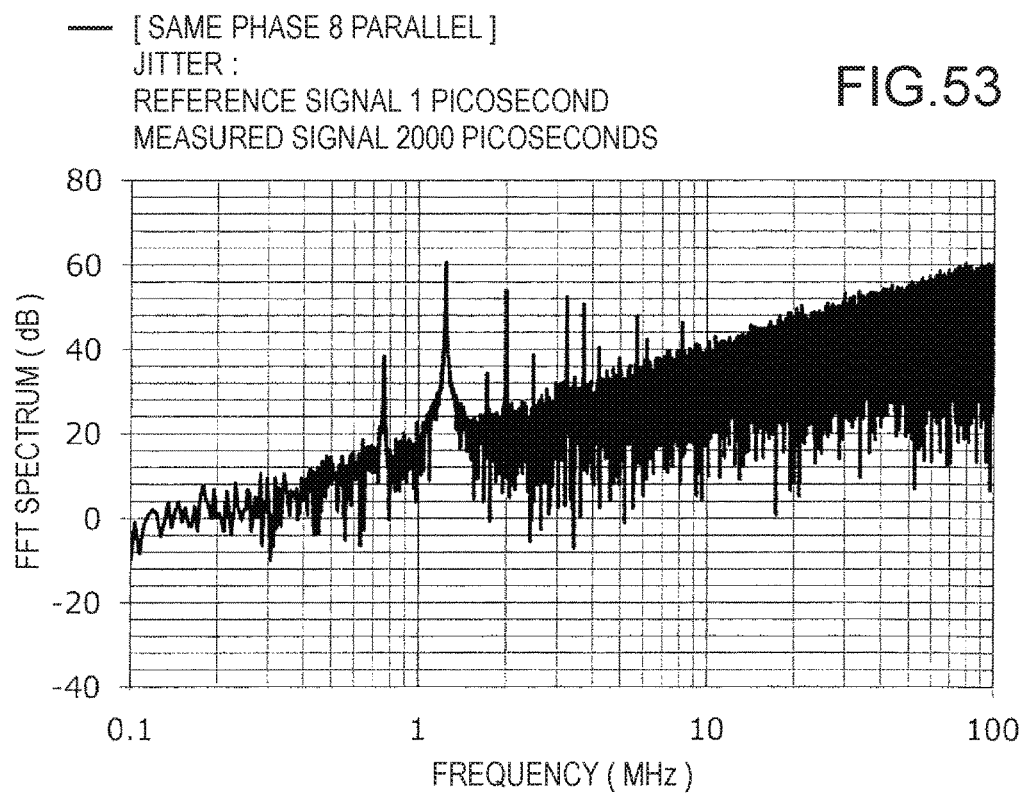
FIG. 53 is a graph showing an output spectrum of the idle tone dispersion device.

In this experiment, as shown in FIG. 53, even when the magnitude of the jitter was set to "2000 picoseconds", a peak (intensity) indicating an idle tone having a frequency less than 2 MHz exceeded a peak (intensity) of 2 MHz, which is a detection target frequency.

Figure 54:
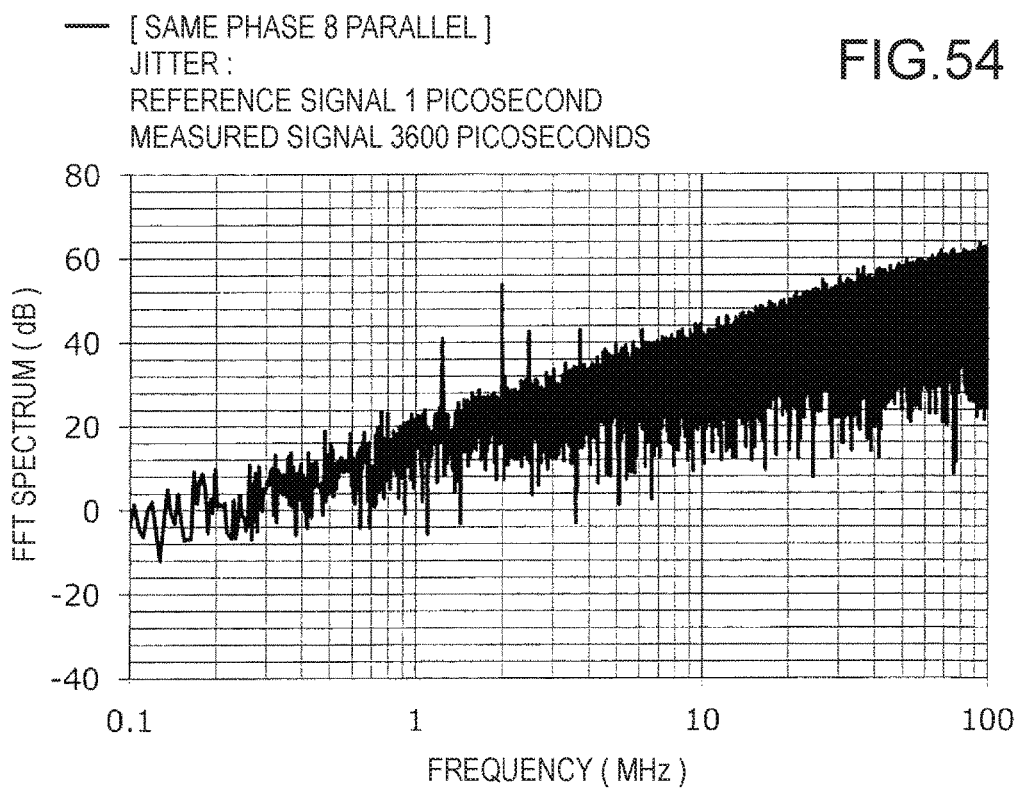
FIG. 54 is a graph showing an output spectrum of the idle tone dispersion device.

Then, as shown in FIG. 54, when the magnitude of the jitter was increased to "3600 picoseconds", the peak of 2 MHz exceeded the peak indicating the idle tone of the frequency less than 2 MHz.

Note that, since the frequency of the measured signal is 261.24 MHz±0.5 MHz, a theoretical limit of the magnitude of the jitter is approximately 3820 seconds, which is the inverse of the frequency.

Experiment 6

The device "d" was used and jitter was independently given to the reference signal and the measured signal.

The magnitude of the jitter given to the reference signal was set to "1 picosecond" and the magnitude of the jitter given to the measured signal was set to "10 picoseconds" (a comparative example).

As in the example of the experiment 1, the jitter given to the reference signal and the jitter given to the measured signal respectively include frequency components that have a maximum of 130 MHz and are equal to or less than 130 MHz. That is, the jitter given to the reference signal and the jitter given to the measured signal include frequency components higher than the frequency of the idle tone.

Concerning a frequency delta-sigma modulation signal output from the idle tone dispersion device, the intensity of frequency components included in the frequency delta-sigma modulation signal was calculated and a graph of an output spectrum of the idle tone dispersion device was created. A result of this example of the experiment is shown in FIG. 56.

Figure 55:
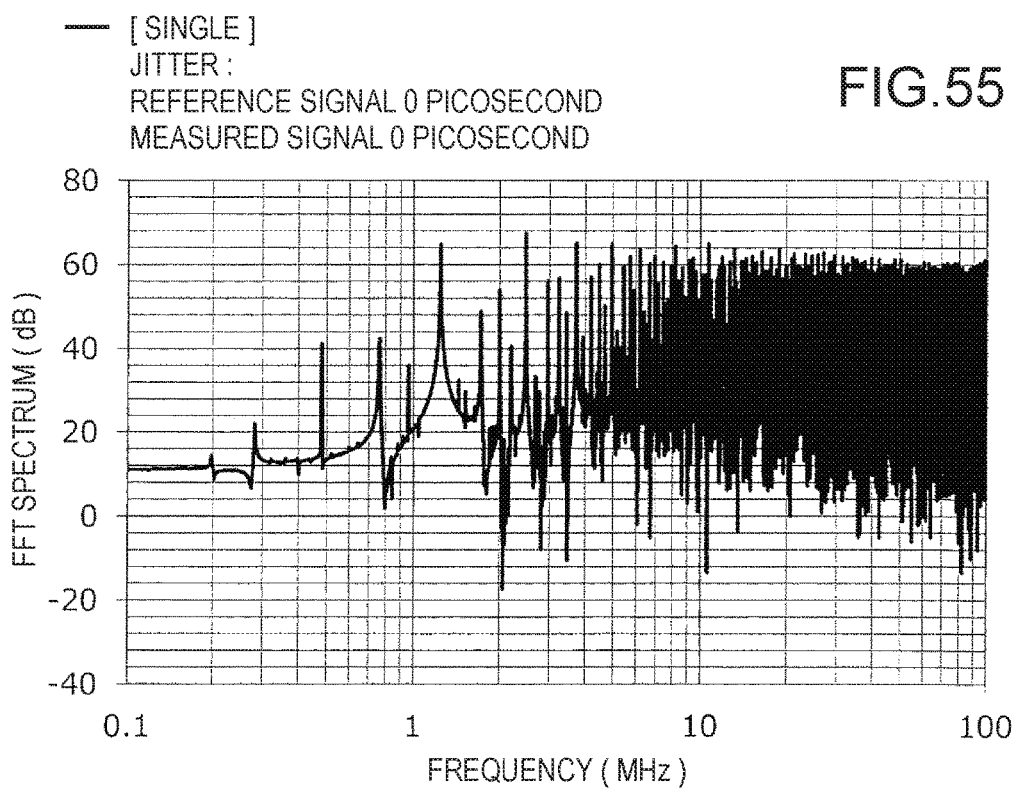
FIG. 55 is a graph showing an output spectrum of the idle tone dispersion device.
Figure 58:
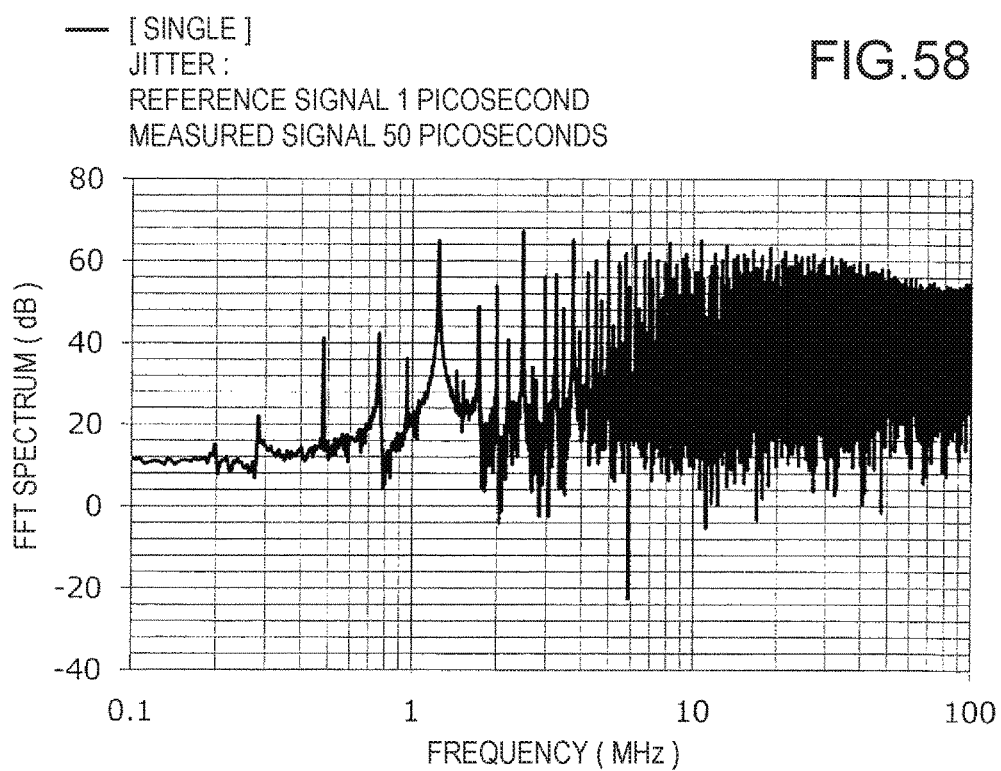
FIG. 58 is a graph showing an output spectrum of the idle tone dispersion device.
Figure 59:
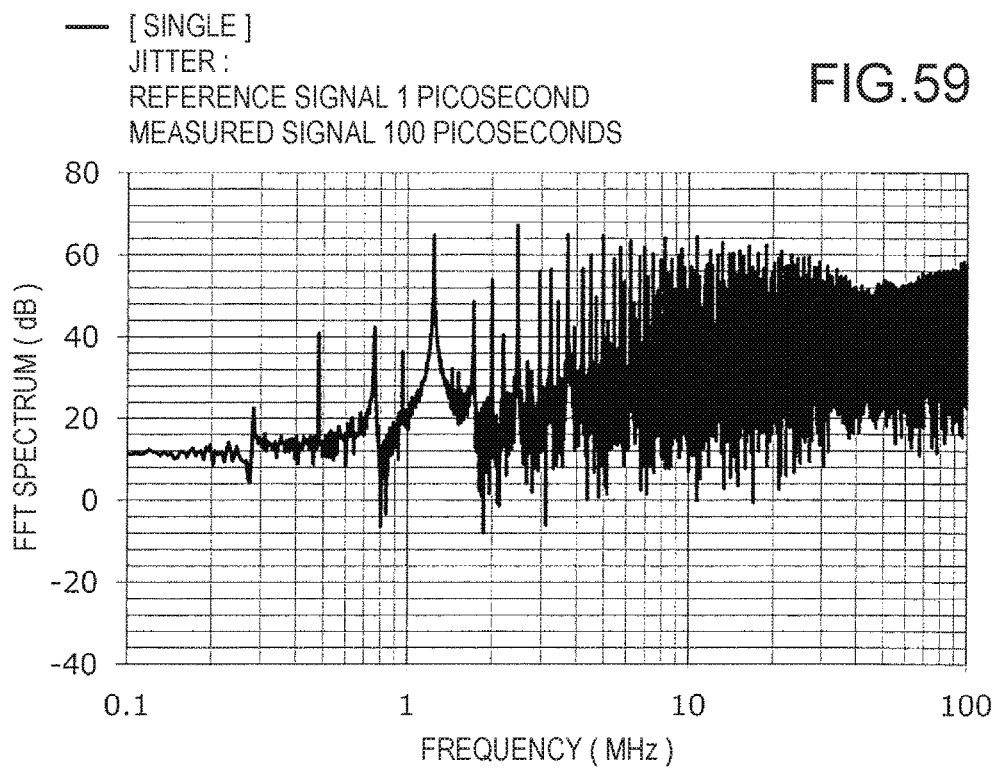
FIG. 59 is a graph showing an output spectrum of the idle tone dispersion device.
Figure 60:
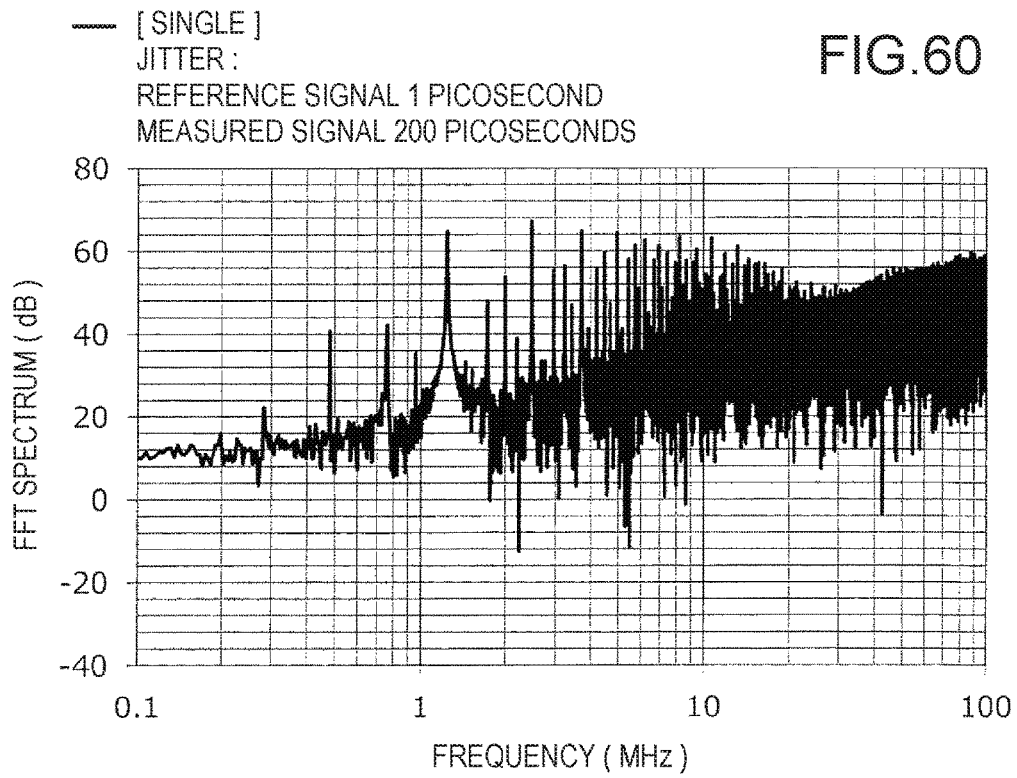
FIG. 60 is a graph showing an output spectrum of the idle tone dispersion device.
Figure 61:
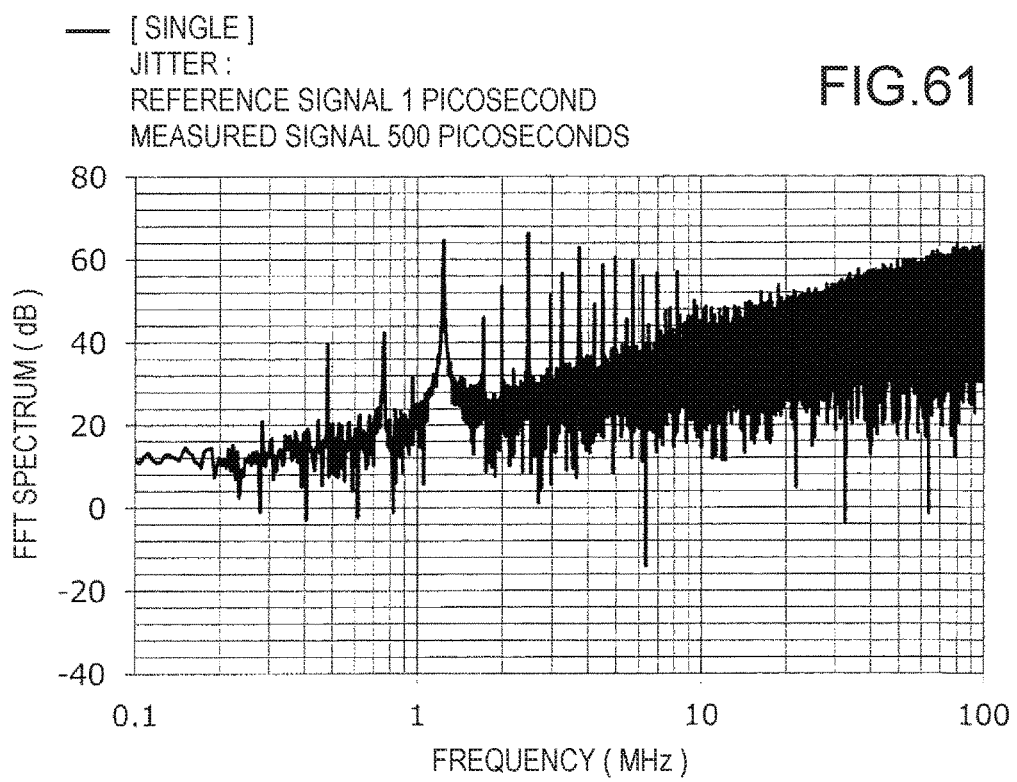
FIG. 61 is a graph showing an output spectrum of the idle tone dispersion device.
Figure 62:
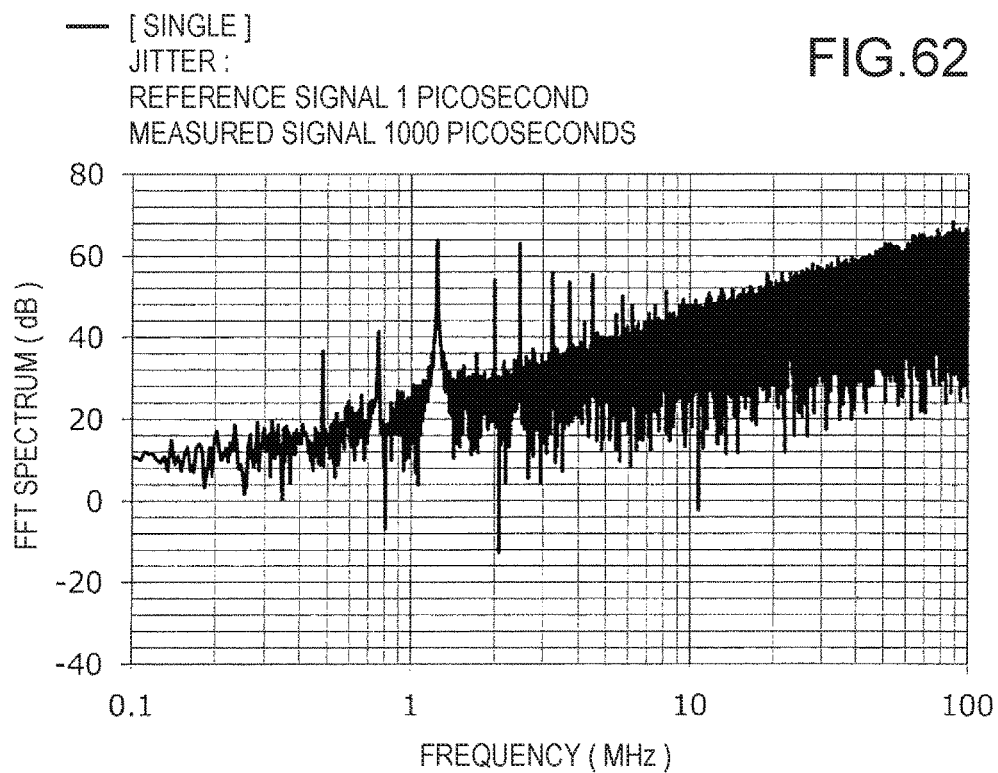
FIG. 62 is a graph showing an output spectrum of the idle tone dispersion device.

As another example, in the device "d", a simulation was performed concerning a case in which jitter was not included in the reference signal and the measured signal (the magnitude of jitter was 0 picosecond). A graph of an output spectrum of the idle tone dispersion device was created. A result of this example of the experiment is shown in FIG. 55.

As another comparative example, the magnitude of the jitter given to the reference signal was fixed to "1 picosecond" and the magnitude of the jitter given to the measured signal was set to "20 picoseconds, "50 picoseconds", "100 picoseconds", "200 picoseconds", "500 picoseconds", "1000 picoseconds", "2000 picoseconds", and "3600 picoseconds". Graphs of an output spectrum of the idle tone dispersion device were created. A result of this example of the experiment is shown in FIGS. 57 to 64.

Figure 63:
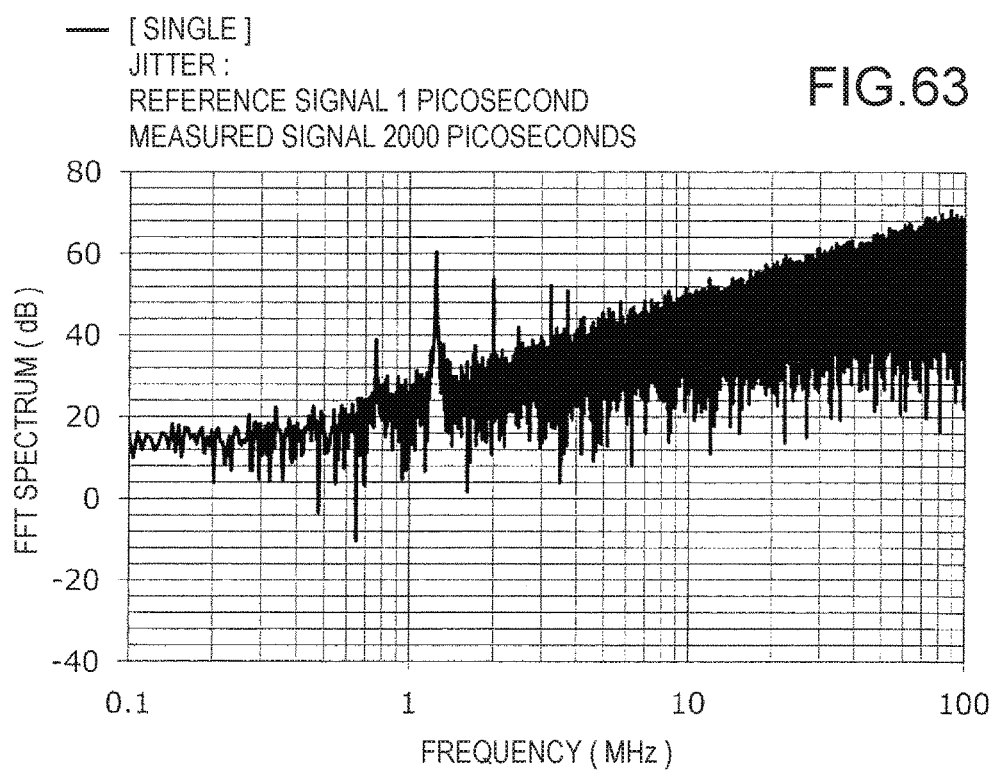
FIG. 63 is a graph showing an output spectrum of the idle tone dispersion device.

In this experiment, as shown in FIG. 63, even when the magnitude of the jitter was set to "2000 picoseconds", a peak (intensity) indicating an idle tone having a frequency less than 2 MHz exceeded a peak (intensity) of 2 MHz, which is a detection target frequency.

Figure 64:
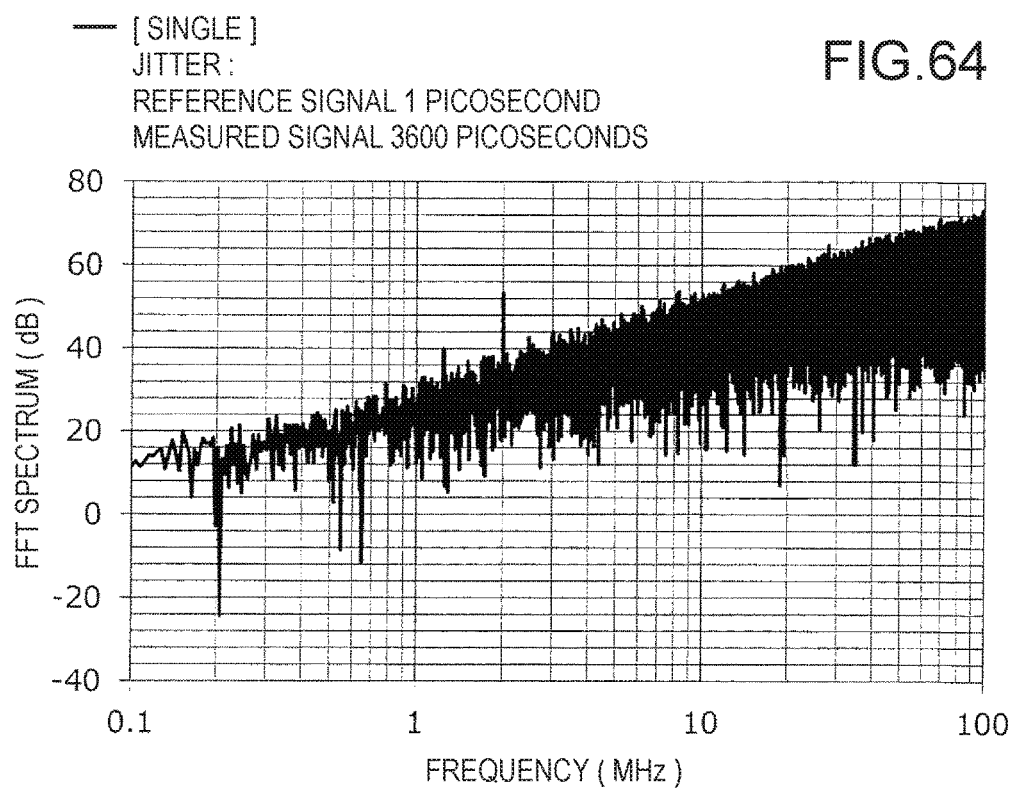
FIG. 64 is a graph showing an output spectrum of the idle tone dispersion device.

Then, as shown in FIG. 64, when the magnitude of the jitter was increased to "3600 picoseconds", the peak of 2 MHz exceeded the peak indicating the idle tone of the frequency less than 2 MHz.

The graphs shown in FIGS. 56 to 64 of the experiment 6 and the graphs shown in FIGS. 46 and 54 of the experiment 5 corresponding to each other are compared. In the comparative example of the experiment 6 and the example of the experiment 5, an idle tone reduction effect corresponding to the magnitude of the jitter is substantially the same. However, in the example of the experiment 5, an effect of a decrease in the intensity of the base portion is obtained. The effect is more conspicuous as the magnitude of the jitter increases.

Experiment 7

The device "e" was used, common jitter was given to the reference signal, and common jitter was given to the measured signal.

The magnitude of the jitter given to the reference signal was set to "1 picosecond" and the magnitude of the jitter given to the measured signal was set to "10 picoseconds" (an example).

As in the example of the experiment 1, the jitter given to the reference signal and the jitter given to the measured signal respectively include frequency components that have a maximum of 130 MHz and are equal to or less than 130 MHz. That is, the jitter given to the reference signal and the jitter given to the measured signal include frequency components higher than the frequency of the idle tone.

Figure 65:
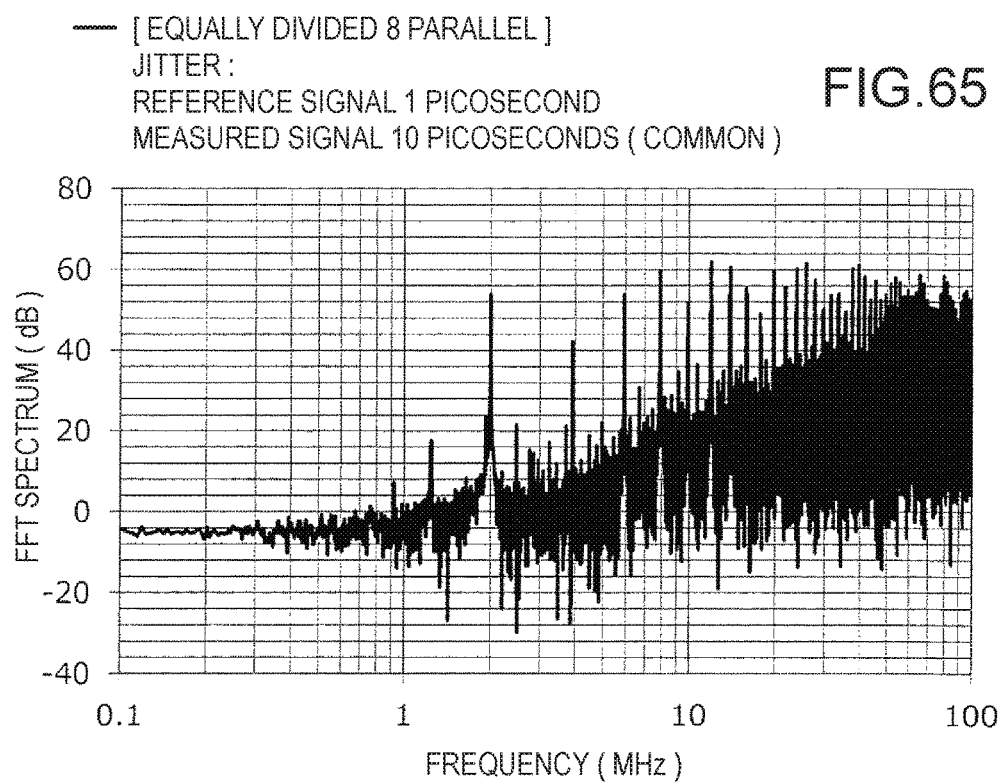
FIG. 65 is a graph showing an output spectrum of the idle tone dispersion device.
Figure 66:
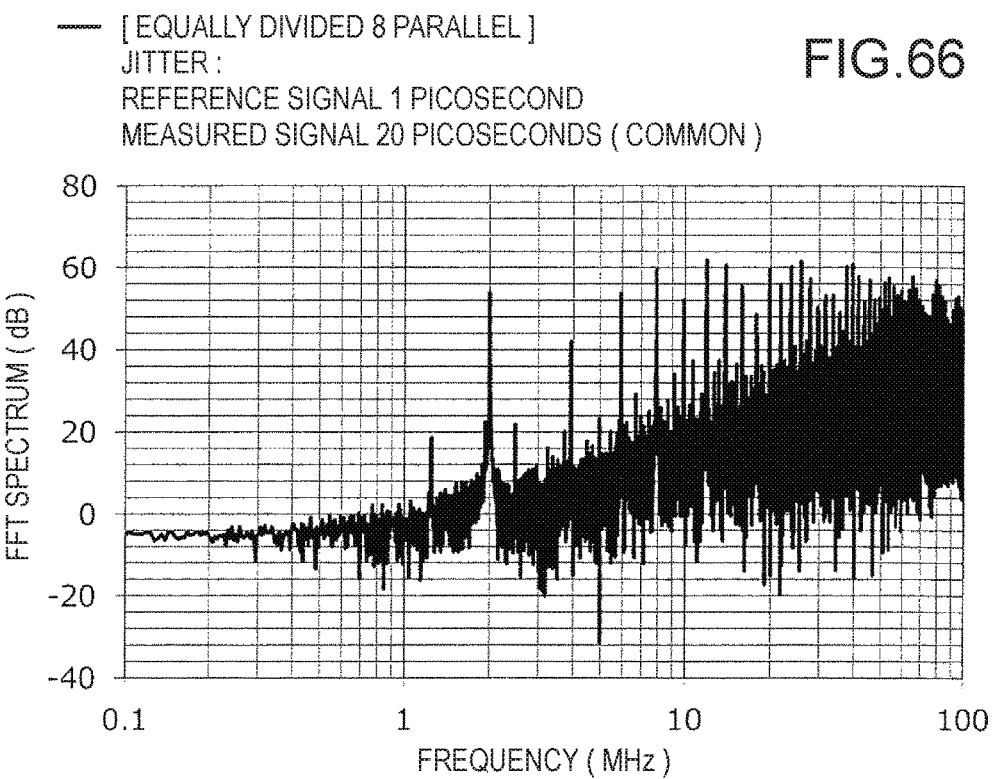
FIG. 66 is a graph showing an output spectrum of the idle tone dispersion device.
Figure 67:
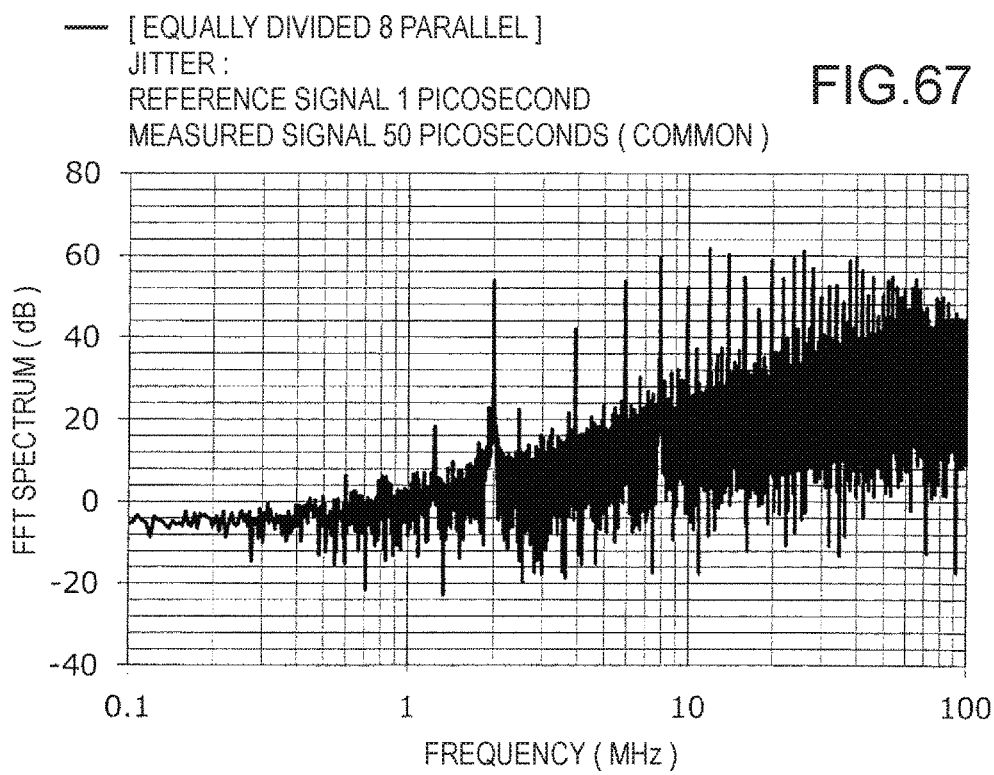
FIG. 67 is a graph showing an output spectrum of the idle tone dispersion device.
Figure 70:
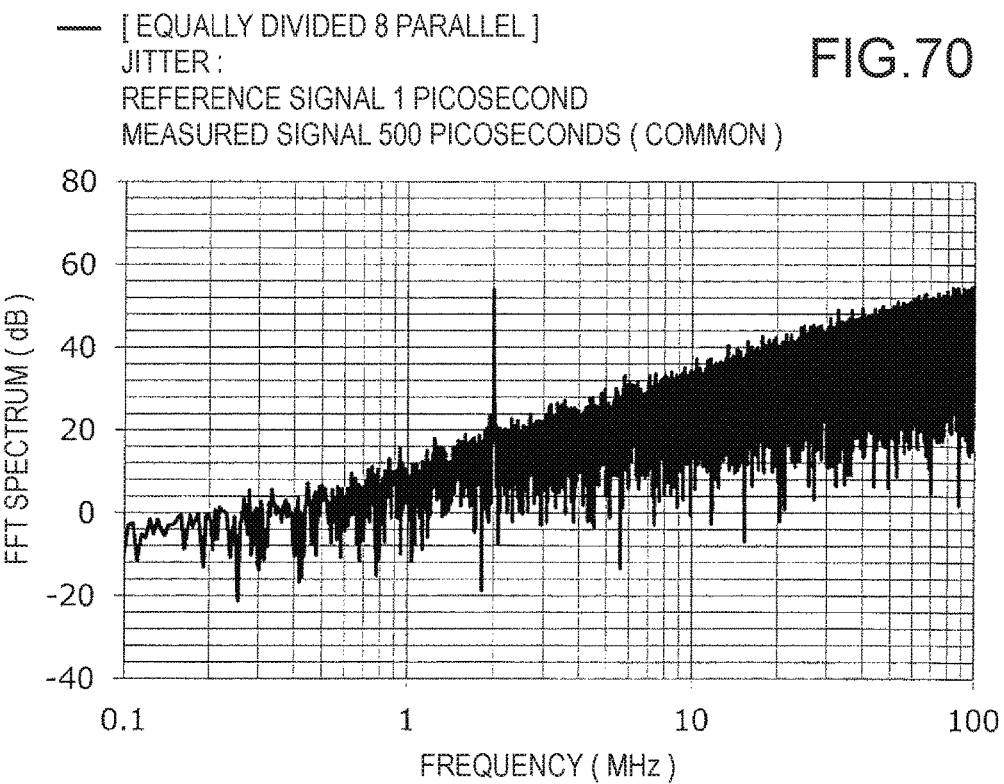
FIG. 70 is a graph showing an output spectrum of the idle tone dispersion device.
Figure 71:
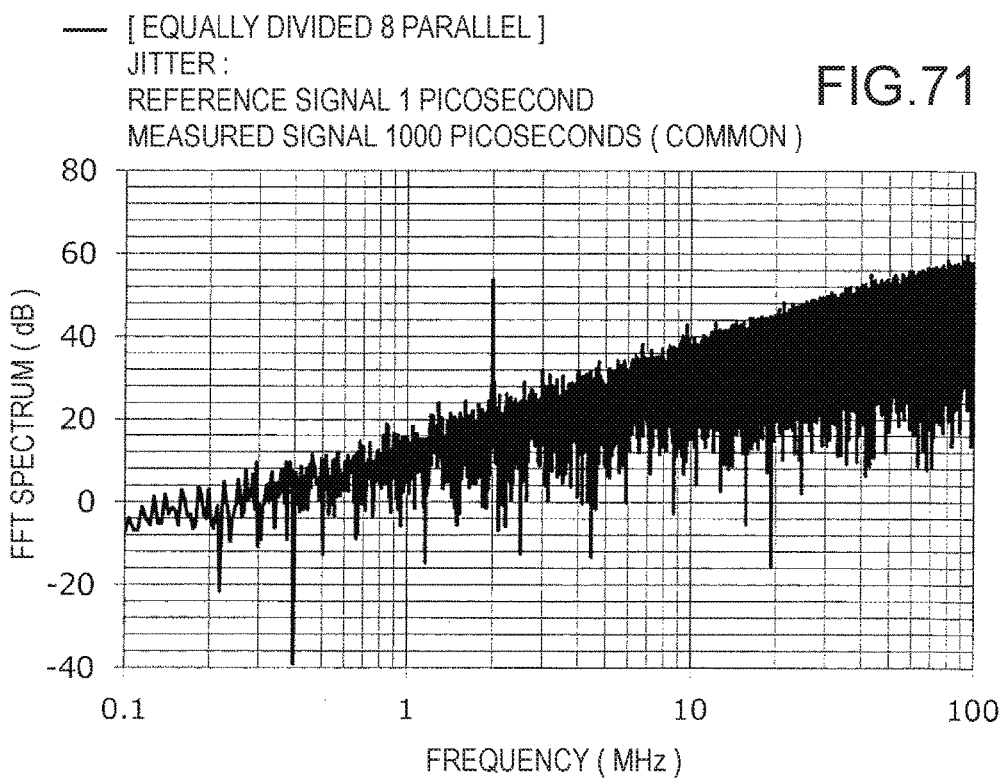
FIG. 71 is a graph showing an output spectrum of the idle tone dispersion device.
Figure 74:
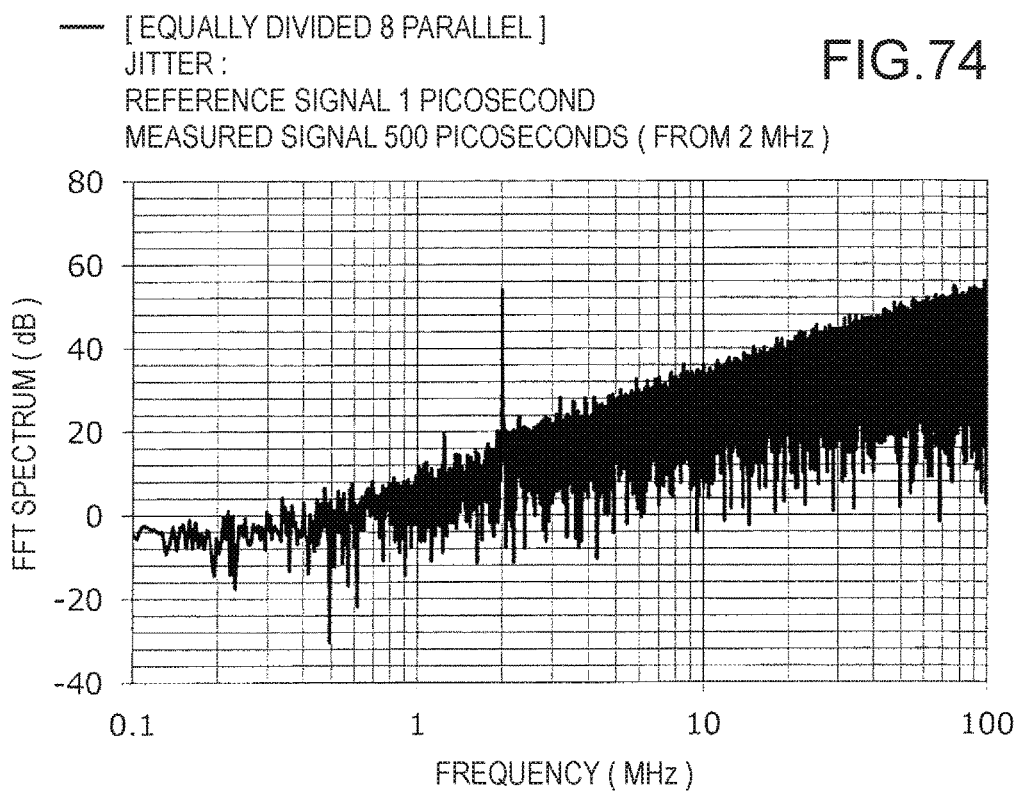
FIG. 74 is a graph showing an output spectrum of the idle tone dispersion device.
Figure 75:
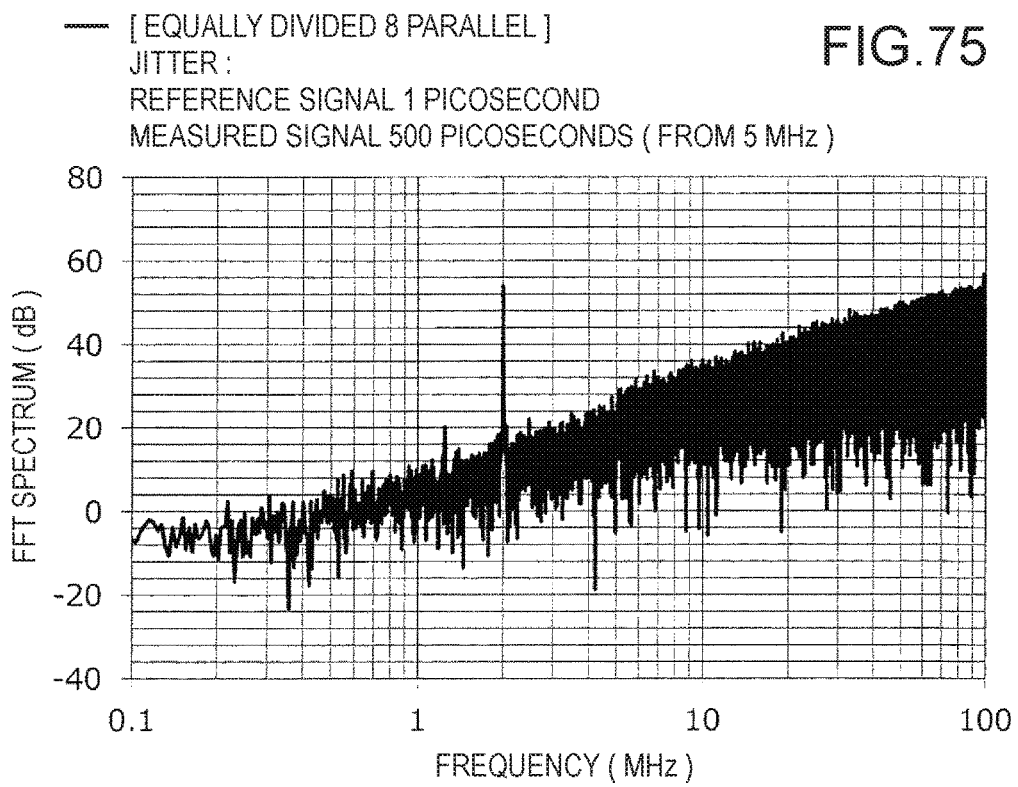
FIG. 75 is a graph showing an output spectrum of the idle tone dispersion device.
Figure 76:
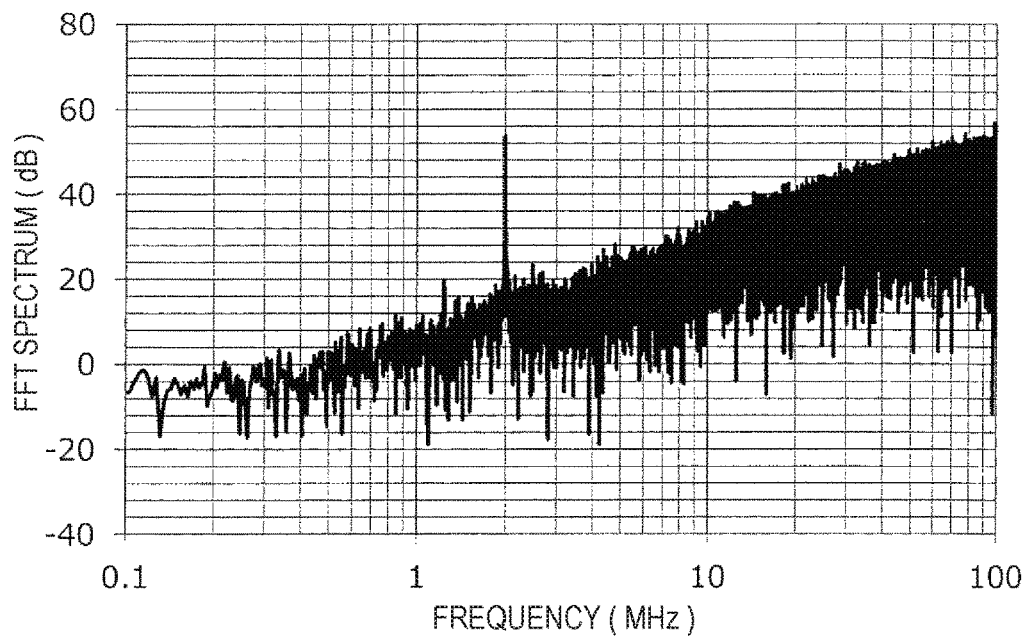
FIG. 76 is a graph showing an output spectrum of the idle tone dispersion device.
Figure 77:
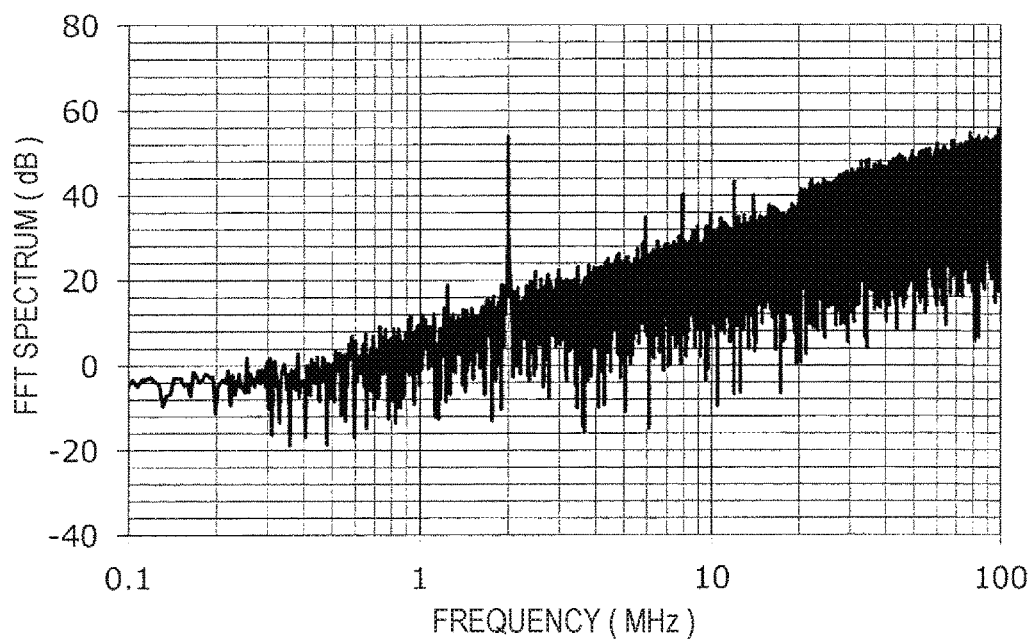
FIG. 77 is a graph showing an output spectrum of the idle tone dispersion device.

Concerning a frequency delta-sigma modulation signal output from the idle tone dispersion device, the intensity of frequency components included in the frequency delta-sigma modulation signal was calculated and a graph of an output spectrum of the idle tone dispersion device was created. A result of this example of the experiment is shown in FIG. 65.

As another example, the magnitude of the jitter given to the reference signal was fixed to "1 picosecond" and the magnitude of the jitter given to the measured signal was set to "20 picoseconds, "50 picoseconds", "100 picoseconds", "200 picoseconds", "500 picoseconds", "1000 picoseconds", and "2000 picoseconds". Graphs of an output spectrum of the idle tone dispersion device were created. A result of this example of the experiment is shown in FIGS. 66 to 72.

From the result of this experiment, it is seen that, even when the common jitter is given to the reference signal and the common jitter is given to the measured signal, the influence of the idle tone is reduced compared with when the reference signal and the measured signal do not include jitter.

Note that the reference signal did not include jitter (the magnitude of jitter was 0 picosecond), the magnitude of jitter given to the measured signal was set to "10 picoseconds", "20 picoseconds", "50 picoseconds", "100 picoseconds", "200 picoseconds", "500 picoseconds", "1000 picoseconds", and "2000 picoseconds" (an example), a simulation was performed, and a graph of an output spectrum of the idle tone dispersion device was created. Then, substantially the same result as the result obtained when the magnitude of the jitter of the measured signal was 1 picosecond was obtained. Consequently, it is seen that the idle tone is also reduced when only the measured signal includes jitter.

The graphs shown in FIGS. 65 to 72 of the experiment 7 and the graphs shown in FIGS. 28 to 35 of the experiment 3 corresponding to each other are compared. It is seen that the intensity of the base portion is higher in the example of the experiment 7 than in the example of the experiment 3. This corresponds to the fact that, whereas, when the jitter given to the measured signal is independent, dispersion representing a distribution of added-up jitter approaches a sum of dispersion of the jitter given to the reference signal and dispersion of the jitter given to the measured signal, when the jitter given to the measured signal is common, the dispersion representing the distribution of the added-up jitter is larger than the sum of the dispersion of the jitter given to the reference signal and the dispersion of the jitter given to the measured signal.

Experiment 8

The device "a" was used, common jitter was given to the reference signal, and jitter was given to the measured signal independently for each of the FDSMs 20.

The magnitude of the jitter given to the reference signal was set to "1 picosecond" and the magnitude of the jitter given to the measured signal was set to "500 picoseconds" (an example).

As in the example of the experiment 1, the jitter given to the reference signal and the jitter given to the measured signal respectively include frequency components that have a maximum of 130 MHz and are equal to or less than 130 MHz. That is, the jitter given to the reference signal and the jitter given to the measured signal include frequency components higher than the frequency of an idle tone. In order to remove frequency components of 1 MHz or less included in the jitter, a selection pattern obtained by removing fluctuation components of 1 MHz or less was used in the selector 53.

Concerning a frequency delta-sigma modulation signal output from the idle tone dispersion device, the intensity of frequency components included in the frequency delta-sigma modulation signal was calculated. A graph of an output spectrum of the idle tone dispersion device was created. A result of this example of the experiment is shown in FIG. 73.

As another example, the given jitter was set as jitter from which low-frequency components of 2 MHz or less were removed, jitter from which low-frequency components of 5 MHz or less were removed, jitter from which low-frequency components of 10 MHz or less were removed, jitter from which low-frequency components of 20 MHz or less were removed, jitter from which low-frequency components of 50 MHz or less were removed, and jitter from which low-frequency components of 100 MHz or less were removed. Graphs of an output spectrum of the idle tone dispersion device were created. A result of this example of the experiment is shown in FIGS. 74 to 79. Note that, in explanation of the graphs, "from 1 MHz", "from 2 MHz", "from 5 MHz", "from 10 MHz", "from 20 MHz", "from 50 MHz", and "from 100 MHz" are respectively described.

Figure 33:
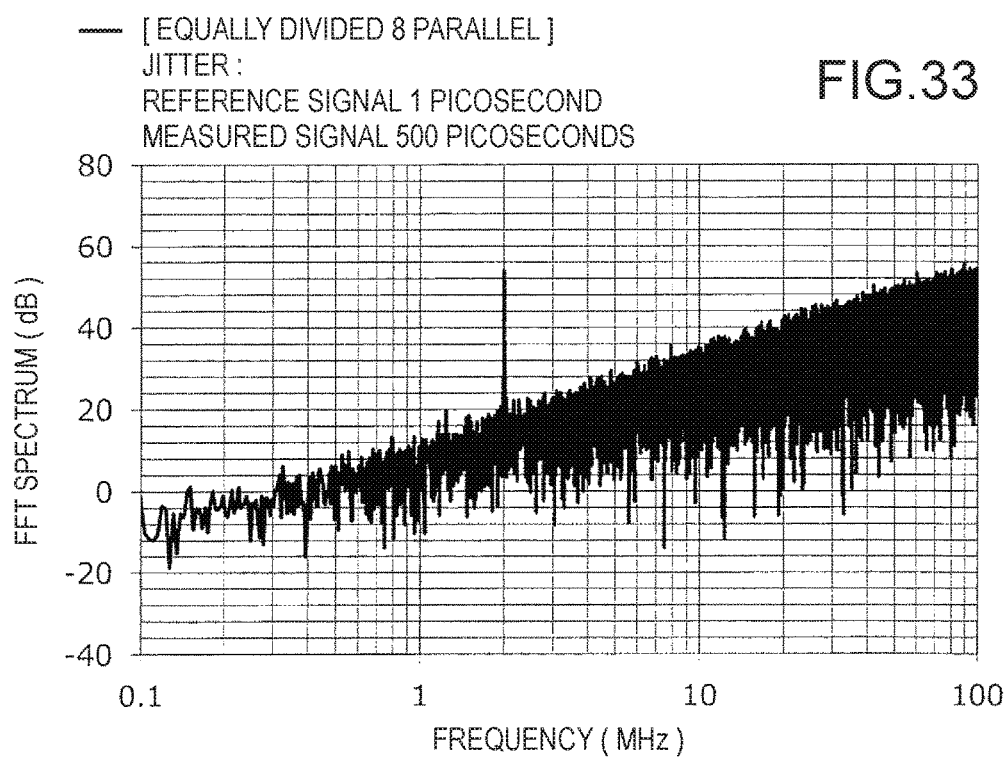
FIG. 33 is a graph showing an output spectrum of the idle tone dispersion device.
Figure 34:
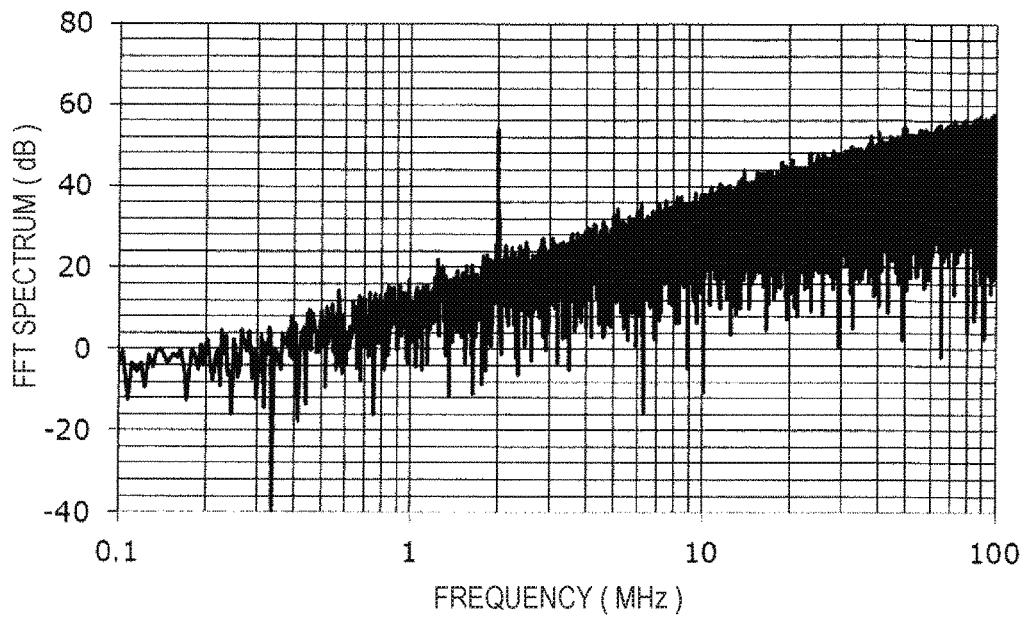
FIG. 34 is a graph showing an output spectrum of the idle tone dispersion device.
Figure 35:
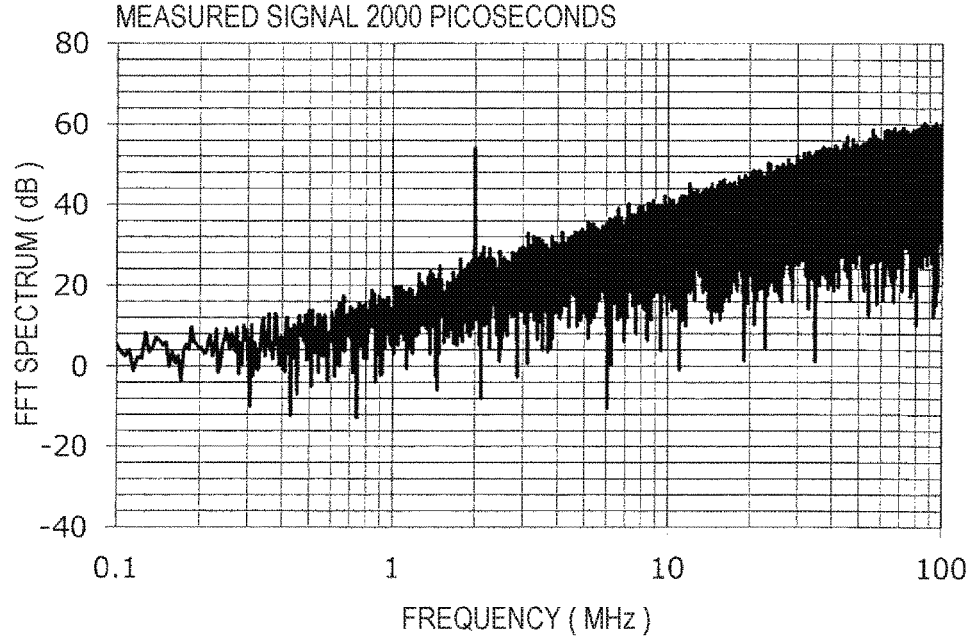
FIG. 35 is a graph showing an output spectrum of the idle tone dispersion device.

The graphs shown in FIGS. 73 to 79 of the experiment 8 and the graph shown in FIG. 33 of the experiment 3 are compared. It is seen that high-frequency components of the jitter have a function of reducing the influence of the idle tone.

It is seen that, by removing the low-frequency components included in the jitter, the intensity of the base portion decreases in a removed frequency band. Frequency ratio measuring device according to an embodiment FIG. 80 is a block diagram showing a frequency ratio measuring device according to an embodiment of the invention.

In the following explanation, concerning the frequency ratio measuring device according to the embodiment, differences from the embodiments explained above are mainly explained. Explanation of similarities to the embodiments is omitted.

Figure 80:
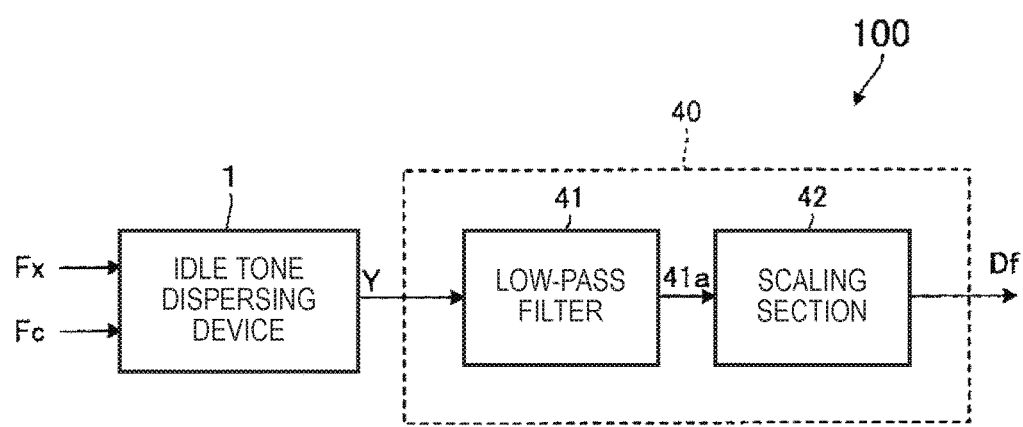
FIG. 80 is a block diagram showing a frequency ratio measuring device according to an embodiment of the invention.

As shown in FIG. 80, a frequency ratio measuring device 100 includes the idle tone dispersion device 1 and measures a frequency ratio of the measured signal Fx and the reference signal Fc. With such a frequency ratio measuring device 100, it is possible to reduce the influence of quantization noise due to an idle tone. Consequently, it is possible to improve measurement accuracy. The frequency ratio measuring device 100 is specifically explained below. Note that, in this embodiment, as the frequency ratio measuring device 100, a device that measures a frequency ratio of the measured signal Fx and the reference signal Fc and thereafter generates frequency data Df indicating the frequency of the measured signal Fx is explained.

The frequency ratio measuring device 100 includes the idle tone dispersion device 1 and a frequency-data generating section 40 that generates the frequency data Df indicating the frequency of the measured signal Fx on the basis of the frequency delta-sigma modulation signal Y output from the idle tone dispersion device 1. The frequency-data generating section 40 is connected to an output side (a post stage) of the idle tone dispersion device 1. The frequency-data generating section 40 includes a low-pass filter 41 and a scaling section 42 connected to an output side of the low-pass filter 41.

When the frequency delta-sigma modulation signal Y is an output from the idle tone dispersion device 1 of the data stream configuration, as the frequency delta-sigma modulation signal Y, a ratio (fx/fc) of the frequency fx of the measured signal Fx and the frequency fc of the reference signal Fc is output as a digital signal row according to the elapse of time in a form including a quantization error.

When the frequency delta-sigma modulation signal Y is an output from the idle tone dispersion device 1 of the bit stream configuration and 2fx<fc, as the frequency delta-sigma modulation signal Y, a ratio (2fx/fc) of a double frequency 2fx of the measured signal Fx and the frequency fc of the reference signal Fc is output as a digital signal row according to the elapse of time in a form including a quantization error.

Time resolution and frequency resolution in frequency measurement (frequency ratio measurement) are decided by characteristics of the low-pass filter 41. The low-pass filter 41 is not particularly limited. For example, a moving average filter in a plurality of stages in which a plurality of moving average filters that perform simple averaging of a most recent plurality samples are disposed or a normal low-pass filter realized by an FIR filter, an IIR filter, or the like can be used.

The scaling section 42 multiplies output data 41a of the low-pass filter 41 by a correction coefficient to generate the frequency data Df. For example, when the idle tone dispersion device 1 of the bit stream configuration is provided on an input side (a pre-stage) of the frequency-data generating section 40 and, for example, the frequency fx of the measured signal Fx is 0.1 MHz and the frequency fc of the reference signal Fc is 2 MHz, 2fx/fc=0.1. The frequency delta-sigma modulation signal Y is proportional to the frequency fx of the measured signal Fx. Therefore, the correction coefficient only has to be set as 1M.

Note that, in the frequency ratio measuring device 100, for example, the scaling section 42 may be omitted. The frequency ratio measuring device 100 may be configured to generate frequency ratio data indicating a frequency ratio of the measured signal Fx and the reference signal Fc. The low-pass filter 41 may be omitted.

The idle tone dispersion device and the frequency ratio measuring device according to the embodiments of the invention are explained above. However, the invention is not limited to the embodiments. The components of the sections can be replaced with any components having the same functions. Any other components may be added. The invention may be a combination of any two or more configurations (characteristics) in the embodiments.

Places where the jitter adders (the jitter generating sections) are set are not limited to the places in the embodiments. For example, when jitter is given to the reference signals (the output reference signals), a jitter adder independently provided for each of the output reference signals and a jitter adder common to a plurality of output reference signals may be mixed. When jitter is given to the measured signals (the output measured signals), a jitter adder independently provided for each of the output measured signals and a jitter adder common to a plurality of output measured signals may be mixed.

The entire disclosure of Japanese Patent Application No. 2017-105463, filed May 29, 2017 is expressly incorporated by reference herein.

What is claimed is:

1. An idle tone dispersion device that outputs a frequency delta-sigma modulation signal obtained by using either one of a reference signal and a measured signal to perform frequency delta-sigma modulation of the other and dispersion an idle tone, the idle tone dispersion device comprising:

n (n is any natural number equal to or larger than 2) frequency delta-sigma modulation sections; and an adder configured to add up output signals of the n frequency delta-sigma modulation sections and output the frequency delta-sigma modulation signal, wherein each of the n frequency delta-sigma modulation sections uses either one of the reference signal and the measured signal to perform the frequency delta-sigma modulation of the other, and at least one of the reference signal and the measured signal includes jitter including a frequency component higher than a frequency of an idle tone of an output signal of the frequency delta-sigma modulation section.

2. An idle tone dispersion device that outputs a frequency delta-sigma modulation signal obtained by using either one of a reference signal and a measured signal to perform frequency delta-sigma modulation of the other and dispersion an idle tone, the idle tone dispersion device comprising:

n (n is any natural number equal to or larger than 2) frequency delta-sigma modulation sections;

a phase adjusting section configured to adjust phases of the measured signal and the reference signal, generate n sets of output measured signals and output reference signals, and supply the output measured signal and the output reference signal of each of the sets to each of the n frequency delta-sigma modulation sections; and an adder configured to add up output signals of the n frequency delta-sigma modulation sections and output the frequency delta-sigma modulation signal, wherein the phase adjusting section adjusts the phases of the measured signals and the reference signals to differentiate phases of idle tones of output signals of at least a part of the n frequency delta-sigma modulation sections from one another and generates the n sets of the output measured signals and the output reference signals, and each of the n frequency delta-sigma modulation sections uses either one of the output reference signal and the output measured signal supplied from the phase modulating section to perform the frequency delta-sigma modulation of the other, and at least one of the output reference signal and the output measured signal includes jitter including a frequency component higher than a frequency of the idle tone.

3. The idle tone dispersion device according to claim 2, wherein, when a predetermined time is represented as D, one cycle of the measured signal or one cycle of the reference signal is represented as T, m is any natural number equal to or smaller than n, mD/nT is an integer, mD/nT and m are relatively prime, and a phase difference between an output measured signal and an output reference signal supplied to an i (i is any natural number equal to or smaller than n−1)-th frequency delta-sigma modulation section is represented as Pi, the phase adjusting section adjusts the phases of the measured signal and the reference signal to satisfy $D/n = P_{i+1} - P_i$ and generates the n sets of the output measured signals and the output reference signals.

4. The idle tone dispersion device according to claim 2, wherein the phase adjusting section adjusts the phases of the measured signal and the reference signal to differentiate phases of idle tones of output signals of a part of the n frequency delta-sigma modulation sections from one another and generates the n sets of the output measured signals and the output reference signals.

5. The idle tone dispersion device according to claim 2, wherein, when a predetermined time is represented as D, one cycle of the measured signal or one cycle of the reference signal is represented as T, m is any natural number equal to or smaller than n, mD/nT is an integer, mD/nT and m are relatively prime, and a phase difference between an output measured signal and an output reference signal supplied to an i (i is any natural number equal to or smaller than n−1)-th frequency delta-sigma modulation section is represented as Pi, $D/n \neq P_{i+1} - P_i$ is satisfied.

6. The idle tone dispersion device according to claim 1, wherein the jitter includes a frequency component higher than a frequency of a component having largest intensity among frequency components of the idle tone.

7. The idle tone dispersion device according to claim 2, wherein the jitter includes a frequency component higher than a frequency of a component having largest intensity among frequency components of the idle tone.

8. The idle tone dispersion device according to claim 1, further comprising a jitter generating section configured to generate the jitter.

9. The idle tone dispersion device according to claim 2, further comprising a jitter generating section configured to generate the jitter.

10. The idle tone dispersion device according to claim 1, wherein magnitude of the jitter is determined on the basis of at least one of a frequency of the reference signal, a frequency of the measured signal, a measurement band of the measured signal, and a number of the frequency delta-sigma modulation sections.

11. The idle tone dispersion device according to claim 2, wherein magnitude of the jitter is determined on the basis of at least one of a frequency of the reference signal, a frequency of the measured signal, a measurement band of the measured signal, and a number of the frequency delta-sigma modulation sections.

12. A frequency ratio measuring device comprising the idle tone dispersion device according to claim 1, wherein the frequency ratio measuring device measures a frequency ratio of the measured signal and the reference signal.

13. A frequency ratio measuring device comprising the idle tone dispersion device according to claim 2, wherein the frequency ratio measuring device measures a frequency ratio of the measured signal and the reference signal.

14. A frequency ratio measuring device comprising the idle tone dispersion device according to claim 3, wherein the frequency ratio measuring device measures a frequency ratio of the measured signal and the reference signal.

15. A frequency ratio measuring device comprising the idle tone dispersion device according to claim 4, wherein the frequency ratio measuring device measures a frequency ratio of the measured signal and the reference signal.

16. A frequency ratio measuring device comprising the idle tone dispersion device according to claim 5, wherein the frequency ratio measuring device measures a frequency ratio of the measured signal and the reference signal.

17. A frequency ratio measuring device comprising the idle tone dispersion device according to claim 6, wherein the frequency ratio measuring device measures a frequency ratio of the measured signal and the reference signal.

18. A frequency ratio measuring device comprising the idle tone dispersion device according to claim 7, wherein the frequency ratio measuring device measures a frequency ratio of the measured signal and the reference signal.

19. A frequency ratio measuring device comprising the idle tone dispersion device according to claim 8, wherein the frequency ratio measuring device measures a frequency ratio of the measured signal and the reference signal.

20. A frequency ratio measuring device comprising the idle tone dispersion device according to claim 10, wherein the frequency ratio measuring device measures a frequency ratio of the measured signal and the reference signal.

* * * * *